United States Patent
Krah et al.

(10) Patent No.: US 12,197,665 B2
(45) Date of Patent: Jan. 14, 2025

(54) TOUCH AND LIGHT SENSING USING INTEGRATED MICRO CIRCUITRY

(71) Applicant: Apple Inc., Cupertino, CA (US)

(72) Inventors: Christoph H. Krah, Cupertino, CA (US); Bin Huang, San Jose, CA (US); Stanley B. Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/933,820

(22) Filed: Sep. 20, 2022

(65) Prior Publication Data

US 2023/0094533 A1 Mar. 30, 2023

Related U.S. Application Data

(60) Provisional application No. 63/261,662, filed on Sep. 24, 2021.

(51) Int. Cl.

| G06F 3/041 | (2006.01) |
|---|---|
| G06F 3/042 | (2006.01) |
| G06F 3/044 | (2006.01) |
| G09G 3/32 | (2016.01) |
| H01L 27/15 | (2006.01) |

(52) U.S. Cl.
CPC ............ *G06F 3/0412* (2013.01); *G06F 3/042* (2013.01); *G06F 3/044* (2013.01); *G09G 3/32* (2013.01); *H01L 27/156* (2013.01); *G06F 2203/04106* (2013.01); *G06F 2203/04108* (2013.01)

(58) Field of Classification Search
CPC ...... G06F 3/042; G06F 3/0416; G06F 3/0412; G06F 3/044; G06F 2203/04108; G06F 2203/04107; G06F 2203/04106; G09G 3/32; H01L 27/156; H01L 33/62; H01L 25/0753

See application file for complete search history.

(56) References Cited

U.S. PATENT DOCUMENTS

| 8,745,490 | B2 | 6/2014 | Kim |
|---|---|---|---|
| 9,710,630 | B2 | 7/2017 | Kim et al. |
| 9,741,290 | B1 | 8/2017 | Lee et al. |
| 9,891,746 | B2 | 2/2018 | Bae et al. |
| 10,380,944 | B2 | 8/2019 | Soni et al. |

(Continued)

FOREIGN PATENT DOCUMENTS

KR 10-2011-0121621 A 11/2011

*Primary Examiner* — Yaron Cohen
(74) *Attorney, Agent, or Firm* — Kubota & Basol LLP

(57) ABSTRACT

An electronic device can include integrated micro circuitry configurable for optical sensing and touch and/or proximity sensing. An integrated touch screen can include light emitting diodes or organic light emitting diodes and chiplets. In some examples, the LEDs/OLEDs and chiplets can be disposed in a visible area of the integrated touch screen. In some examples, some or all of the chiplets can be disposed outside of the visible area of the integrated touch screen. In some examples, the chiplets can include display driving circuitry and touch sensing circuitry, and can optionally perform optical sensing using the touch sensing circuitry. In some examples, the chiplets can include separate touch chiplets configured to perform touch sensing (and/or optical sensing) and display chiplets configured to perform display functionality (and optionally provide some switching functionality).

14 Claims, 29 Drawing Sheets

(56) References Cited

U.S. PATENT DOCUMENTS

| | | |
|---|---|---|
| 10,585,514 B2 | 3/2020 | Ma |
| 10,754,938 B2 | 8/2020 | Jin et al. |
| 2018/0039817 A1 | 2/2018 | Romera Jolliff et al. |
| 2018/0189468 A1 | 7/2018 | Shim et al. |
| 2020/0033979 A1* | 1/2020 | Sauer ................ G09G 3/32 |
| 2020/0089857 A1 | 3/2020 | Xu |
| 2020/0111851 A1 | 4/2020 | Park et al. |

* cited by examiner

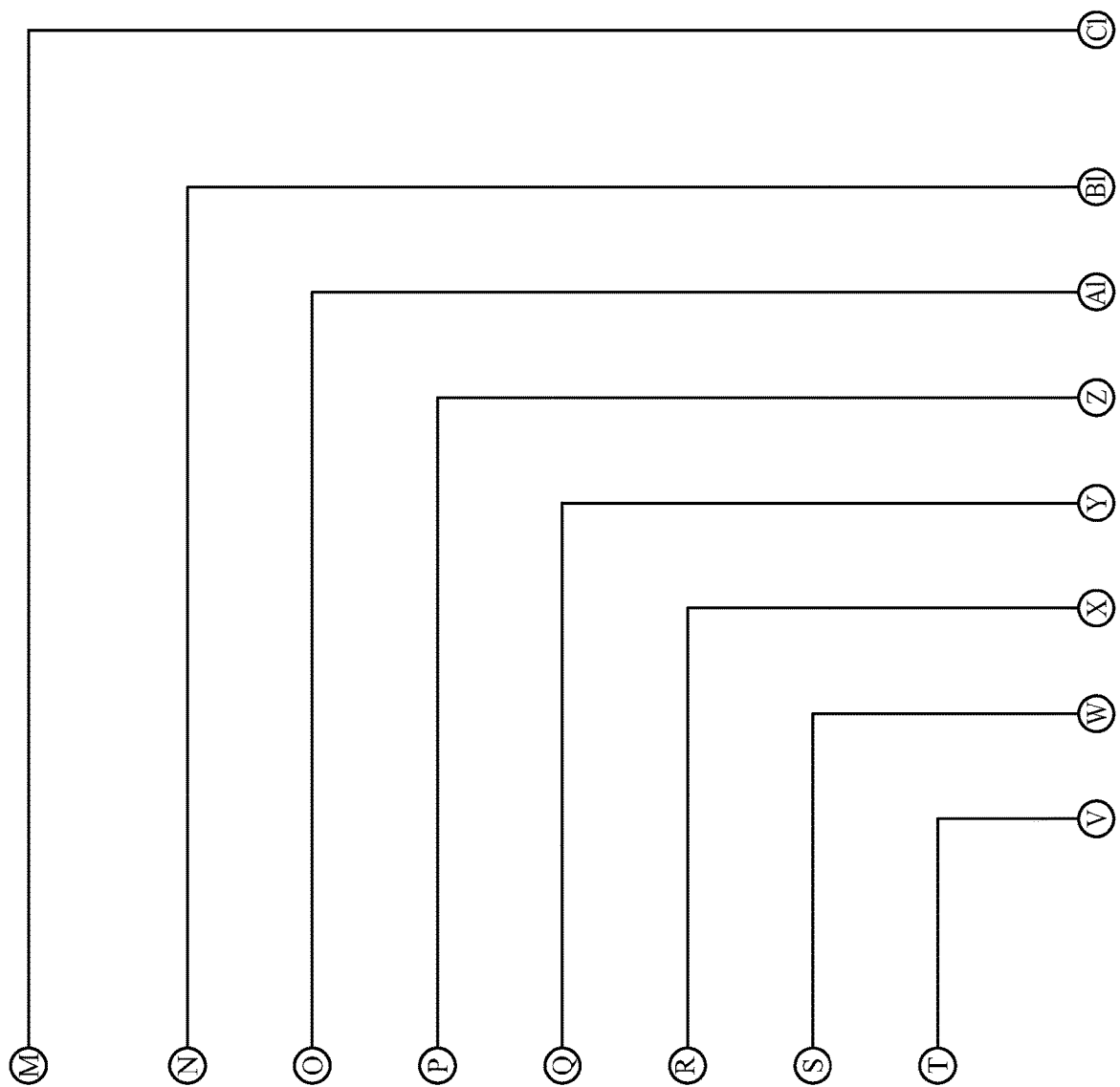

|  | ANODE SWITCHES ||||  CATHODE SWITCHES ||
|---|---|---|---|---|---|---|
|  | A | B | C | D | A | B |
| DISPLAY | OPEN | OPEN | CLOSED | CLOSED | CLOSED FOR ACTIVE ITO BANK (REMAINDER OPEN) | OPEN |
| TOUCH | CLOSED | CLOSED | OPEN | OPEN | OPEN | CLOSED |
*FIG. 5G*
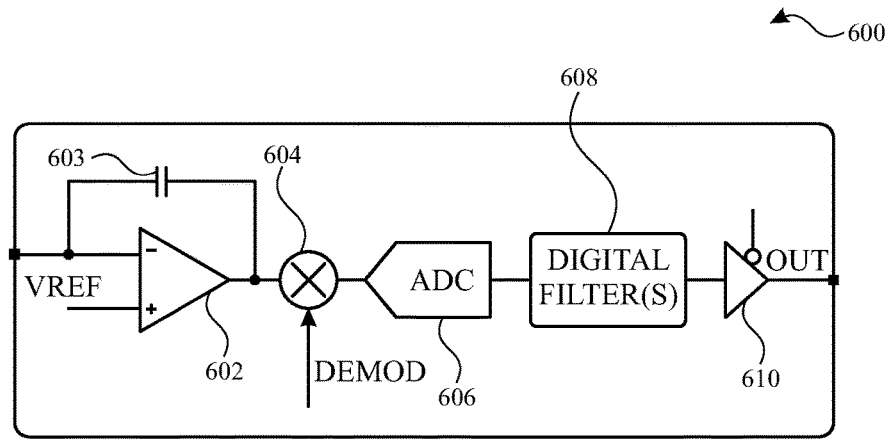
*FIG. 6A*
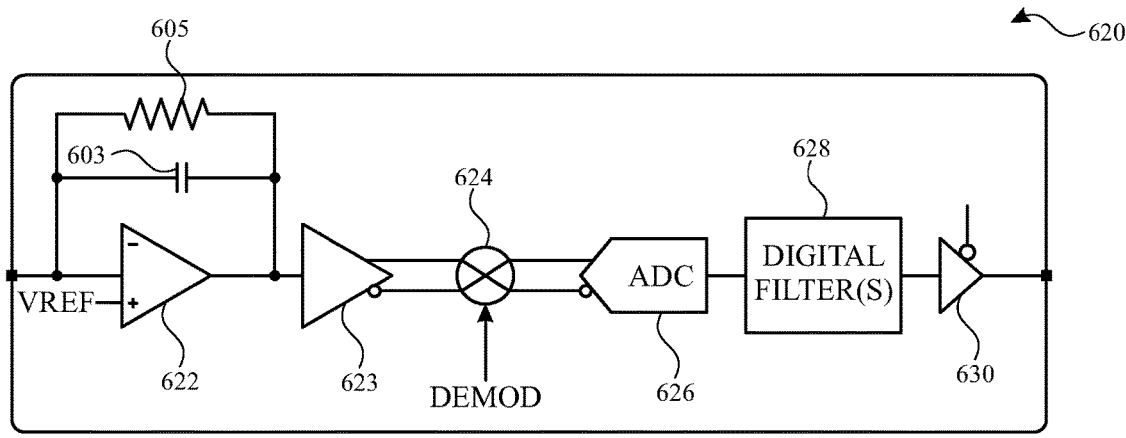
*FIG. 6B*

| MODE | LED ANODE CONNECTION | LED CATHODE CONNECTION | MODULATION | DEMODULATION |
|---|---|---|---|---|
| PHOTOVOLTAIC MODE | VBIAS | SENSE AMPLIFIER | UNMODULATED | NONE, BYPASS DEMODULATOR |
| PHOTOCONDUCTION MODE | GND | SENSE AMPLIFIER | UNMODULATED | NONE, BYPASS DEMODULATOR |
| PHOTOCONDUCTION MODE FOR OPTICAL TOUCH SENSING | GND | SENSE AMPLIFIER | MODULATED | AT MODULATION FREQUENCY |

FIG. 9B

TOUCH AND LIGHT SENSING USING INTEGRATED MICRO CIRCUITRY

CROSS-REFERENCE TO RELATED APPLICATIONS

This application claims the benefit of U.S. Provisional Application No. 63/261,662, filed Sep. 24, 2021, the content of which is incorporated herein by reference in its entirety for all purposes.

FIELD OF THE DISCLOSURE

This relates generally to an electronic device including touch and/or proximity sensing and including optical sensing, and more particularly to an electronic device including integrated micro circuitry configurable for optical sensing and touch and/or proximity sensing.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are popular because of their ease and versatility of operation as well as their declining price. Touch screens can include a touch sensor panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electric fields used to detect touch can extend beyond the surface of the display, and objects approaching near the surface may be detected near the surface without actually touching the surface.

Capacitive touch sensor panels can be formed by a matrix of transparent, semi-transparent or non-transparent conductive plates made of materials such as Indium Tin Oxide (ITO). In some examples, the conductive plates can be formed from other materials including conductive polymers, metal mesh, graphene, nanowires (e.g., silver nanowires) or nanotubes (e.g., carbon nanotubes). It is due in part to their substantial transparency that some capacitive touch sensor panels can be overlaid on a display to form a touch screen, as described above. Some touch screens can be formed by at least partially integrating touch sensing circuitry into a display pixel stackup (i.e., the stacked material layers forming the display pixels).

In some cases, parasitic or stray capacitances can exist between the touch node electrodes used for sensing touch on the touch sensor panels, and other components of the devices in which the touch sensor panels are included, which can be referenced to a chassis ground (also referred to herein as device ground or earth ground). These parasitic or stray capacitances can introduce errors and/or offsets into the touch outputs of the touch sensor panels. Therefore, it can be beneficial to reduce or eliminate such parasitic or stray capacitances.

SUMMARY OF THE DISCLOSURE

This relates generally to an electronic device including touch and/or proximity sensing and including optical sensing, and more particularly to an electronic device including integrated micro circuitry configurable for optical sensing and touch and/or proximity sensing. A touch screen, such as an integrated touch screen, can include light emitting diodes or organic light emitting diodes (LEDs/OLEDs) and chiplets. In some examples, the LEDs/OLEDs and chiplets can be disposed in a visible area of the integrated touch screen. In some examples, some or all of the chiplets can be disposed outside of the visible area of the integrated touch screen. In some examples, the chiplets can include display driving circuitry and touch sensing circuitry. In some examples, the chiplets can be further configured to perform optical sensing using some of the touch sensing circuitry. Although often described herein as chiplets performing both touch sensing, optical sensing and display functionality, in some examples, the chiplets can include separate touch chiplets configured to perform touch sensing (and/or optical sensing) and display chiplets configured to perform display functionality (and optionally provide some switching functionality for touch sensing functionality and/or optical sensing functionality). The LEDs/OLEDs and chiplets can be placed on a substrate by a micro-transfer tool, for example.

The integrated touch screen can also include electrodes (e.g., ITO) disposed in the visible area of the integrated touch screen. The electrodes can provide display functionality (e.g., via the one or more display chiplets) during display operation and can provide optical sensing and/or touch functionality (e.g., via the one or more touch chiplets) during touch and/or optical sensing operation. For example, the electrodes can operate as cathode terminals of the LEDs during the display operation and/or optical sensing operations. During the touch operation, touch node electrodes can be formed from groups of the electrodes and sensed.

Additionally or alternatively, an electronic device including chiplets and a touch screen (e.g., an integrated touch screen) can be configured for concurrent touch sensing and optical sensing using the chiplets. For example, the integrated touch screen can include multiple regions, and each of the multiple regions can include multiple touch node electrodes. The chiplets can be configured to simultaneously sense capacitance at some of or at each of the regions (e.g., using chiplets coupled to some of the touch node electrodes of each of the regions and configured to operate in a touch sensing configuration) and sense ambient light at some of or at each of the multiple regions (e.g., using chiplets coupled to some of the touch node electrodes of each of the regions and configured to operate in an optical sensing configuration). As a result, localized touch and ambient light information can be captured in parallel for the electronic device.

BRIEF DESCRIPTION OF THE DRAWINGS

FIG. 5G illustrates example switching configurations for chiplet during touch and display operations according to examples of the disclosure.

FIGS. 6A-6B illustrate example circuitry for example sensing channel of a chiplet according to examples of the disclosure.

FIG. 9B illustrates a table summarizing configurations for optical sensing according to examples of the disclosure.

DETAILED DESCRIPTION

Figure 1A:
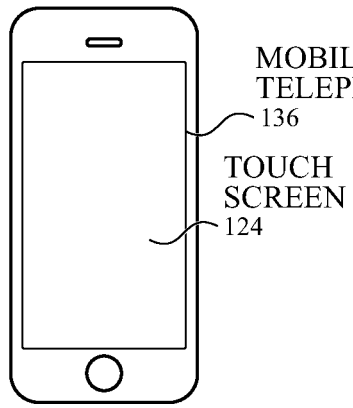
FIGS. 1A-1E illustrate example systems in which an integrated touch screen according to examples of the disclosure may be implemented.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates generally to an electronic device including touch and/or proximity sensing and including optical sensing, and more particularly to an electronic device including integrated micro circuitry configurable for optical sensing and touch and/or proximity sensing. As described herein, touch and/or proximity sensing primarily refers to capacitive touch and/or proximity sensing, and optical sensing refers to light sensing operations including ambient light sensing and optical touch and/or proximity detection. A touch screen, such as an integrated touch screen, can include light emitting diodes or organic light emitting diodes (LEDs/OLEDs) and chiplets. In some examples, the LEDs/OLEDs and chiplets can be disposed in a visible area of the integrated touch screen. In some examples, some or all of the chiplets can be disposed outside of the visible area of the integrated touch screen. In some examples, the chiplets can include display driving circuitry and touch sensing circuitry. In some examples, the chiplets can be further configured to perform optical sensing using some of the touch sensing circuitry. Although often described herein as chiplets performing both touch sensing, optical sensing and display functionality, in some examples, the chiplets can include separate touch chiplets configured to perform touch sensing (and/or optical sensing) and display chiplets configured to perform display functionality (and optionally provide some switching functionality for touch sensing functionality and/or optical sensing functionality). The LEDs/OLEDs and chiplets can be placed on a substrate by a micro-transfer tool, for example.

The integrated touch screen can also include electrodes (e.g., ITO) disposed in the visible area of the integrated touch screen. The electrodes can provide display functionality (e.g., via the one or more display chiplets) during display operation and can provide optical sensing and/or touch functionality (e.g., via the one or more touch chiplets) during touch and/or optical sensing operation. For example, the electrodes can operate as cathode terminals of the LEDs during the display operation and/or optical sensing operations. During the touch operation, touch node electrodes can be formed from groups of the electrodes and sensed.

Additionally or alternatively, an electronic device including chiplets and a touch screen (e.g., an integrated touch screen) can be configured for concurrent touch sensing and optical sensing using the chiplets. For example, the integrated touch screen can include multiple regions, and each of the multiple regions can include multiple touch node electrodes. The chiplets can be configured to simultaneously sense capacitance at some of or at each of the regions (e.g., using chiplets coupled to some of the touch node electrodes of each of the regions and configured to operate in a touch sensing configuration) and sense ambient light at some of or at each of the multiple regions (e.g., using chiplets coupled to some of the touch node electrodes of each of the regions and configured to operate in an optical sensing configuration). As a result, localized touch and ambient light information can be captured in parallel for the electronic device.

Figure 1B:
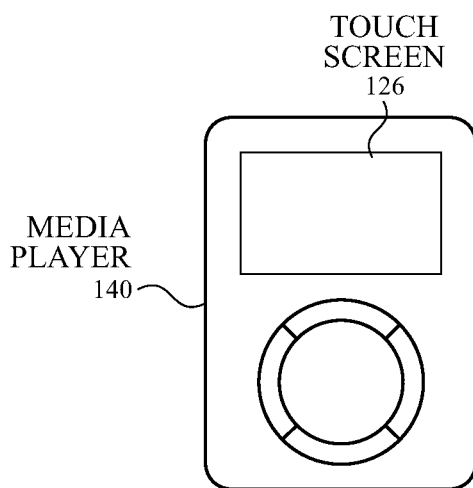
Figure 1C:
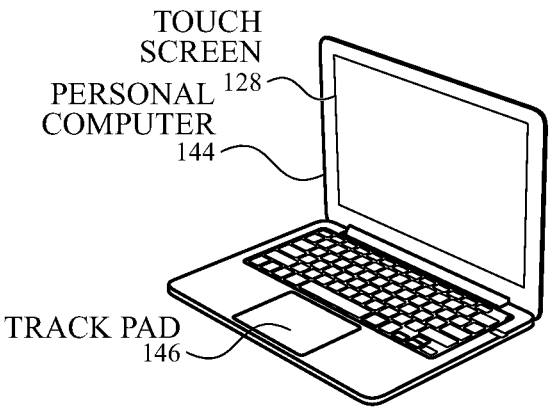
Figure 1D:
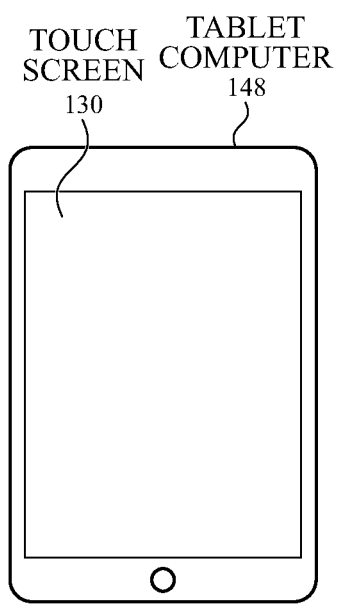
Figure 1E:
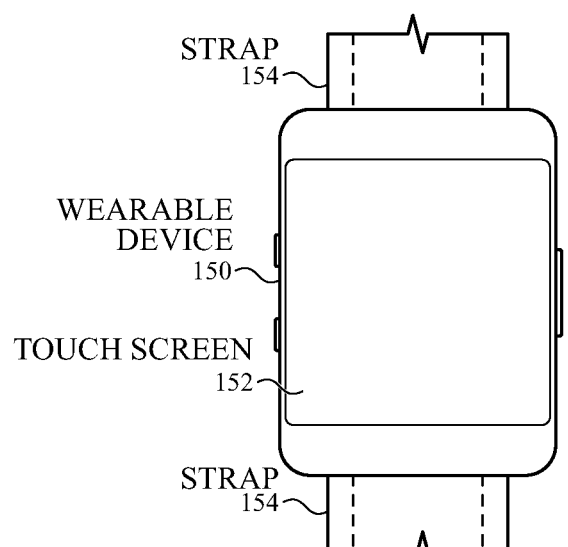

FIGS. 1A-1E illustrate example systems in which an integrated touch screen according to examples of the disclosure may be implemented. FIG. 1A illustrates an example mobile telephone 136 that includes an integrated touch screen 124. FIG. 1B illustrates an example digital media player 140 that includes an integrated touch screen 126. FIG. 1C illustrates an example personal computer 144 that includes a trackpad 146 and an integrated touch screen 128. FIG. 1D illustrates an example tablet computer 148 that includes an integrated touch screen 130. FIG. 1E illustrates an example wearable device 150 (e.g., a watch) secured to the user by strap(s) 154 that includes an integrated touch screen 152. It is understood that the above integrated touch screens can be implemented in other devices as well. Additionally it should be understood that although the disclosure herein primarily focuses on integrated touch screens, some of the disclosure is also applicable to touch sensor panels without a corresponding display.

In some examples, touch screens 124, 126, 128, 130 and 152 can be based on self-capacitance. A self-capacitance based touch system can include a matrix of small, individual plates of conductive material or groups of individual plates of conductive material forming larger conductive regions that can be referred to as touch node electrodes (as described below with reference to FIG. 4). For example, a touch screen can include a plurality of individual touch node electrodes, each touch node electrode identifying or representing a unique location (e.g., a touch node) on the touch screen at which touch or proximity is to be sensed, and each touch node electrode being electrically isolated from the other touch node electrodes in the touch screen/panel. Such a touch screen can be referred to as a pixelated self-capacitance touch screen, though it is understood that in some examples, the touch node electrodes on the touch screen can be used to perform scans other than self-capacitance scans on the touch screen (e.g., mutual capacitance scans). During operation, a touch node electrode can be stimulated with an AC waveform, and the self-capacitance to ground of the touch node electrode can be measured. As an object approaches the touch node electrode, the self-capacitance to ground of the touch node electrode can change (e.g., increase). This change in the self-capacitance of the touch node electrode can be detected and measured by the touch sensing system to determine the positions of multiple objects when they touch, or come in proximity to, the touch screen. In some examples, the touch node electrodes of a self-capacitance based touch system can be formed from rows and columns of conductive material, and changes in the self-capacitance to ground of the rows and columns can be detected, similar to above. In some examples, a touch screen can be multi-touch, single touch, projection scan, full-imaging multi-touch, capacitive touch, etc.

In some examples, touch screens 124, 126, 128, 130 and 152 can be based on mutual capacitance. A mutual capacitance based touch system can include electrodes arranged as drive and sense lines that may cross over each other on different layers, or may be adjacent to each other on the same layer. The crossing or adjacent locations can form touch nodes. During operation, the drive line can be stimulated with an AC waveform and the mutual capacitance of the touch node can be measured. As an object approaches the touch node, the mutual capacitance of the touch node can change (e.g., decrease). This change in the mutual capacitance of the touch node can be detected and measured by the touch sensing system to determine the positions of multiple objects when they touch, or come in proximity to, the touch screen. As described herein, in some examples, a mutual capacitance based touch system can form touch nodes from a matrix of small, individual plates of conductive material.

In some examples, touch screens 124, 126, 128 and 130 can be based on mutual capacitance and/or self-capacitance. The electrodes can be arranged as a matrix of small, individual plates of conductive material (e.g., as in ITO layer 400 in FIG. 4) or as drive lines and sense lines, or in another pattern. The electrodes can be configurable for mutual capacitance or self-capacitance sensing or a combination of mutual and self-capacitance sensing. For example, in one mode of operation, electrodes can be configured to sense mutual capacitance between electrodes, and in a different mode of operation, electrodes can be configured to sense self-capacitance of electrodes. In some examples, some of the electrodes can be configured to sense mutual capacitance therebetween and some of the electrodes can be configured to sense self-capacitance thereof.

Figure 2A:
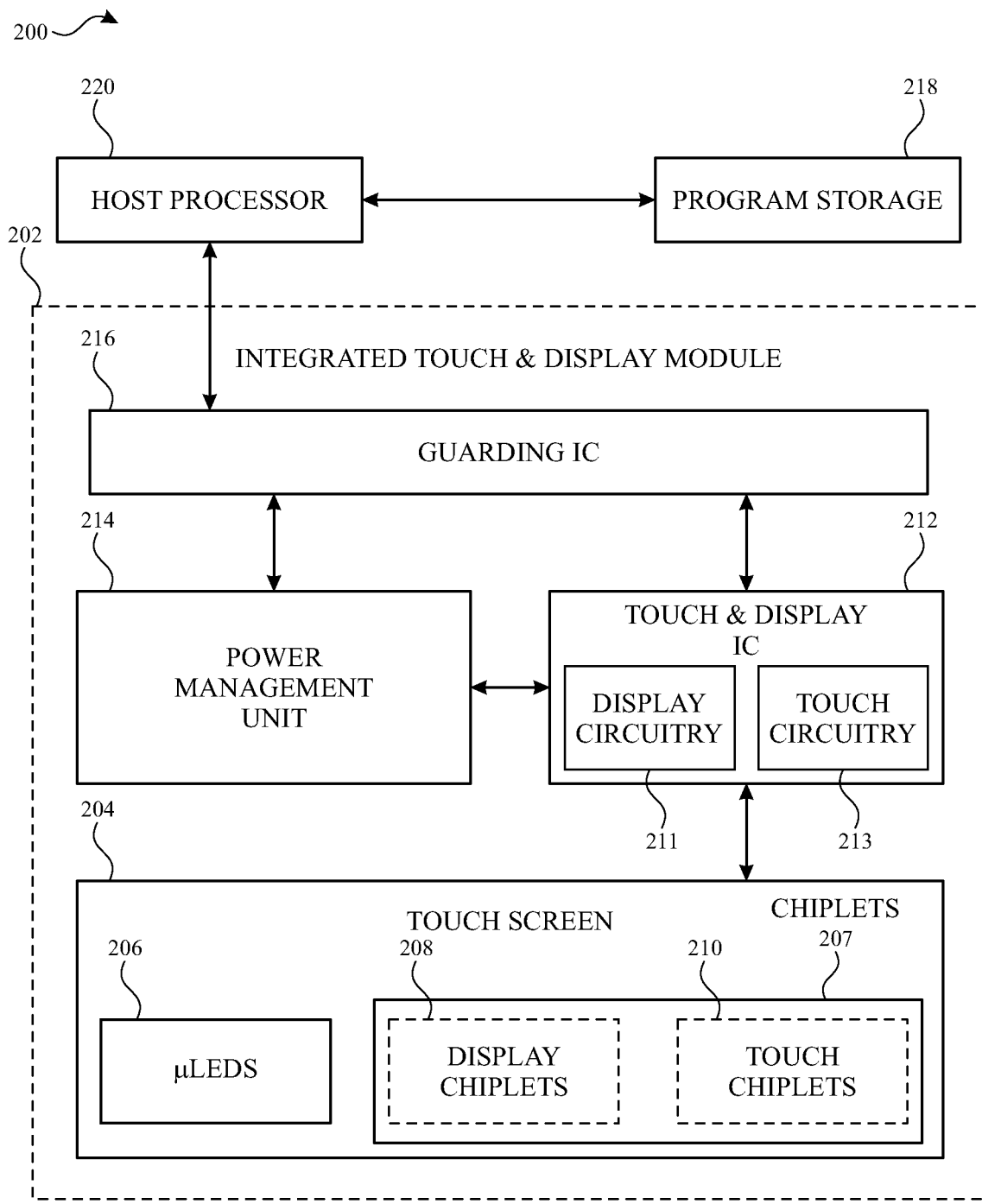
FIG. 2A is a block diagram of an example computing system that illustrates one implementation of an example integrated touch screen according to examples of the disclosure.

FIG. 2A is a block diagram of an example computing system 200 that illustrates one implementation of an example integrated touch screen 204 according to examples of the disclosure. As described in more detail herein, the integrated touch screen 204 can include light emitting diodes (LEDs) or organic light emitting diodes (OLEDs) represented by micro-LEDs 206 and chiplets 207 (e.g., integrated chiplets including LED/OLED drivers, touch sensing circuitry and/or optical sensing circuitry). In some examples, the functionality of chiplets can be divided into separate display chiplets 208 (e.g., including LED/OLED drivers) and touch chiplets 210 (e.g., including touch sensing circuitry and/or optical sensing circuitry). Computing system 200 can be included in, for example, mobile telephone 136, digital media player 140, personal computer 144, tablet computer 148, wearable device 150 or any mobile or non-mobile computing device that includes a touch screen. Computing system 200 can include integrated touch and display module 202, host processor 220 and program storage 218. Integrated touch and display module 202 can include integrated touch screen 204 and integrated circuits for operation of integrated touch screen 204. In some examples, integrated touch and display module 202 can be formed on a single substrate with micro-LEDs 206 and chiplets 207 (or display chiplets 208 and/or touch chiplets 210) of integrated touch screen 204 on one side of the touch screen and integrated circuits controlling operation of micro-LEDs 206 and chiplets 207 mounted on an opposite side of the single substrate. Forming integrated touch and display module 202 in this way can provide for simplified manufacturing and assembly of devices with a touch screen. In some examples, the integrated touch and display module 202 can be formed on a single substrate with micro-LEDs 206 on one side of the substrate and chiplets 207 (or display chiplets 208 and/or touch chiplets 210) of integrated touch screen 204 and integrated circuits controlling operation of micro-LEDs 206 and chiplets 207 mounted on an opposite side of the single substrate.

Integrated circuits for operation of integrated touch screen 204 can include an integrated touch and display integrated circuit (touch and display controller) 212, a power management unit (PMU) 214, and optionally a guard integrated circuit (guard IC) 216. As described in more detail herein, self-capacitance touch sensing performance can be improved (and parasitic capacitance effects reduced) by performing touch sensing operations in a different power domain than in the chassis power domain. In some examples, guard IC 216 can be used to operate integrated touch and display module 202 in a guard power domain during guarded touch operation and operate touch and display module 202 in the chassis power domain otherwise (e.g., during non-guarded touch operations or during display operations). Power management unit 214 can be an integrated circuit configured to provide the voltages necessary for the touch and display controller 212, including guard-referenced power supplies when operating in a guarded power domain. The touch and display controller 212 can include circuitry to perform touch sensing, optical sensing and display operations (e.g., according to the touch sensing, optical sensing and display operations illustrated in FIGS. 7A-7B). Although illustrated in FIG. 2A as a single integrated circuit, the various components and/or functionality of the touch and display controller 212 can be implemented with multiple circuits, elements, chips, and/or discrete components (e.g., a separate touch integrated circuit and a separate display integrated circuit with an integrated circuit to handle the handoff between the two).

The touch and display controller 212 can include display circuitry 211 to perform display operations. Display circuitry 211 can include hardware to process one or more still images and/or one or more video sequences for display on integrated touch screen 204. The display circuitry 211 can be configured to generate read memory operations to read the data representing the frame/video sequence from a memory (not shown) through a memory controller (not shown), for example, or can receive the data representing the frame/video sequence from host processor 220. The display circuitry 211 can be configured to perform various processing on the image data (e.g., still images, video sequences, etc.). In some examples, the display circuitry 211 can be configured to scale still images and to dither, scale and/or perform color space conversion on the frames of a video sequence. Display circuitry 211 can be configured to blend the still image frames and the video sequence frames to produce output frames for display. The display circuitry 211 can also be more generally referred to as a display controller, display pipe, display control unit, or display pipeline. The display control unit can be generally any hardware and/or firmware configured to prepare a frame for display from one or more sources (e.g., still images and/or video sequences). More particularly, the display circuitry 211 can be configured to retrieve source frames from one or more source buffers stored in memory, composite frames from the source buffers, and display the resulting frames on integrated touch screen 204. Accordingly, the display circuitry 211 can be configured to read one or more source buffers and composite the image data to generate the output frame. Display circuitry 211 can provide various control and data signals to the display (described in more detail with respect to FIGS. 5A-5F), via chiplets 207 (or via display chiplets 208), including timing signals (e.g., one or more clock signals) and pixel selection signals. The timing signals can include a pixel clock that can indicate transmission of a pixel. The data signals can include color signals (e.g., red, green, blue) for micro-LEDs 206. The display circuitry can control integrated touch screen 204 in real-time, providing the data indicating the pixels to be displayed as the touch screen is displaying the image indicated by the frame. The interface to such an integrated touch screen 204 can be, for example, a video graphics array (VGA) interface, a high definition multimedia interface (HDMI), a mobile industry processor interface (MIPI), a digital video interface (DVI), a LCD/LED/OLED interface, a plasma interface, or any other suitable interface.

The touch and display controller 212 can include touch circuitry 213 to perform touch operations. Touch circuitry 213 can include one or more touch processors, peripherals (e.g., random access memory (RAM) or other types of memory or storage, watchdog timers and the like), and a touch controller. The touch controller can include, but is not limited to, channel scan logic (e.g., implemented in programmable logic circuits or as discrete logic circuits) which can provide configuration and control for touch sensing operations by chiplets 207 (or by touch chiplets 210). For example, as described with reference to FIGS. 8A-8F, touch chiplets 210 can be configured to drive, sense and/or ground touch node electrodes depending on the mode of touch sensing operations. Additionally or alternatively, the chiplets 207 (or touch chiplets 210) can be configured for optical sensing (e.g., using touch circuitry 213 of touch and display controller 212 or using separate circuitry and a separate controller for optical sensing operations). The mode of touch sensing and/or optical sensing operations can, in some examples, be determined by a scan plan stored in memory (e.g., RAM) in touch circuitry 213. The scan plan can provide a sequence of scan events to perform during a frame. The scan plan can also include information necessary for providing control signals to and programming chiplets 207 for the specific scan event to be performed, and for analyzing data from chiplets 207 according to the specific scan event to be performed. The scan events can include, but are not limited to, a mutual capacitance scan, a self-capacitance scan, a stylus scan, touch spectral analysis scan, a stylus spectral analysis scan, and an optical sensing scan. The channel scan logic or other circuitry in touch circuitry 213 can provide the stimulation signals at various frequencies and phases that can be selectively applied to the touch node electrodes of integrated touch screen 204 or used for demodulation, as described in more detail below. The touch circuitry 213 can also receive touch data from the chiplets 207 (or touch chiplets 210), store touch data in memory (e.g., RAM), and/or process touch data (e.g., by one or more touch processors or touch controller) to determine locations of touch and/or clean operating frequencies for touch sensing operations (e.g., spectral analysis). The touch circuitry 213 (or separate optical sensing circuitry) can also receive ambient light data from the chiplets 207 (or touch chiplets 210), store ambient light data in memory (e.g., RAM), and/or process ambient light data (e.g., by one or more touch processors or touch controller or an optical sensing processor/controller) to determine ambient light conditions.

Integrated touch screen 204 can be used to derive touch data at multiple discrete locations of the touch screen, referred to herein as touch nodes. For example, integrated touch screen 204 can include touch sensing circuitry that can include a capacitive sensing medium having a plurality of electrically isolated touch node electrodes. Touch node electrodes can be coupled to chiplets 207 (or touch chiplets 210) for touch sensing by sensing channel circuitry. As used herein, an electrical component "coupled to" or "connected to" another electrical component encompasses a direct or indirect connection providing electrical path for communication or operation between the coupled components. Thus, for example, touch node electrodes of integrated touch screen 204 may be directly connected to chiplets 207 or indirectly connected to chiplets 207 (e.g., connected to touch chiplets 210 via display chiplets 208), but in either case provided an electrical path for driving and/or sensing the touch node electrodes. Labeling the conductive plates (or groups of conductive plates) used to detect touch as touch node electrodes corresponding to touch nodes (discrete locations of the touch screen) can be particularly useful when integrated touch screen 204 is viewed as capturing an "image" of touch (or "touch image"). The touch image can be a two-dimensional representation of values indicating an amount of touch detected at each touch node electrode corresponding to a touch node in integrated touch screen 204. The pattern of touch nodes at which a touch occurred can be thought of as a touch image (e.g., a pattern of fingers touching the touch screen). In such examples, each touch node electrode in a pixelated touch screen can be sensed for the corresponding touch node represented in the touch image.

Host processor 220 can be connected to program storage 218 to execute instructions stored in program storage 218 (e.g., a non-transitory computer-readable storage medium). Host processor 220 can provide, for example, control and data signals so that touch and display controller 212 can generate a display image on integrated touch screen 204, such as a display image of a user interface (UI). Host processor 220 can also receive outputs from touch and display controller 212 (e.g., touch inputs from the one or more touch processors, ambient light information, etc.) and performing actions based on the outputs. The touch input can be used by computer programs stored in program storage 218 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 220 can also perform additional functions that may not be related to touch processing, optical sensing, and display.

Note that one or more of the functions described herein, including the configuration and operation of chiplets, can be performed by firmware stored in memory (e.g., one of the peripherals in touch and display controller 212) and executed by one or more processors (in touch and display controller 212), or stored in program storage 218 and executed by host processor 220. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

It is to be understood that the computing system 200 is not limited to the components and configuration of FIG. 2A, but can include other or additional components in multiple configurations according to various examples. Additionally, the components of computing system 200 can be included within a single device, or can be distributed between multiple devices. In some examples, PMU 214 and guard IC 216 can be integrated into a power management and guard integrated circuit. In some examples, the power management and guard integrated circuit can provide power supplies (e.g., guard referenced) and the guard signal to touch screen 204 directly rather than via touch and display IC 212. In some examples, touch and display IC 212 can be coupled to host processor 220 directly, and a portion of touch and display IC 212 in communication with chiplets 207 can be included in an isolation well (e.g., a deep N-well isolation) referenced to the guard signal from guard IC 216. In some examples, computing system 200 can include an energy storage device (e.g., a battery). In some examples, computing system 200 can include wired or wireless communication circuitry (e.g., Bluetooth, WiFi, etc.).

As described herein, in some examples integrated touch and display module 202 can perform touch sensing operations (e.g., self-capacitance scans) in a different power domain than in the chassis power domain. In some examples, integrated touch and display module 202 can perform non-guarded touch sensing operations (e.g., mutual capacitance scans) or display operations in the chassis power domain. The optical sensing operations may be performed in either the chassis power domain or another power domain (e.g., guarded power domain), depending on the timing of the optical sensing operations.

Figure 2B:
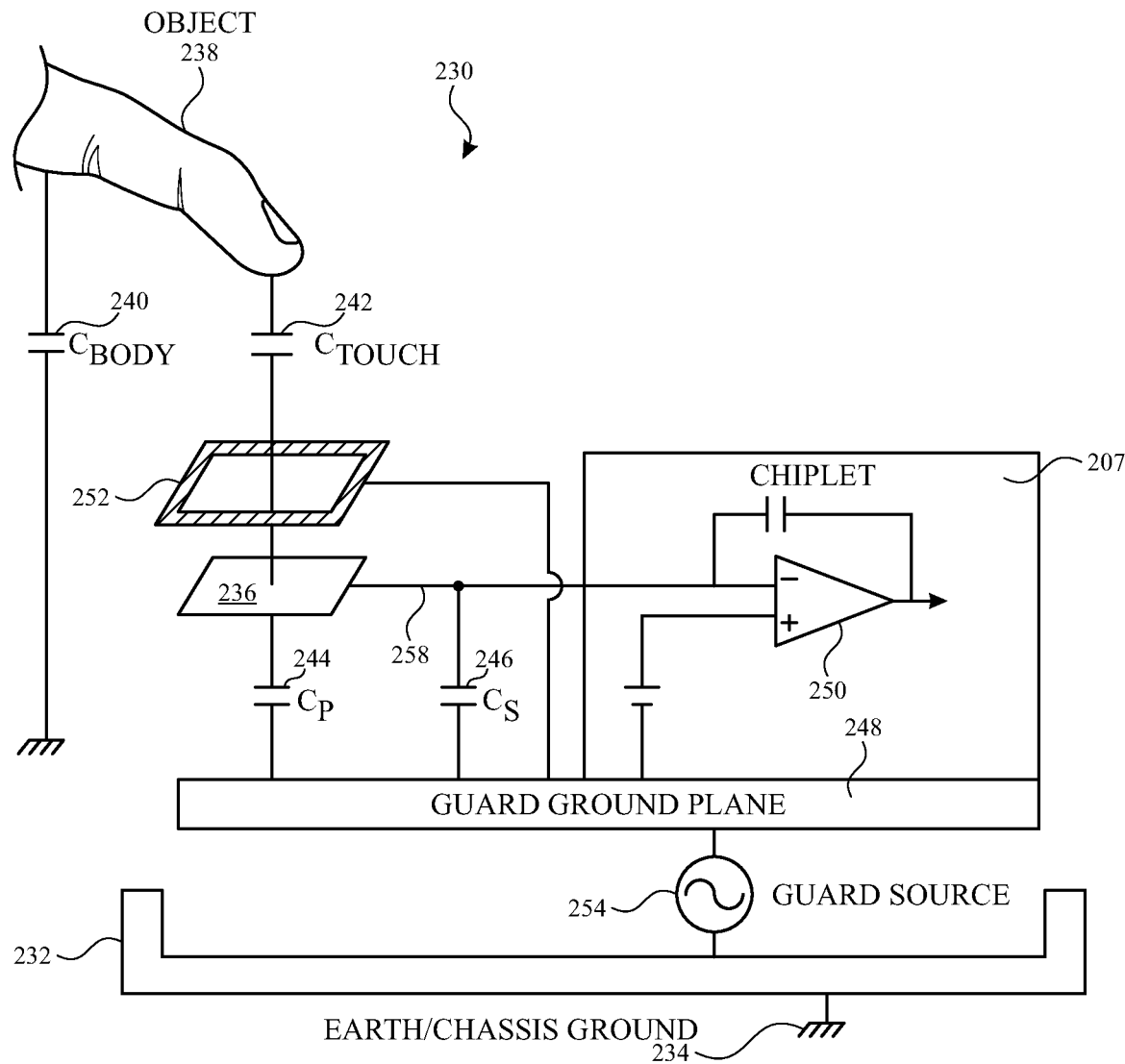
FIG. 2B illustrates an example touch sensing configuration including various associated capacitances according to examples of the disclosure.

FIG. 2B illustrates an example touch sensing configuration 230 including various associated capacitances according to examples of the disclosure. In configuration 230 of FIG. 2B, the touch sensing circuitry of integrated touch screen 204 can be referenced to a guard ground rather than a chassis ground. Specifically, in configuration 230 of FIG. 2B, touch sensing circuitry (e.g., sense amplifier 250) in chiplet 207 (or touch chiplet 210) can be coupled to a touch node electrode 236 by a routing trace 258. Chiplet 207 can be disposed or fabricated on a substrate including a guard ground plane 248 ("guard plane"), which can represent a virtual ground plane of touch chiplet 210 that is different from chassis ground 234 (also referred to herein as earth ground or device ground). In particular, stimulation source 254 ("guard source") disposed in guard IC 216, for example, can be referenced to chassis ground 234, and can output a guard voltage (e.g., a guard stimulation signal, such as a square or trapezoid wave) that can establish the voltage at guard plane 248. In this manner, the guard plane 248 acting as a guard ground for chiplet 207 can be referenced to the guard voltage. Because chiplet 207 can be mounted on a substrate including guard plane 248, the sense amplifier in chiplet 207 can be referenced to the guard signal (and receive other guard-referenced voltages produced by PMU 214, for example), and can be isolated from chassis ground 234 by guard plane 248. In this way, chiplet 207 (or touch chiplet 210) can operate in the guard power domain, whereas the guard source 254 (e.g., in guard IC 216) can operate in the chassis power domain. Guard plane 248 can be any conductive material of a substrate on which chiplet 207 can be disposed or fabricated (e.g., silver, copper, gold, etc.). For example, chiplet 207 may be assembled on a printed circuit board (PCB), and may be referenced to the PCB ground plane 248 driven, during guarded self-capacitance scans, by guard source 254. Guard source 254 can be implemented, for example, using a waveform generator (e.g., generating arbitrary waveforms, such as a square wave referenced to chassis ground 234) whose output can be inputted in to a digital-to-analog converter (DAC). Analog output from the DAC can be provided to a linear buffer (e.g., with unity or some other gain) whose output can correspond to the output of guard source 254.

Additionally, guard plane 248 can be disposed between touch node electrode 236 and chassis 232 (or, more generally, chassis ground 234), and guard plane 248 can be disposed between a routing trace that couples touch node electrode 236 to chiplet 207 and chassis 232 (or, more generally, chassis ground 234). Thus, guard plane 248 can similarly isolate touch node electrode 236 and routing trace 258 that couples touch node electrode 236 to chiplet 207 from chassis ground 234. Guard plane 248 can reduce or eliminate parasitic or stray capacitances that may exist between touch node electrode 236 and chassis ground 234, as will be described below. Optionally, a guard plane can be included in a layer above the touch node electrodes and/or between touch node electrodes (e.g., as illustrated by guard plane 252) and can be referenced to the same guard voltage. Guard plane 252 can include openings corresponding to touch node electrodes to enable detection of touch activity on the touch sensor panel (or proximity activity) while guarding the touch node electrodes and routing from stray capacitances that can form due to a touch or other stray capacitances. In some examples, the material(s) out of which guard planes 248 and 252 are made can be different. For example, guard plane 252 above the touch node electrodes can be made of ITO, or another fully or partially transparent conductor), and guard planes 248 in the substrate (e.g., PCB) can be made of a different conductor, such as copper, aluminum, or other conductor that may or may not be transparent.

Various capacitances associated with touch and/or proximity detection using configuration 230 are also shown in FIG. 2B. Specifically, an object 238 (e.g., a finger) can be in touching or in proximity to touch node electrode 236. Object 238 can be grounded to earth ground 234 through capacitance 240 (e.g., $C_{body}$), which can represent a capacitance from object 238 through a user's body to earth ground 234. Capacitance 242 (e.g., $C_{touch}$) can represent a capacitance between object 238 and touch node electrode 236, and can be the capacitance of interest in determining how close object 238 is to touch node electrode 236. Typically, $C_{body}$ 240 can be significantly larger than $C_{touch}$ 242 such that the equivalent series capacitance seen at touch node electrode 236 through object 238 can be approximately $C_{touch}$ 242. Capacitance 242 can be measured by touch sensing circuitry (e.g., sense amplifier 250) included in chiplet 207 (or touch chiplet 210) to determine an amount of touch at touch node electrode 236 based on the sensed touch signal (e.g., as described with reference to FIG. 8B). As shown in FIG. 2B, touch sensing circuitry in chiplet 207 can be referenced to guard ground (with some DC biasing provided by the chiplet 207 and/or PMU 214). In some examples, capacitance 244 (e.g., $C_p$) can be a parasitic capacitance between touch node electrode 236 and guard plane 248. Capacitance 246 (e.g., $C_s$) can be a stray capacitance between routing trace 258 coupled to touch node electrode 236 and guard plane 248, for example. In some examples, the impact of capacitances 244 and 246 on a sensed touch signal can be mitigated because guard plane 248 and touch sensing circuitry in chiplet 207 are all referenced to the virtual ground signal produced by guard source 254 during a guarded self-capacitance scan.

When guarded, the voltage at touch node electrode 236 and trace 258 can mirror or follow the voltage at guard plane 248, and thereby capacitances 244 and 246 can be reduced or eliminated from the touch measurements performed by chiplet 207 (or touch chiplet 210). Without stray capacitances 244 and 246 affecting the touch measurements, the offset in the output signal of sense amplifier 250 (e.g., when no touch is detected at touch node electrode 236) can be greatly reduced or eliminated, which can increase the signal to noise ratio and/or the dynamic range of sense circuitry in chiplet 207. This, in turn, can improve the ability of touch sensing circuitry in chiplet 207 to detect a greater range of touch at touch node electrode 236, and to accurately detect smaller capacitances $C_{touch}$ 242 (and, thus, to accurately detect proximity activity at touch node electrode 236 at larger distances). Additionally, with a near-zero offset output signal from touch sensing circuitry in chiplet 207, the effects of drift due to environmental changes (e.g., temperature changes) can be greatly reduced. For example, if the signal out of sense amplifier 250 consumes 50% of its dynamic range due to undesirable/un-guarded stray capacitances in the system, and the analog front end (AFE) gain changes by 10% due to temperature, the sense amplifier 250 output may drift by 5% and the effective signal-to-noise ratio (SNR) can be limited to 26 dB. By reducing the undesirable/un-guarded stray capacitances by 20 dB, the effective SNR can be improved from 26 dB to 46 dB.

Figure 2C:
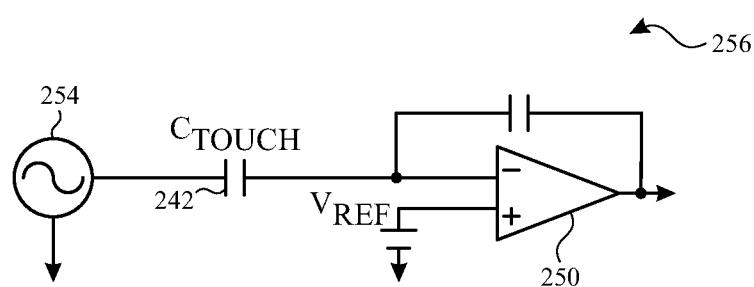
FIG. 2C illustrates an example equivalent circuit diagram of an example touch sensing configuration according to examples of the disclosure.

FIG. 2C illustrates an example equivalent circuit diagram of an example touch sensing configuration 256 according to examples of the disclosure. As described herein, guarding can reduce or eliminate capacitances 244 and 246 from the touch measurements performed by touch sensing circuitry in chiplet 207. As a result, the sense amplifier 250 can simply detect $C_{touch}$ 242, which can appear as a virtual mutual capacitance between object 238 and touch node electrode 236. Specifically, object 238 can appear to be stimulated (e.g., via $C_{body}$ 240) by guard source 254, and object 238 can have $C_{touch}$ 242 between it and the inverting input of sense amplifier 250. Changes in $C_{touch}$ 242 can, therefore, be sensed by sense amplifier 250 as changes in the virtual mutual capacitance $C_{touch}$ 242 between object 238 and sense amplifier 250. As such, the offset in the output signal of sense amplifier 250 (e.g., when no touch is detected at touch node electrode 236) can be greatly reduced or eliminated, as described above. As a result, sense amplifier 250 (e.g., the input stage of touch sensing circuitry of chiplet 207) need not support as great a dynamic input range that self-capacitance sense circuitry might otherwise need to support in circumstances/configurations that do not exhibit the virtual mutual capacitance effect described here.

Because the self-capacitance measurements of touch node electrodes in self-capacitance based touch screen configurations can exhibit the virtual mutual capacitance characteristics described above, chiplet 207 can be designed with a simpler sensing architecture to support both self-capacitance measurements and mutual capacitance measurements. Various example configurations of the touch sensing circuitry for chiplet 207 (or touch chiplet 210) are described herein with respect to FIGS. 8A-8F).

Referring back to FIG. 2A, integrated touch screen 204 can be integrated such that touch sensing circuit elements of the touch sensing system can be integrated with the display stack-up and some circuit elements can be shared between touch and display operations. It is noted that circuit elements are not limited to whole circuit components, such as a whole capacitor, a whole transistor, etc., but can include portions of circuitry, such as a conductive plate.

Figure 3A:
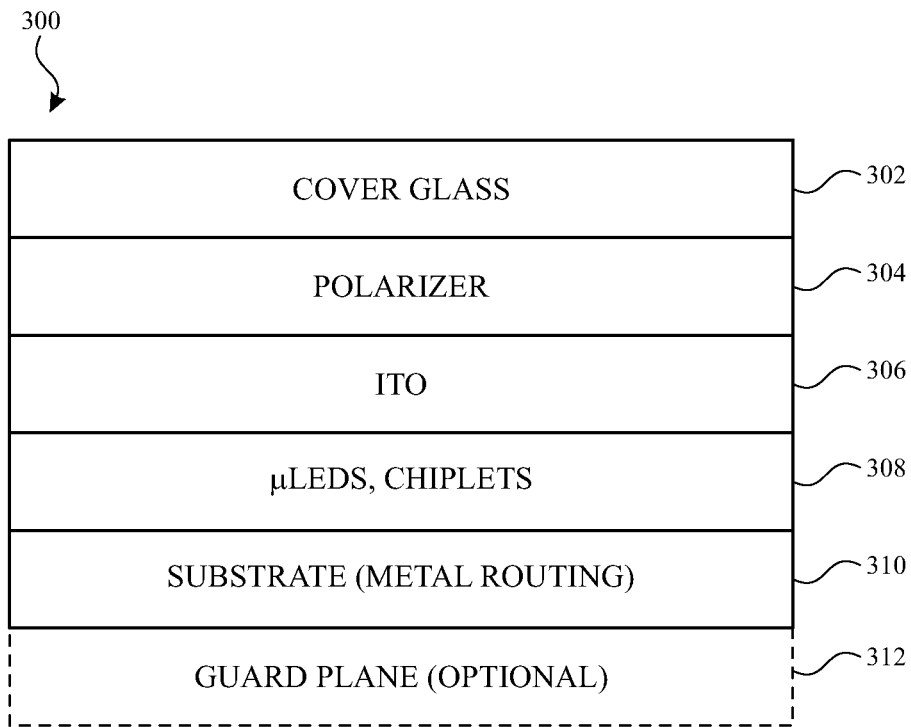
FIGS. 3A-3B illustrate example stack-ups of an integrated touch screen according to examples of the disclosure.
Figure 3B:
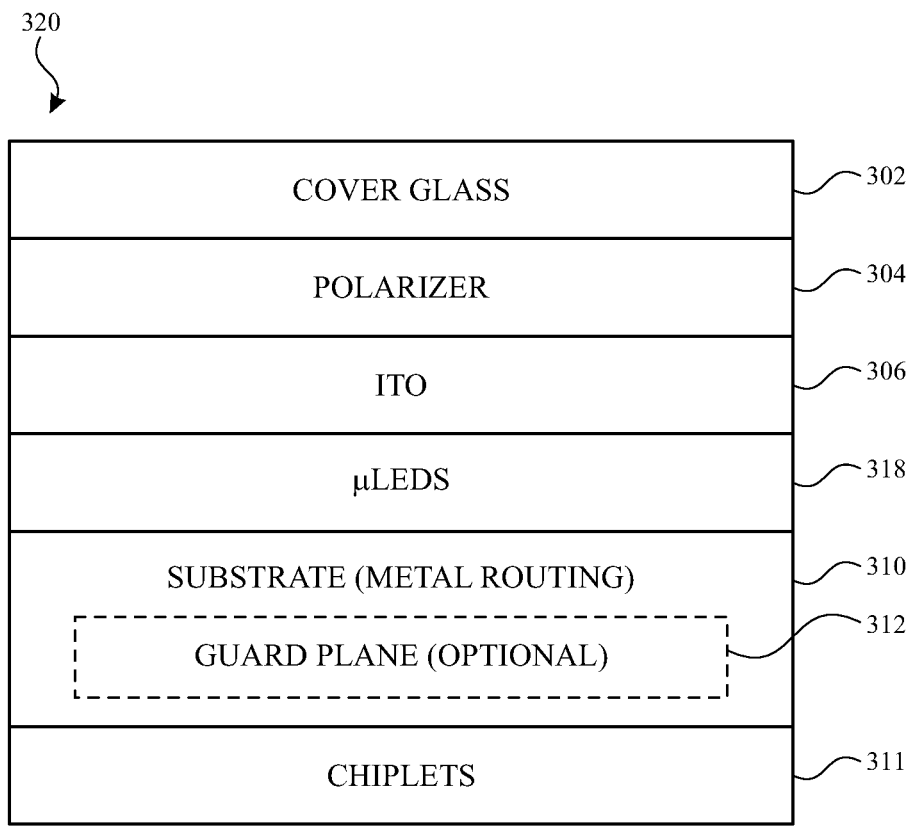

FIGS. 3A-3B illustrate example stack-ups of an integrated touch screen according to examples of the disclosure. FIG. 3A illustrates an example stack-up of a touch screen including chiplets (or touch chiplets and display chiplets) in the visible area of the display. Integrated touch screen 300 comprises a substrate 310 (e.g., a printed circuit board) upon which chiplets 207 (or touch chiplets 210 and/or display chiplets 208) and micro-LEDs 206 can be mounted in touch and display circuit layer 308. In some examples, the chiplets 207 and/or micro-LEDs 206 can be partially or fully embedded in the substrate (e.g., the components can be placed in depressions in the substrate). In some examples, the chiplets 207 can be mounted on one and/or both sides of substrate 310. For example, some or all of the chiplets 207 can be mounted on a second side of substrate 310 (or some or all of the touch chiplets 210 and/or some or all of the display chiplets 208 can be mounted on a second side of substrate 310). In some examples, the chiplets can be disposed on the second side of the substrate (opposite the first side of the substrate including micro-LEDs 206). FIG. 3B illustrates an example stack-up of a touch screen including chiplets (or touch chiplets and/or display chiplets) outside the visible area of the display. Unlike the stack-up of integrated touch screen 300, in which chiplets 207 and micro-LEDs 206 can be mounted in touch and display circuit layer 308, stack-up of integrated touch screen 320 can include chiplets mounted in a touch and display circuit layer 311 on a second (bottom) side of substrate 310 different than the micro-LEDs 206 mounted on in a display pixel layer 318 on a first (top, visible) side of substrate 310. In some examples, placing the chiplets on the second side of the substrate can allow for uniform spacing of the micro-LEDs and/or increased density of micro-LEDs on the first side of substrate 310.

The substrate 310 can include routing traces in one or more layers to route signals between micro-LEDs 206, chiplets 207 and touch and display controller 212. Substrate 310 can also optionally include a guard plane 312 for guarded operation (e.g., corresponding to guard plane 248 in FIG. 2B). Although illustrated on the bottom of substrate 310 in FIG. 3A, guard plane 312 can be formed as a layer of substrate 310 other than the bottom layer (e.g., as illustrated in FIG. 3B in an internal layer of substrate 310).

After mounting micro-LEDs 206 and chiplets 207 in the touch and display circuit layer 308 in FIG. 3A (e.g., during a pick-and-place assembly), a planarization layer (e.g., transparent epoxy) can be deposited over the micro-LEDs 206 and chiplets 207. The planarization layer can be deposited over the micro-LEDs 206 in the display pixel layer 318 in the stack-up of FIG. 3B. A fully or partially transparent conductor layer 306 (e.g., ITO) can be deposited above planarized touch and display circuit layer 308 in FIG. 3A or above the display pixel layer 318 in FIG. 3B. Conductor layer 306 can include a pattern of individual conductor plates that can be used for touch and display functions of integrated touch screen 300. For example, individual conductor plates can be used as cathode terminals for micro-LEDs during display operations (and/or optical sensing operations) and groups of conductor plates can form touch node electrodes for touch operations. Polarizer 304 can be disposed above the transparent conductor layer 306 (optionally with another planarization layer disposed over the transparent conductor layer 306). Cover glass (or front crystal) 302 can be disposed over polarizer 304 and form the outer surface of integrated touch screen 300. The stack-up of integrated touch screens 300 and/or 320 can provide numerous benefits including reduced costs (e.g., due to simplified assembly of devices including integrated touch and display module 202 and a reduced number of integrated circuits by combining touch and display functionality into integrated touch and display controller 212), reduced stack-up height (sharing conductors eliminates a separate touch node electrode layer; integrating chiplets 207 (or touch chiplets 210 and display chiplets 208) into the stack-up on the same layer with the micro-LEDs does not add to the stack-up height for FIG. 3A), simplified support for guarded self-capacitance scans (by including touch circuitry 213 on integrated touch and display module 202 with a guard plane extending throughout the substrate of integrated touch and display module 202), and shrinking the border region around the touch screen (because routing can be done through the substrate rather than in the border regions).

Figure 4:
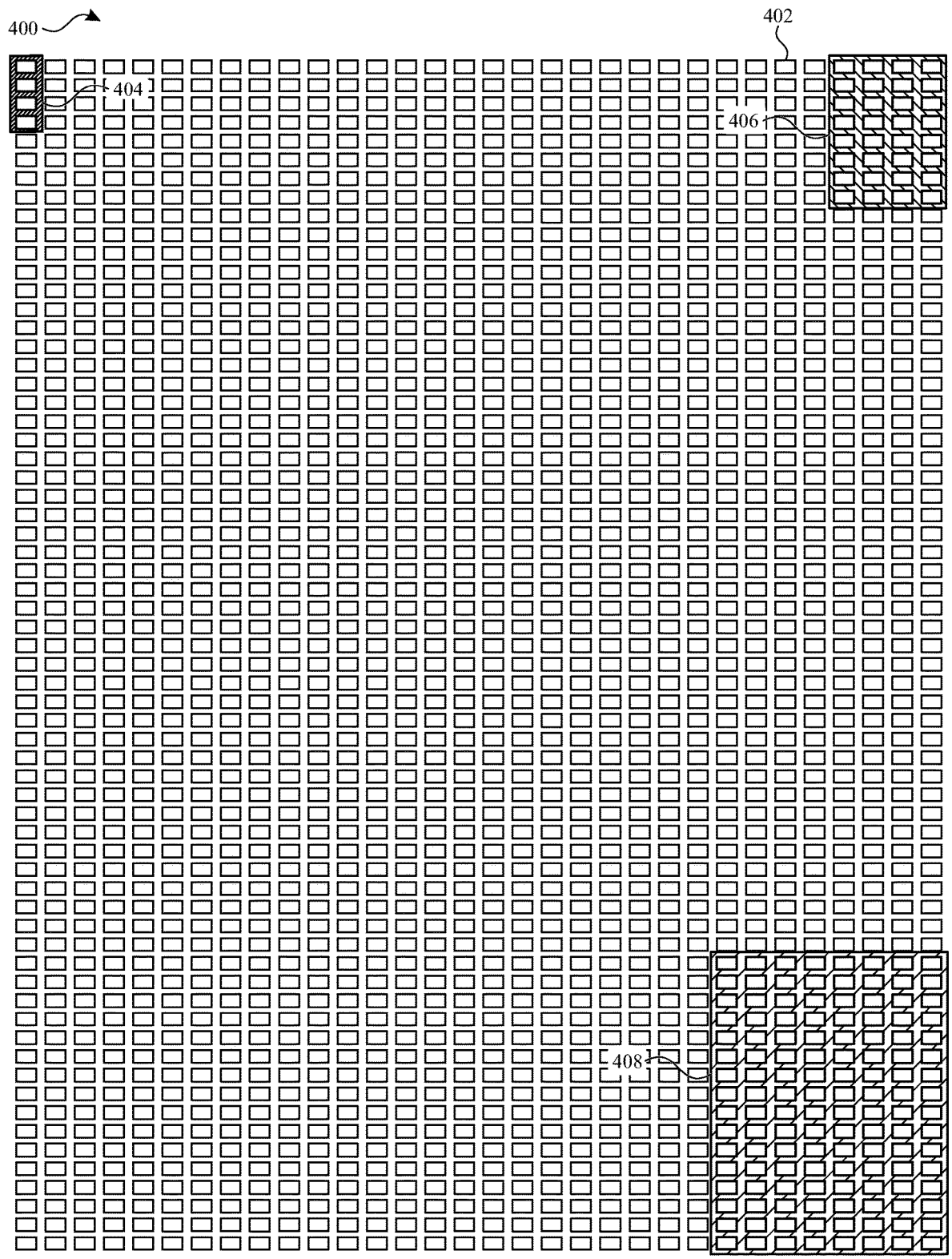
FIG. 4 illustrates an example pattern of ITO patches according to examples of the disclosure.

Conductor layer 306 can include a pattern of individual conductor plates (e.g., ITO patches). FIG. 4 illustrates an example pattern of ITO patches according to examples of the disclosure. ITO layer 400 (e.g., corresponding to conductor layer 306) can include 2048 rectangular ITO patches 402 arranged in a 64 row by 32 column array. Although the pattern illustrated in FIG. 4 is of a rectangular array of rectangular patches, it should be understood that other shapes of ITO patches 402 and other patterns can be used. Additionally, it should be understood that the number of ITO patches 402 and size of the array can be different than illustrated in FIG. 4. Each of the ITO patches 402 can be formed over a bank of micro-LEDs (and may therefore be referred to as ITO banks herein) and can serve as the cathode terminal for the bank of micro-LEDs during display operations.

As described below in more detail, ITO patches 402 can be coupled together to form touch node electrodes for touch sensing operations. In some examples, ITO patches 402 coupled to a chiplet (e.g., corresponding to one of chiplets 207) can be coupled together using switching circuitry within the chiplet to form a touch electrode. In some examples, a group of ITO banks (such as ITO group 404 of four ITO patches 402) can be coupled to one or more (redundant) display chiplets (e.g., corresponding to display chiplets 208), and groups of ITO banks can be coupled together using the display chiplets to form touch node electrodes for touch sensing operations. Each of the touch node electrodes formed from the groups of ITO banks can be coupled during touch operations to a touch chiplet (e.g., corresponding to one of touch chiplets 210).

For example, touch node electrode 406 can be formed of by grouping together 32 ITO patches 402 (8 rows; 4 columns) to a chiplet or by grouping together 8 ITO groups 404 (2 rows; 4 columns) using corresponding display chiplets. In such a configuration, the area of ITO layer 400 can be represented by 64 touch node electrodes 406 (forming a touch image with 64 touch nodes). In some examples, touch node electrode 408 can be formed of by grouping 128 ITO patches 402 (16 rows; 8 columns), by grouping together 32 ITO groups 404 (4 rows; 8 columns), or grouping together 4 touch node electrodes 406 (2 rows; 2 columns). In such a configuration, the area of ITO layer 400 can be represented by 16 touch node electrodes (forming a touch image with 16 touch nodes).

The number of ITO patches in a touch node electrode can be selected according to the desired sensing resolution. For example, as described above, touch node electrodes 406 are smaller than touch node electrodes 408 and therefore provide a higher resolution level for the touch image (64 touch nodes versus 16 touch nodes). The number of ITO patches in a touch node may be limited by space available for chiplets, which can be a function of the density of LEDs/display pixels. In some examples, the touch data of a first resolution of touch nodes can be combined digitally to form a reduced resolution touch image. For example, a touch image with data corresponding to 64 touch nodes with each touch node defining a first area (e.g., between 1 and 4 square millimeters) can be combined digitally (e.g., by touch and display controller 212) to form a lower resolution touch image including data corresponding to 16 larger touch nodes with each of the larger touch nodes representing a group of the 64 touch nodes and defining a second area (e.g., between 16 and 64 square millimeters). In some examples, the second area can be an integer multiple of the first area, with the integer multiple corresponding to the number of the 64 touch nodes in the group (e.g., four in this example). The combination can be performed by averaging or other image filtering techniques. One advantage of combining touch data to form a lower resolution touch image can be to leverage touch detection algorithms designed for the lower resolution touch image when a higher resolution touch image may not be required. In some examples, touch detection algorithms can be modified to handle different resolution touch images.

In some examples, a touch image with data corresponding to fewer than all of the 64 touch nodes of the first area (e.g., a first subset of 32 or 48 touch nodes) can be captured by chiplets configured to detect touch, and chiplets for some of the 64 touch nodes (e.g., a second, different subset of 32 or 16 touch nodes) can be used for optical sensing operations, as described herein. The touch data captured by chiplets configured to detect touch (e.g., the first subset) can be combined to form a touch image representing touch for each of the larger touch nodes of the second area. The ambient light data captured by chiplets configured to measure ambient light (e.g., the second subset) can be combined to form an ambient light image representing ambient light measurements for each of the larger touch nodes of the second area (similar to the touch image but for ambient light). It is understood that a combination may not be possible (for touch data and/or ambient light data), in some examples, in which only one reading is available for a larger touch node of the second area from the chiplets of a group of touch nodes of the first area forming the larger touch node. In some such examples, the reading from one touch node of the first area can represent the ambient light or touch for the larger touch node of the second area.

Figure 5A:
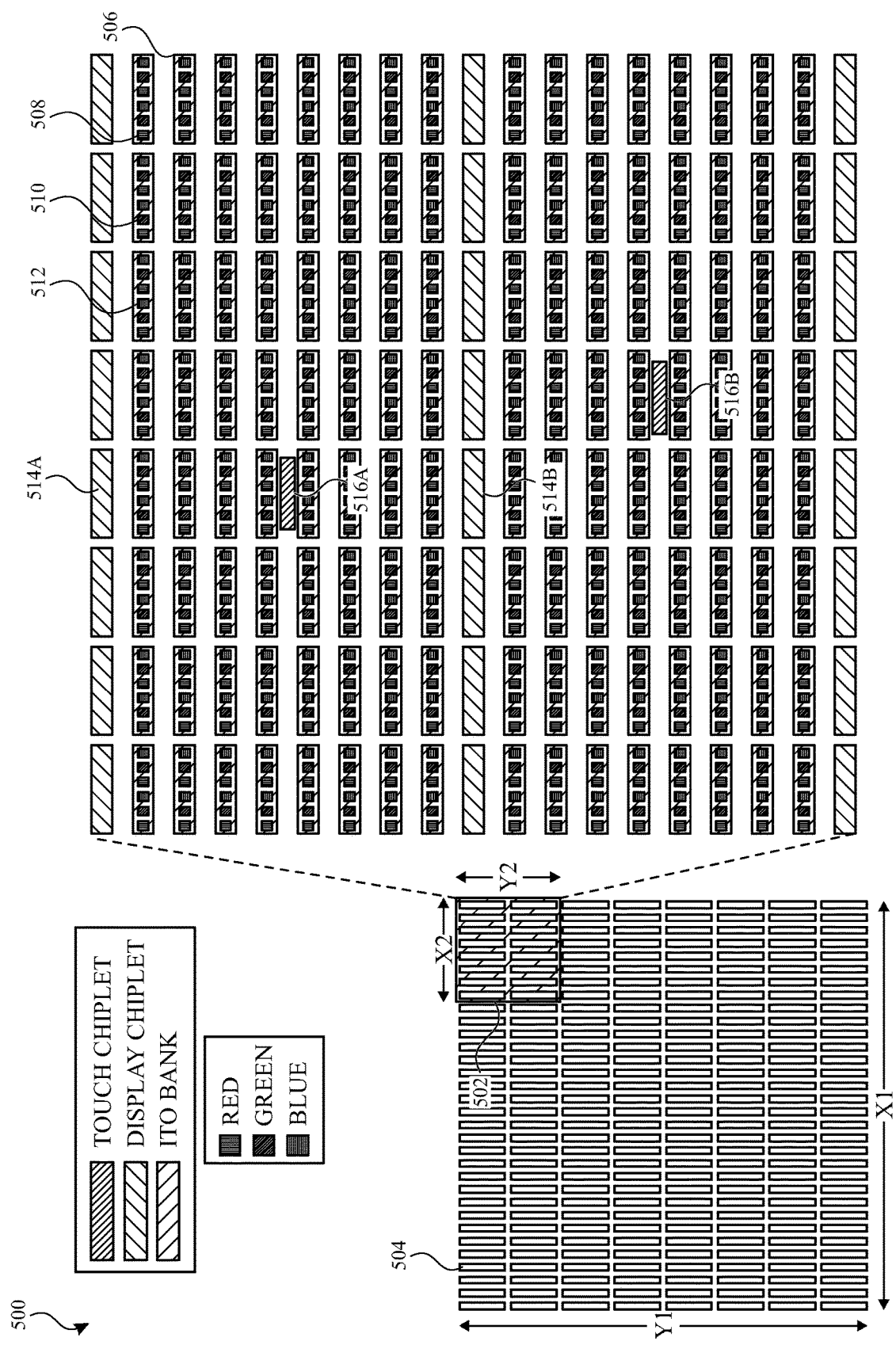
FIG. 5A illustrates a portion of an example conductive layer and corresponding circuitry of a portion of an example touch and display circuit layer according to examples of the disclosure.

FIG. 5A illustrates a portion of an example conductive layer and corresponding circuitry of a portion of an example touch and display circuit layer according to examples of the disclosure. Integrated touch screen 500 can include a conductive layer (e.g., corresponding to conductive layer 306), a portion of which is shown in FIG. 5A. The portion of the conductive layer can define a region having an area X1 by Y1 (e.g., 5 mm×5 mm) including 16 touch node electrodes 502. Each touch node electrode 502 can be formed from 16 ITO groups 504 (2 rows; 8 columns) and can define an area X2 by Y2 smaller than X1 by Y1 (e.g., 1.25 mm×1.25 mm). In some examples, as described herein, touch can be measured using chiplets (or touch chiplets) for some or all of the smaller regions (first regions) with the area X2 by Y2. In some examples, as described herein, the touch image used for determining touch input from the user to the integrated touch screen can combine these touch measurements for some or all of the smaller regions (first regions) into a touch image with a lower resolution corresponding to the larger regions (second regions) of the area X1 by Y1. In some examples, as described herein, the ambient light image used for determining ambient light incident on the touch screen can combine ambient light measurements for some or all of the smaller regions (first regions) into an ambient light image with a lower resolution corresponding to the larger regions (second regions) of the area X1 by Y1.

Figure 5B:
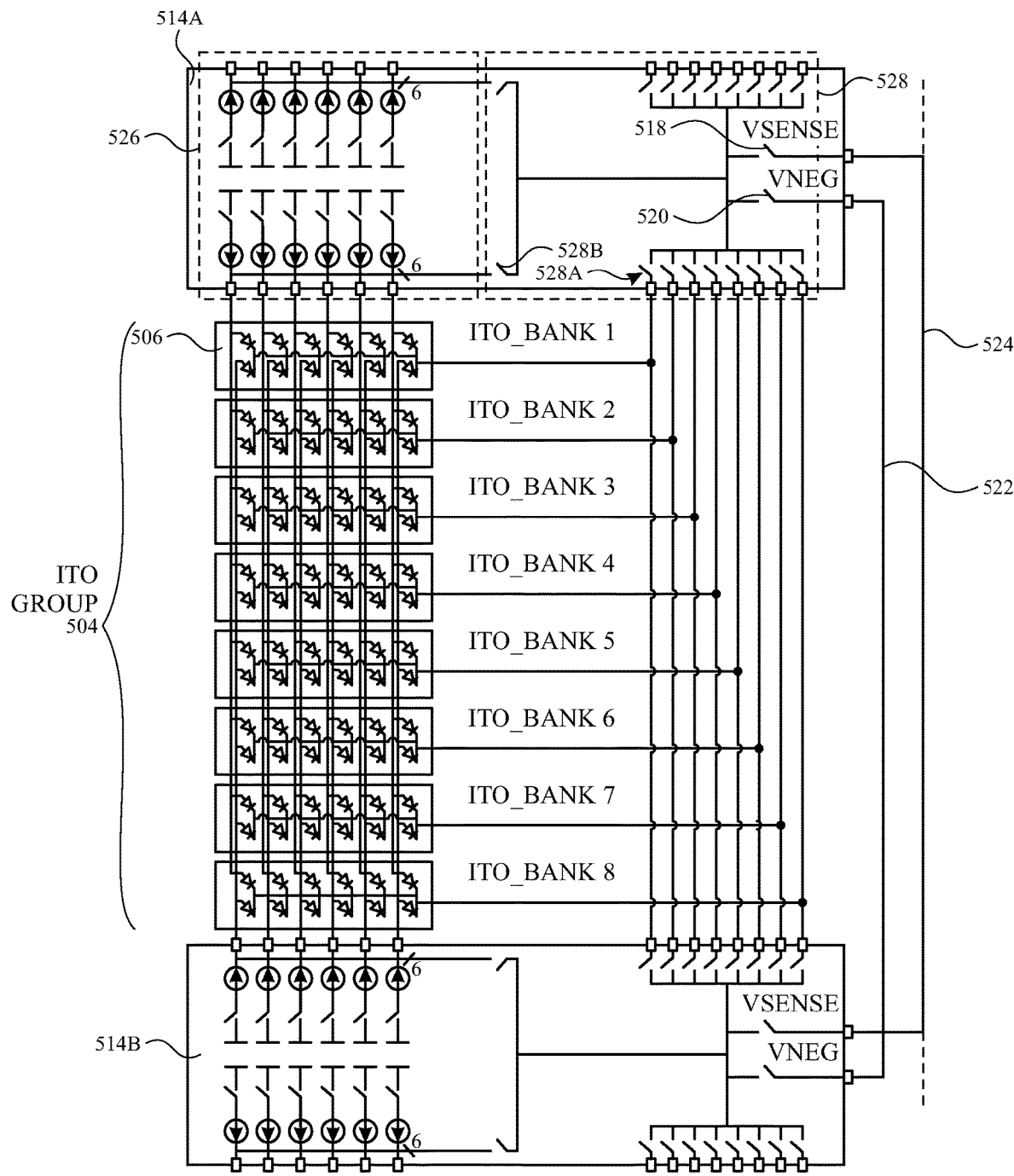
FIG. 5B illustrates an example ITO group and corresponding display chiplets according to examples of the disclosure.

FIG. 5A also illustrates an expanded view of touch node electrode 502 showing the component ITO banks 506 of the ITO groups 504 and touch and display circuitry (e.g., corresponding to components of touch and display circuit layer 308). The touch and display circuitry can include micro-LEDs 508, 510, 512, display chiplets 514A, 514B and touch chiplets 516A, 516B. Touch node electrode 502 of FIG. 5A includes 128 ITO banks 506 (i.e., 8 ITO banks 506 per ITO group 504). Each ITO bank can be coupled to two display chiplets 514A and 514B. One of the display chiplets 514A or 514B can update the micro-LEDs in the corresponding ITO group, and the second of the display chiplets 514A or 514B can be a spare or redundant display chiplet. The display chiplets can be programmed or operated such that only one of the two display chiplets for a corresponding ITO group 504 is operating on the corresponding ITO group. As illustrated in FIG. 5A, each ITO bank can serve as a cathode for two display pixels (e.g., each including red, green and blue sub-pixels). In some examples, each ITO bank can serve as the cathode for more or fewer display pixels. In some examples (e.g., as illustrated in FIG. 5B), each ITO bank can include duplicate display pixels. Anodes of one set of pixels can be coupled to display chiplet 514A and anodes of the second set of pixels can be coupled to display chiplet 514B. The cathodes of both sets of pixels can be coupled to the same ITO bank.

Although illustrated in FIG. 5A as coupling two display chiplets 514A, 514B to each ITO group 504, it should be understood that additional display chiplets can be included to provide additional redundancy. During touch operation, ITO banks 506 can be coupled together to form touch node electrode 502, and touch node electrode 502 can be coupled to two touch chiplets 516A and 516B. One of the touch chiplets 516A or 516B can be configured for touch sensing operations, and the second of the touch chiplets 516A or 516B can be a spare or redundant chiplet. The touch chiplets can be programmed or operated such that only one of the two touch chiplets coupled to touch node electrode 502 is operating on touch node electrode 502. Although illustrated in FIG. 5A as using two touch chiplets for touch node electrode 502, it should be understood that additional touch chiplets can be included to provide additional redundancy. Additionally, although illustrated in FIG. 5A as using a main and redundant touch chiplet for each touch node electrode and a main and redundant display chiplet for each ITO group, it should be understood that in some examples, redundant touch chiplets or redundant display chiplets can be omitted.

FIG. 5B illustrates an example ITO group and corresponding display chiplets according to examples of the disclosure. Display chiplet 514A can include display micro-drivers 526 and can include ITO switches 528. Display chiplet 514B can include similar circuitry and its description is omitted here for brevity. Display micro-drivers 526 and ITO switches 528 can include duplicate circuitry (micro-drivers, ITO switches), in some examples, to enable operation on LEDs corresponding to ITO banks on either side of the display chiplet. In some examples, the display chiplet can be configured to reuse the circuitry without duplication and update internal connections to operate on LEDs corresponding to ITO banks on the operating side of the display chiplet.

Display chiplet 514A can be coupled to one or more red, green, and blue LED/OLED devices 508, 510, 512 that emit different colors of light. In a red-green-blue (RGB) sub-pixel arrangement, each pixel includes three sub-pixels that emit red, green and blue light, respectively. The RGB arrangement is exemplary and other examples may include alternative sub-pixel arrangements (e.g., red-green-blue-yellow (RGBY), red-green-blue-yellow-cyan (RGBYC), or red-green-blue-white (RGBW), or other sub-pixel matrix schemes where the pixels may have a different number of sub-pixels). As illustrated in FIGS. 5A and 5B, display chiplet 514A can be coupled to an 8 row and 2 column array of pixels. Each row of the array can correspond to an ITO bank 506. The ITO bank 506 can serve as a cathode node when selected by switching circuitry of ITO switches 528, for example. The cathode node can be connected to a voltage, Vneg, via switch 520 during display operations (while switch 518 can remain open during display operation). Display micro-drivers 526 can include six current drivers, one for each sub-pixel element in the two columns of pixels. The anode of each sub-pixel of a column can be coupled to a respective current driver in display micro-drivers 526. For example, the anode of each blue sub-pixel in the first column of pixels can be coupled together and to one of the current drivers and the anode of each blue sub-pixel in the second column of pixels can be coupled together and to a different one of the current drivers. Likewise, the anode of each green sub-pixel or red sub-pixel in the first and second columns of pixels can be respectively coupled together and to respective current sources. Thus, during display operations, selecting one of the ITO banks 506 using switches of ITO switches 528 and adjusting and providing the operating current of respective current drivers in display micro-drivers can address the illumination adjustment for each pixel controlled by display chiplet 514A. In some examples, refresh and/or timing signals can be provided by the touch and display controller to address each LED device individually, to enable asynchronous or adaptively synchronous display updates. In some examples, display brightness can be adjusted by manipulation of reference voltages (not shown) supplied to the display micro-drivers.

As described above, during display operations, switches of ITO switches 528 can select a respective bank to couple to the cathode node (e.g., a multiplexer 528A or corresponding group of discrete switches can be used to select one of the ITO banks coupled to pins/terminals of display chiplet 514A), which is in turn coupled to Vneg by switch 520 (while switch 518 and switch 528B remains open). During touch operations by an integrated touch screen, ITO switches 528 of display chiplet 514A can instead couple together each of the ITO banks 506 in ITO group 504 (e.g., closing all of the switches corresponding to multiplexer 528A), and couple ITO group 504 to a touch chiplet via switch 518 (while switch 520 remains open). Additionally, switch 528B can be closed so that the anode and cathode of the LED devices can be shorted to avoid any noise from the LEDs (e.g., leakage current or photocurrents) interfering with touch sensing. Additionally, multiple ITO groups corresponding to multiple display chiplets can be coupled together to form touch node electrodes, and be coupled to one or more touch chiplets.

Figure 5C:
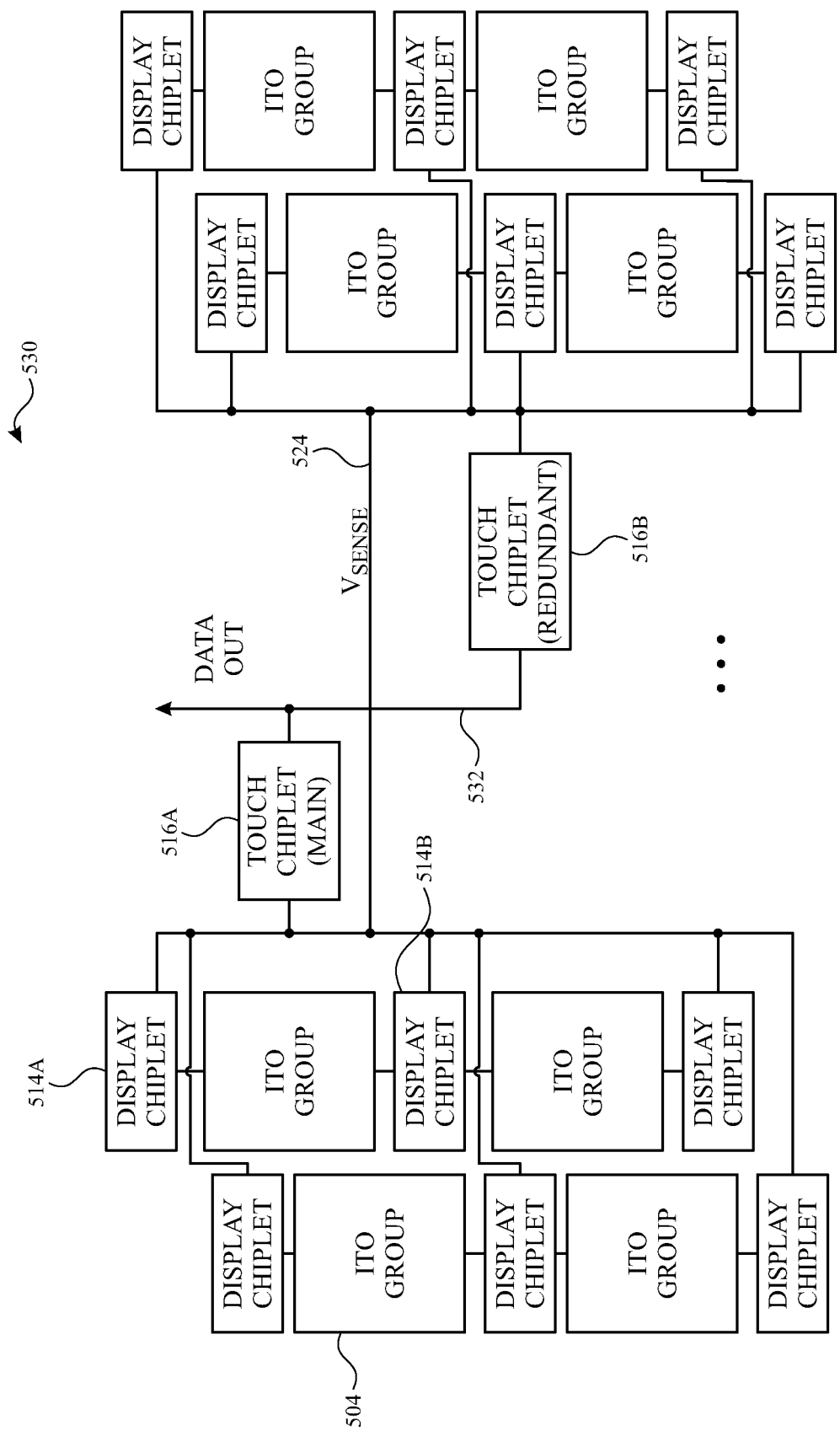
FIG. 5C illustrates coupling together of ITO groups corresponding to multiple display chiplets into a touch node electrode, and coupling the touch node electrode to one or more touch chiplets according to examples of the disclosure

FIG. 5C illustrates coupling together of ITO groups corresponding to multiple display chiplets into a touch node electrode (e.g., corresponding to touch node electrode 502), and coupling the touch node electrode to one or more touch chiplets according to examples of the disclosure. FIG. 5C illustrates configuration 530 including multiple ITO groups 504 and corresponding display chiplets (e.g., display chiplets 514A and 514B). Each of the display chiplets in FIG. 5C can include ITO switches 528 as shown in FIG. 5B to couple the ITO banks in each of the ITO groups together. Additionally, the Vsense pins of each of the display chiplets of FIG. 5C can be tied together by Vsense line 524. As a result, when switch 518 is closed in each of the display chiplets, the ITO groups illustrated in FIG. 5C can form a touch node electrode with an area corresponding to the collective area of each of the ITO banks. Touch chiplet 516A can be coupled to Vsense line 524 to enable touch sensing operations of the touch node electrode. Additionally, in some examples, one (or more) redundant touch chiplets 516B can also be coupled to Vsense line 524 to enable touch sensing operations of the touch node electrode should touch chiplet 516A fail to operate properly. In examples including one or more redundant touch chiplets, the touch chiplets can be configured so that only one of the touch chiplets coupled to a respective touch node electrode operates for any given touch operation, as described in more detail herein. Additionally, as described in more detail herein, the main and redundant touch chiplets corresponding to a touch node electrode can share a touch data output line 532 (data out).

Figure 5D:
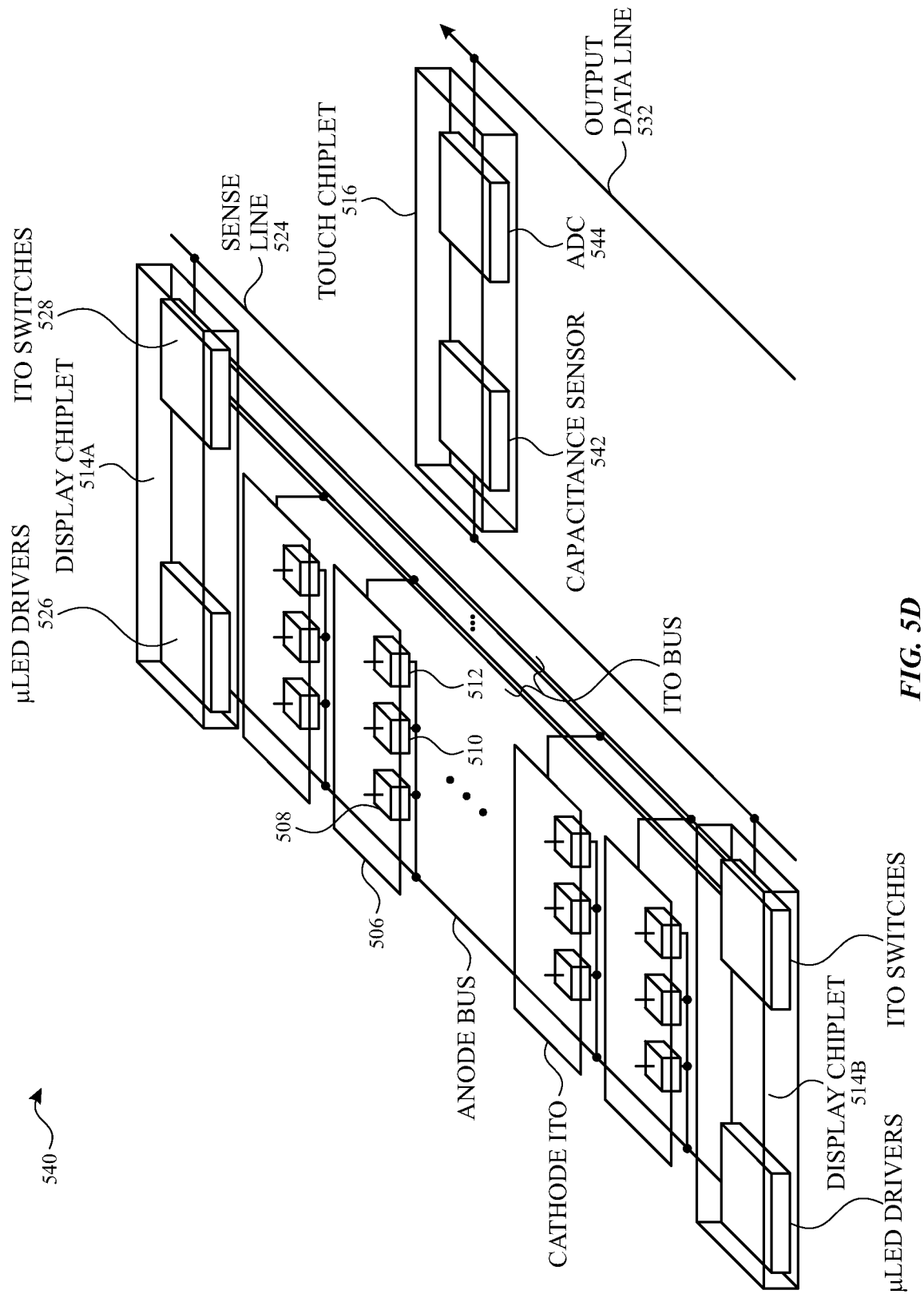
FIG. 5D illustrates an example mechanical view of an example group of ITO banks, corresponding display chiplets and a corresponding touch chiplet according to examples of the disclosure.

FIG. 5D illustrates an example mechanical view of an example group of ITO banks, corresponding display chiplets and a corresponding touch chiplet according to examples of the disclosure. Display chiplets 514A and 514B, micro-LEDs 508, 510 and 512, and touch chiplet 516 can be mounted on a substrate (e.g., in touch and display circuit layer 308 on substrate 310). ITO banks 506 can be deposited on a layer above the touch and display circuitry (e.g., in conductor layer 306). ITO banks 506 can be coupled to the cathode node of corresponding pixels (e.g., including red, green and blue micro-LEDs 508, 510 and 512). The micro-drivers 526 in display chiplets 514A and/or 514B can be coupled to the anode node of the pixels (e.g., one current micro-driver per column of sub-pixel elements). The display chiplets 514A and 514B can each include ITO switches 528. ITO switches 528 can be coupled to the ITO banks via an ITO bus. ITO switches 528 can selectively couple ITO banks to a voltage (Vneg) during display operation (e.g., in a serial sequence to update each row of pixels during a display refresh). ITO switches 528 can also selectively couple ITO banks 506 in an ITO group together and to touch chiplet 516 (via a sense line) during touch operations. The touch chiplet 516 can include sensing circuitry (also referred to as a sense channel or sensing channel circuitry) for a touch node electrode. For example, as illustrated in FIG. 5D, touch chiplet 516 can include a capacitance sensor 542 and an analog-to-digital converter (ADC) 544 to perform analog touch sensing and send digital touch data via touch data output line 532 (e.g., to touch and display controller 212).

All of the routing illustrated in FIG. 5D can be implemented by metallic routing in the substrate upon which the touch and display circuitry can be mounted, except for the short connections between ITO banks 506 and micro-LEDs 508, 510, 512 and between ITO banks 506 and the ITO bus.

As described above, the touch chiplets may include analog circuitry (e.g., capacitance sensor 542 and ADC 544) to perform analog touch sensing locally (e.g., by circuitry within the integrated touch screen stack-up) and send digital touch data to the touch and display controller for processing. Performing analog sensing locally can reduce touch non-idealities by shortening the distance of routing (compared with performing analog sensing using a touch sensing chip routed outside the touch screen) and by simplifying the process of matching of analog signal routing (which can also reduce baseline drift across the touch screen). Shorter distance can reduce cross-talk between analog lines and can reduce the need to compensate measurements across various touch sensors in the touch screen to account for routing mismatch and delays. For example, the short routing can result in an effective RC constant of approximately 100 ps (far lower than the effective time constant in touch screens that have to route analog drive and sense signals through long ITO traces across the touch screen). The digital signals routed in metal (rather than transparent conductors such as ITO) are far less susceptible to noise and delay issues (by one or more orders of magnitude). Although referred to as touch chiplet 516 and illustrated to include a capacitance sensor 542, it is understood that, in some examples, the touch chiplet can also perform optical sensing operations in which the analog circuitry is used to perform optical sensing measurements rather than capacitance measurements. In the optical sensing configuration, capacitance sensor 542 may be configured to operate as an optical sensor rather than a capacitance sensor, and the optical sensing information (e.g., optical touch or ambient light sensing (ALS) information) can be provided to the touch and display controller and/or host processor via the output data line 532.

Figure 5E:
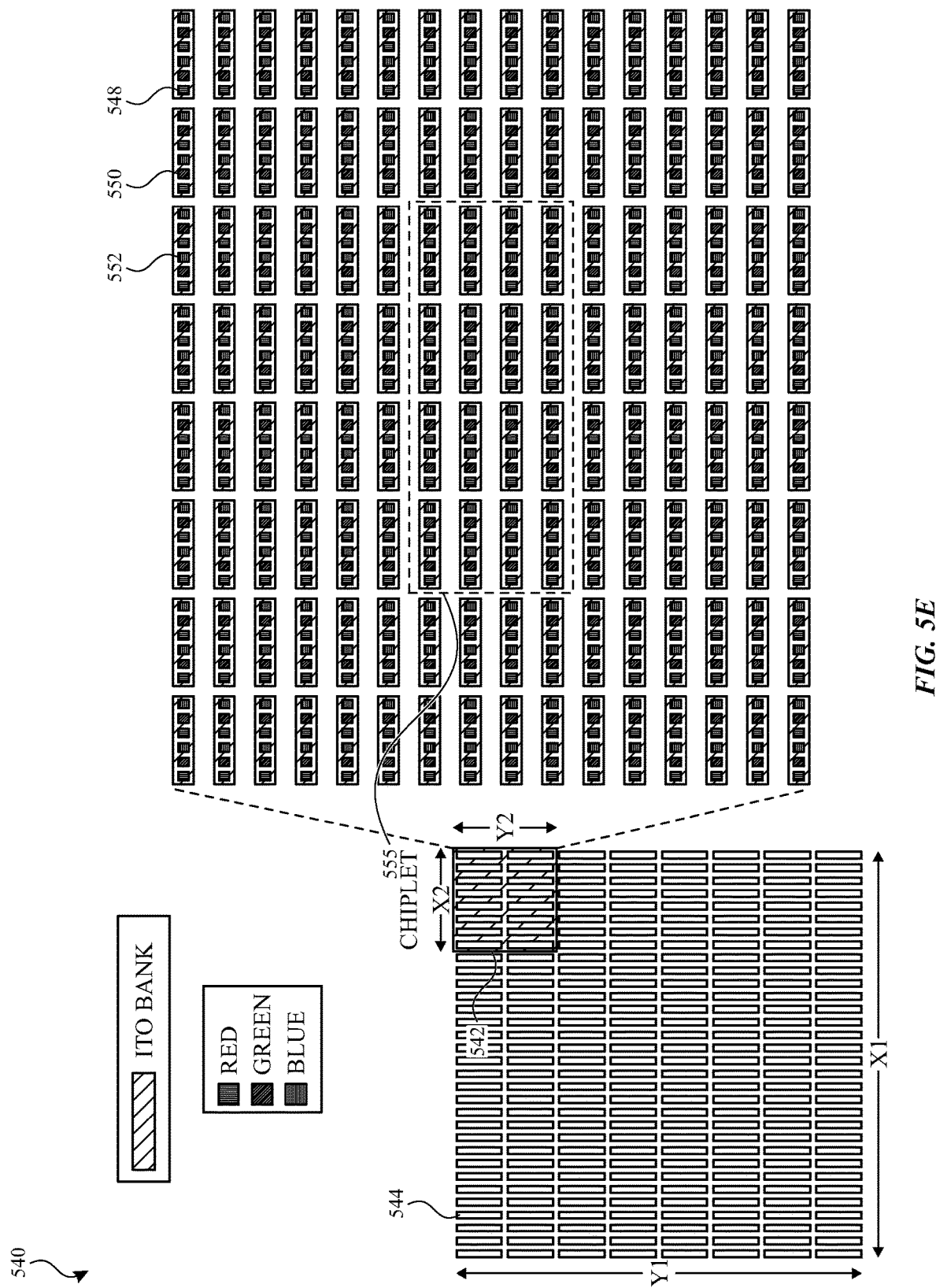
FIG. 5E illustrates a portion of an example conductive layer, corresponding display pixels, and corresponding circuitry of a portion of an example touch and display circuit layer according to examples of the disclosure.

In some examples, as described herein, the functionality of the display chiplets 514 and touch chiplets 516 can be integrated into an integrated chiplet, optionally disposed outside of the active area of the display (e.g., as described with reference to FIG. 3B). FIG. 5E illustrates a portion of an example conductive layer, corresponding display pixels, and corresponding circuitry of a portion of an example touch and display circuit layer according to examples of the disclosure. Integrated touch screen 540 can include a conductive layer (e.g., corresponding to conductive layer 306), a portion of which is shown in FIG. 5E. The portion of the conductive layer can define a region having an area X1 by Y1 (e.g., 5 mm×5 mm) including 16 touch node electrodes 553. Each touch node electrode 553 can be formed from 16 ITO groups 554 (2 rows; 8 columns) and can define an area X2 by Y2 smaller than X1 by Y1 (e.g., 1.25 mm×1.25 mm). In some examples, as described herein, touch can be measured using sensing circuitry of the chiplets for some or all of the smaller regions (first regions) with the area X2 by Y2. In some examples, as described herein, the touch image used for determining touch input from the user to the integrated touch screen can combine these touch measurements for some or all of the smaller regions (first regions) into a touch image with a lower resolution corresponding to the larger regions (second regions) of the area X1 by Y1. In some examples, as described herein, the ambient light image used for determining ambient light incident on the touch screen can combine ambient light measurements for some or all of the smaller regions (first regions) into an ambient light image with a lower resolution corresponding to the larger regions (second regions) of the area X1 by Y1.

Figure 5F:
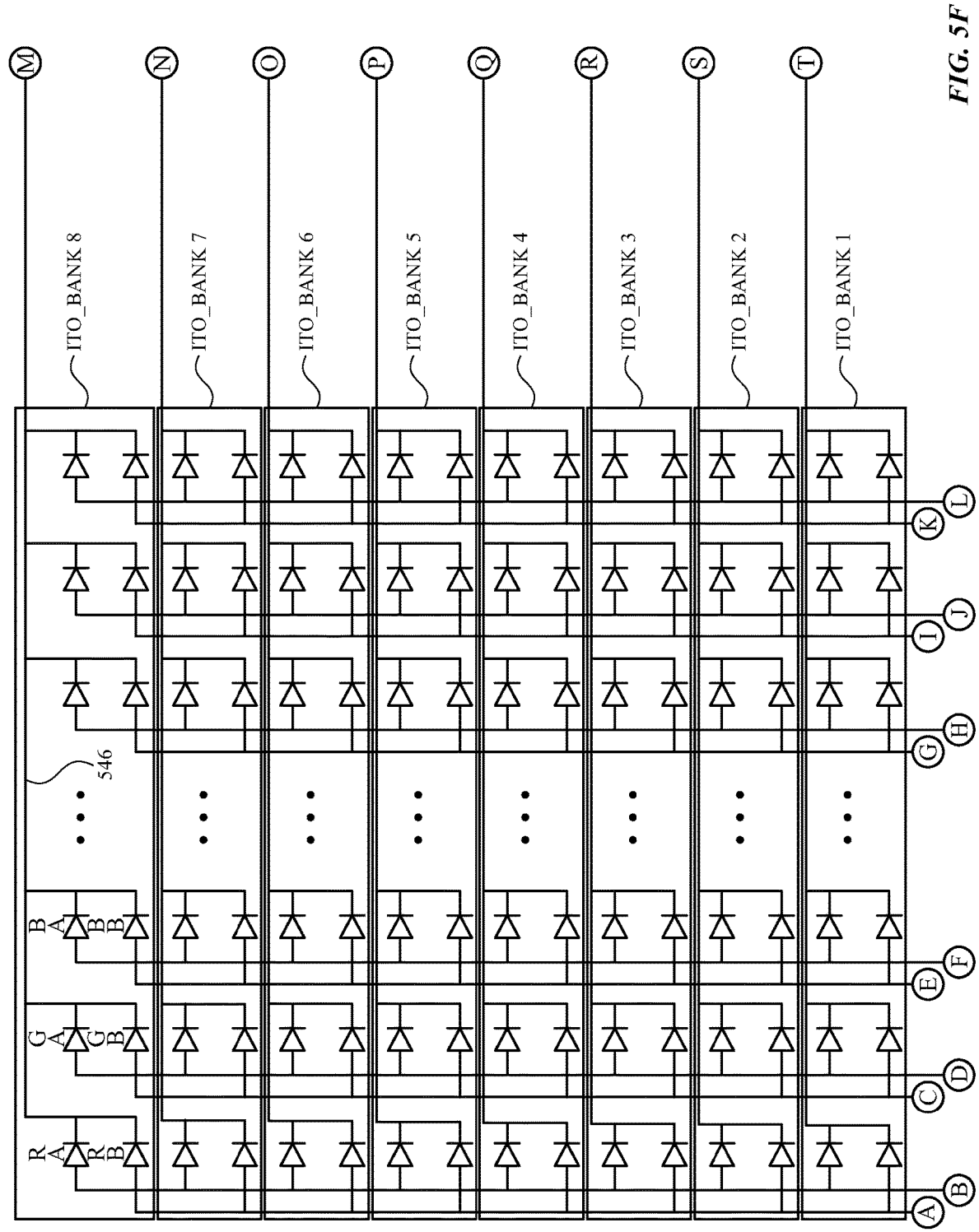
FIG. 5F illustrates an example ITO group and corresponding chiplet according to examples of the disclosure.
Figure 5F:
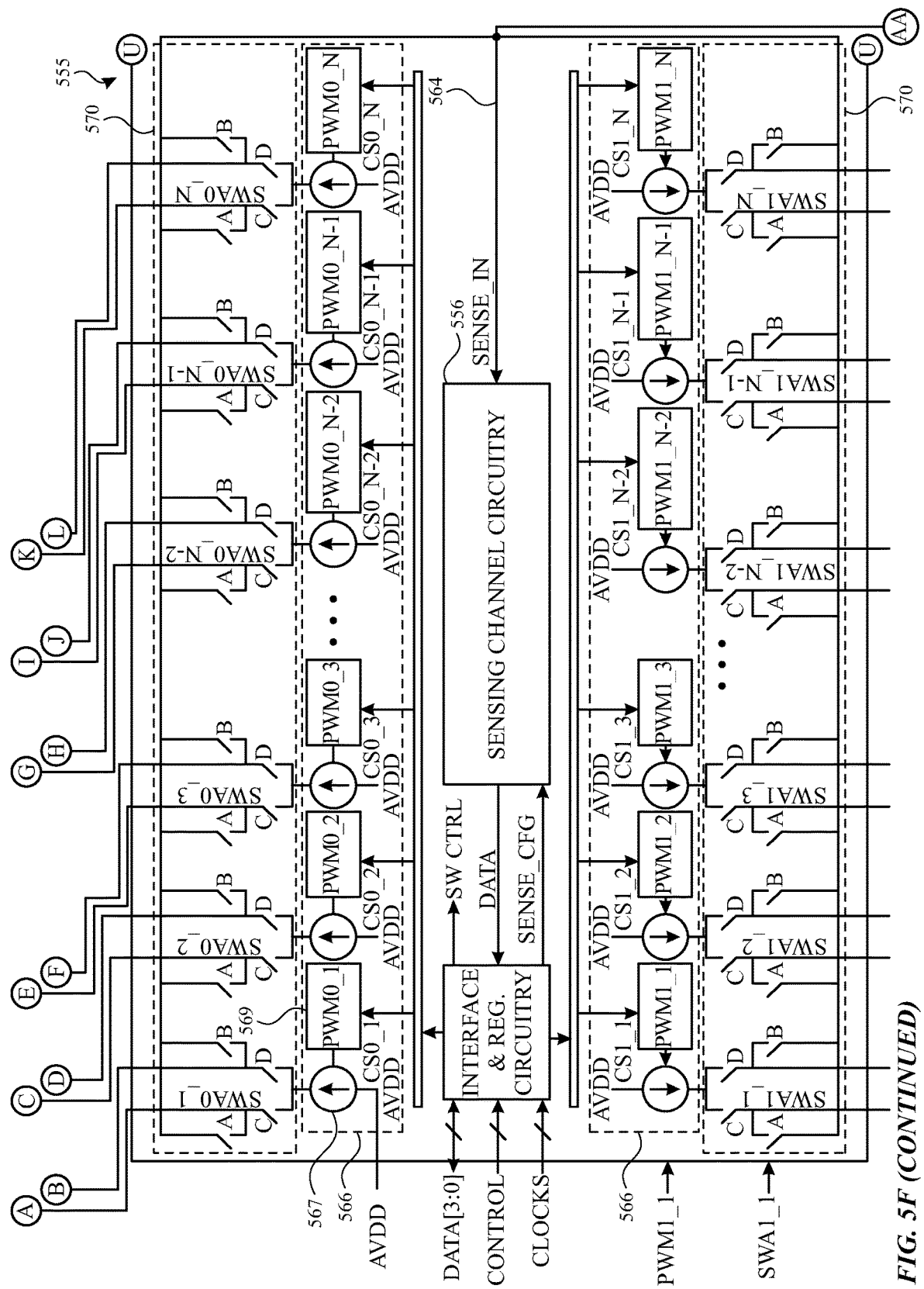
Figure 5F:
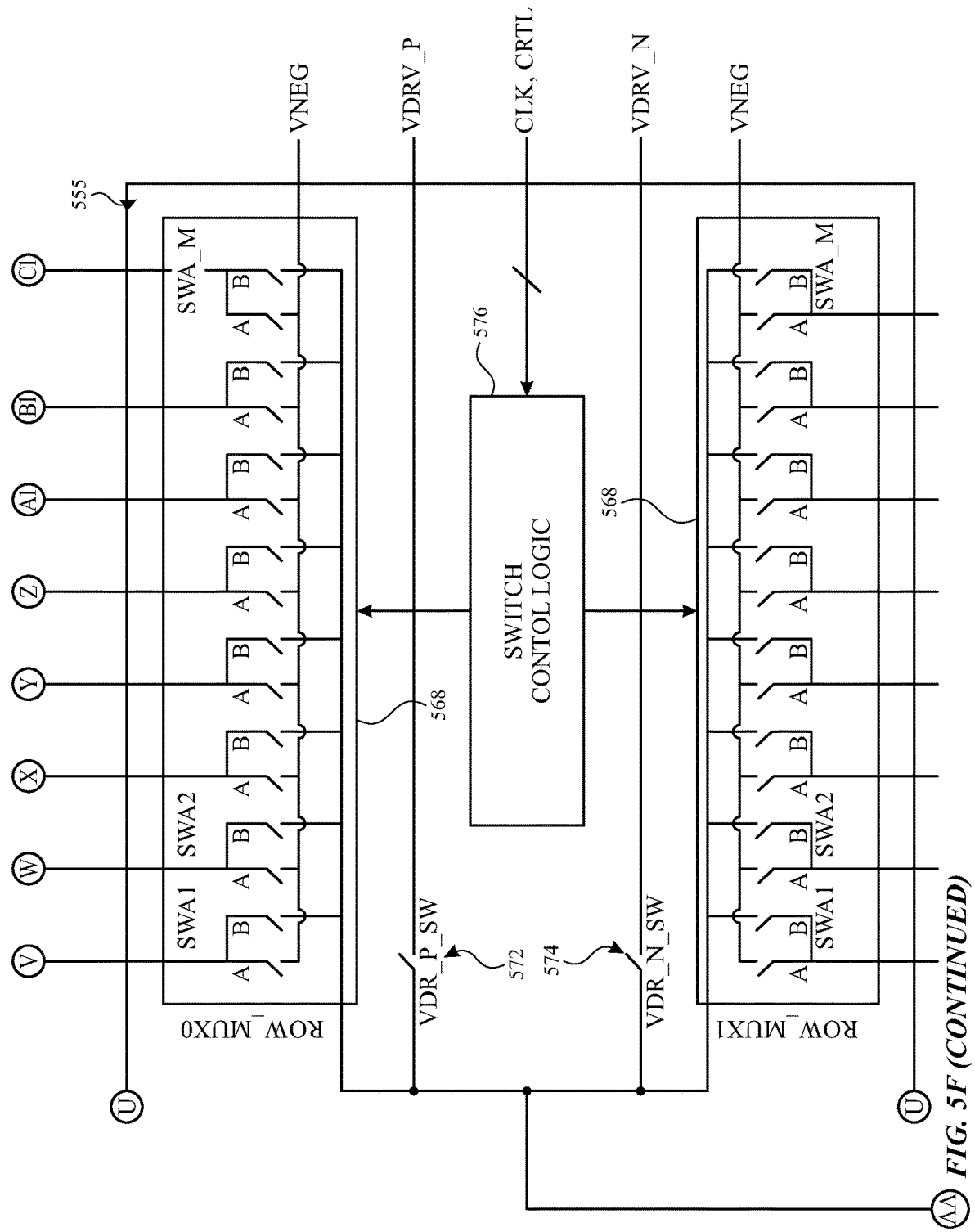

FIG. 5E also illustrates an expanded view of touch node electrode 553 showing the component ITO banks 546 of the ITO groups 554, display pixels, and touch and display circuitry (e.g., corresponding to components of touch and display circuit layer 311). The display pixels can include micro-LEDs 548, 550, 552. The touch and display circuitry can include chiplet 555, shown in dashed lines in FIG. 5E indicative of the position of chiplet 555 on a layer below the display pixels. Touch node electrode 553 of FIG. 5E includes 128 ITO banks 546 (i.e., 8 ITO banks 546 per ITO group 554), and each of the ITO banks can be coupled to chiplet 555 (or multiple chiplets if redundancy is used). During display operation, the display circuitry of chiplet 555 can update the micro-LEDs in the corresponding ITO group. As illustrated in FIG. 5E, each ITO bank can serve as a cathode for two display pixels (e.g., each including red, green and blue sub-pixels). The cathodes of both sets of pixels can be coupled to the same ITO bank. The cathodes of both sets of pixels can be coupled to the same ITO bank. In some examples, each ITO bank can serve as the cathode for more or fewer display pixels. In some examples (e.g., as illustrated in FIG. 5F), each ITO bank can include duplicate display pixels (redundant pixels). Anodes of the pixels can be coupled to chiplet 555 to driven by drive circuitry. During touch operation, ITO banks 546 can be coupled to chiplet 555 (or multiple chiplets when redundancy is used) and coupled together to form touch node electrode 553.

FIG. 5F illustrates an example ITO group and corresponding chiplet according to examples of the disclosure. Chiplet 555 can include display circuitry, sensing circuitry (also referred to herein as a sense channel or sensing channel circuitry), switching circuitry, and control circuitry. The display circuitry can include display micro-drivers 566. Each of the micro-drivers can include a current source 567 and optionally a pulse width modulation (PWM) circuit 569 to modulate the current source. Although PWM circuit 569 is shown, it is understood that current source 567 can be adjusted with other modulation schemes or without modulation. The sensing circuitry can include sensing channel circuitry 556 configured to be coupled to the ITO banks for sensing operations. The switching circuitry can include switches (e.g., multiplexers, discrete switches, etc.) to enable display and sensing configurations described herein. For example, the switches can include ITO switches 568 (cathode switches), anode switches 570, and stimulation voltage switches 572 and 574 (e.g., for coupling touch node electrodes to positive or negative phase stimulation signals for touch sensing operations). The control circuitry can include interface and register circuitry providing input and output functionality for chiplet 555 for communication with touch and display controller 212 and/or host processor 220 and for storing configuration information for the chiplet (e.g., configurations for the sense channel circuitry 556). The control circuitry can also include switch control logic circuitry 576 configured to operate the switching circuitry for display and sensing operations.

Chiplet 555 can be coupled to one or more red, green, and blue LED/OLED devices 548, 550, 552. As illustrated in FIGS. 5E-5F, chiplet 555 can be coupled to 16 row array of pixels (with only 8 rows of the array shown coupled to one side of chiplet 555 in FIG. 5F for ease of illustration), with each row of the array corresponding to an ITO bank 546. The ITO bank 546 can serve as a cathode node when selected by ITO switches 568, for example. The cathode node(s) can be connected to a voltage, Vneg, during display operations (while the cathode node(s) can be decoupled from the sense channel circuitry 556 and the sense_in line 564 open during display operation). Display micro-drivers 566 can include one current driver 567 for each sub-pixel element. The anode of each sub-pixel of a column can be coupled to a respective current driver in display micro-drivers 566 using anode switches 570 during driving operations. Thus, during display operations, selecting one of the ITO banks 546 using switches of ITO switches 568 and adjusting and providing the operating current of respective current drivers in display micro-drivers 566 using anode switches 570 can address the illumination adjustment for each pixel controlled by chiplet 555. In some examples, refresh and/or timing signals can be provided by the touch and display controller to address each LED device individually, to enable asynchronous or adaptively synchronous display updates. In some examples, display brightness can be adjusted by manipulation of reference voltages supplied to the display micro-drivers (e.g., using PWMs 569).

As described above, during display operations, switches of ITO switches 568 can select a respective bank coupled to the cathode node/Vneg (e.g., closing the switch of the selected bank labeled A corresponding to cathode switches 568, opening the remaining switches labeled A corresponding to cathode switches 568, and opening all the switches labeled B corresponding to cathode switches 568 in FIG. 5F). During touch operations by an integrated touch screen, ITO switches 568 can instead couple together each of the ITO banks 546 in ITO group 554 (e.g., closing all of the switches labeled B corresponding to cathode switches 568 and opening all of the switches labeled A), and couple ITO group 554 to the sensing channel circuitry 556 in a sensing configuration. Additionally, anode switches 570 can be used to short the anode and cathode of the LED devices to avoid any noise from the LEDs (e.g., leakage current or photo-currents) interfering with touch sensing (e.g., closing switches labeled A and/or B and opening switches C and D corresponding to anode switches 570 in FIG. 5F). During ambient light and/or optical sensing operations, anode switches 570 can be opened.

FIG. 5G illustrates example switching configurations for chiplet during touch and display operations according to examples of the disclosure. The table of FIG. 5G shows the configuration of anode and cathode switches for the chiplet illustrated in FIG. 5F. For example, anode switches labeled A, B, C, and D can correspond to anode switches 570 of chiplet 555 shown in FIG. 5F. Similarly, cathode switches labeled A and B can correspond to cathode switches 568 of chiplet 555 shown in FIG. 5F. During display operations, anode switches labeled A and B can be configured in an open position and switches labeled C and/or D (either the main or the redundant set of LEDs or both) can be configured in a closed position, causing the respective current drivers in display micro-drivers 566 to drive the anodes of the micro-LEDs. Cathode switches labeled A and B can be configured as described above for display operations, whereby to update the micro-LEDs of a corresponding ITO group, the ITO group/cathode of micro-LEDs is coupled to Vneg by closing the corresponding cathode switch labeled A, while the remaining cathode switches labeled A and the cathode switches labeled B are all opened. Thus, the display update is applied to the micro-LEDs of the corresponding ITO group while the current drivers are configured to generate and apply the appropriate currents for the micro-LEDs whose cathode is coupled to Vneg. To update the micro-LEDs for each ITO group, the cathode switches can switch to couple one of the ITO banks to Vneg while the current drivers are configured to generate the appropriate currents for the micro-LEDS whose cathode is coupled to Vneg. During touch operations, anode switches labeled A and B can be closed and anode switches labeled C and D can be opened, while cathode switches labeled A are opened and cathode switches labeled B are closed. Such a switching configuration can connect (e.g., short) the anode and cathode terminals of the micro-LEDs in the corresponding ITO group together. The configuration of anode switches and cathode switches for optical sensing is described with reference to FIG. 9B.

FIG. 6A illustrates example circuitry for an example sensing channel (sensing circuitry) of a chiplet according to examples of the disclosure. A touch node electrode (e.g., touch node electrode 236, 502) can have an inherent self-capacitance to ground associated with it, and also an additional self-capacitance to ground that is formed when an object 238, such as finger, is in proximity to or touching the electrode. Referring back to FIG. 2B, the total self-capacitance to ground of touch node electrode 236 can be illustrated as capacitance 242. Chiplet 600 can include a capacitance sensing circuit (capacitive circuit) including an operational amplifier 602 (sense amplifier) and a feedback network including a feedback capacitor 603 (e.g., corresponding to the touch circuitry of touch chiplet 210 or of chiplet 207). It should be understood that other capacitance sensing circuit configurations may be employed, such as those including a feedback resistor or switched capacitor resistor as well as a feedback capacitor (e.g., as shown in FIG. 6B). A touch node electrode to be sensed can be coupled to the inverting input (−) of operational amplifier 602. For self-capacitance sensing, an AC voltage source and DC biasing (not shown) can be coupled to the non-inverting input (+) of operational amplifier 602 (at Vref). The capacitance sensing circuit can be configured to sense changes in the total self-capacitance of the touch node electrode induced by a finger or object either touching or in proximity to the touch sensitive surface opposite the touch node electrode to be sensed. Output of operation amplifier 602 can be demodulated by mixer 604, which can receive a demodulation signal matching the AC voltage source applied to the non-inverting input of operational amplifier 602. The demodulated output can be converted to a digital signal by ADC 606. The digital signal output by ADC 606 can be filtered by one or more filters optionally including cascaded integrator-comb filter, finite input response filter, or other filters. In some examples, an anti-aliasing filter (or other digital filters described above) can be implemented as filters earlier in the signal chain and in the analog domain (e.g., prior to analog-to-digital conversion such as between mixer 604 and ADC 606). The filtered digital data can be output using data buffer 610 and sent to the touch and display controller for touch processing (e.g., by one or more touch processors, discrete logic network, hardware accelerator, etc.) to determine the presence of a proximity or touch event. Although described above for self-capacitance sensing, it should be understood that the sensing channel of chiplet 600 can be used for mutual capacitance sensing (as described in more detail with respect to FIGS. 8A-8F).

In some examples, as described herein, the sensing channel of the chiplets can be used for optical sensing operations to enable localized optical touch and/or ambient light sensing. In some examples, localized ambient light information can be used for optical touch sensing to detect touch on the surface based on occlusion of the optical sensing sensors by objects such as fingers above or on the surface. In some examples, localized ambient light information can be used to avoid an instance where the ambient light sensor is occluded by an object (e.g., a finger, sleeve, hand, etc.) so as to prevent an accurate measurement of ambient light. Such inaccurate measurements can result in undesirable behavior such as changing the brightness of the screen based on an indication of low ambient light levels due to a finger over the sensor when in fact the true ambient light levels are higher. Localized optical sensing can provide a similar benefit where an ambient light sensor may be exposed to localized light source (e.g., a laser, etc.) that provides an indication of ambient light level above the true ambient light level in the environment. In some examples, localized ambient light measurements can provide a more accurate understanding of the lighting in the environment and/or can use statistics from multiple measurements to avoid outliers and/or to provide redundancy (e.g., in case an ambient light sensor is damaged or otherwise malfunctioning). In some examples, localized optical sensing can allow the display to calibrate brightness of display pixels on a localized level for more uniform display performance across the integrated touch screen (e.g., such that a display partially exposed to sun and partially in the shade can have different brightness levels for a more uniform viewing experience of images/videos).

FIG. 6B illustrates an additional example sensing channel (sensing circuitry) for an example chiplet according to examples of the disclosure. Chiplet 620 can include a capacitance sensing circuit including an operational amplifier 622 and feedback network (e.g., a transimpedance amplifier converting measured current to an output voltage), mixer 624, ADC 626 and data buffer 630 (e.g., corresponding to operational amplifier 602, mixer 604, ADC 606 and data buffer 610). The feedback network shown in FIG. 6B includes feedback capacitor 603 as well as a feedback resistor 605. In some examples, operational amplifier 622 can include an input resistor as well (not shown). Chiplet 620 can also include one or more digital filters 628 (e.g., corresponding to digital filters 608 or other filters described with reference to FIG. 6A) after ADC 626 (or before ADC 626 for analog filters). The operation of these components can be the same as or similar to described above for touch sensing with chiplet 600.

As shown in FIG. 6B, ADC 626 and/or mixer 624 can be differential circuits (unlike ADC 606 and mixer 624 of FIG. 6A), whereas operational amplifiers 602 and 622 have single-ended outputs. In some examples, chiplet 620 can further include a single-ended-to-double ended amplifier stage 623 between the single-ended output of amplifier 622 and the differential mixer 624.

Figure 7A:
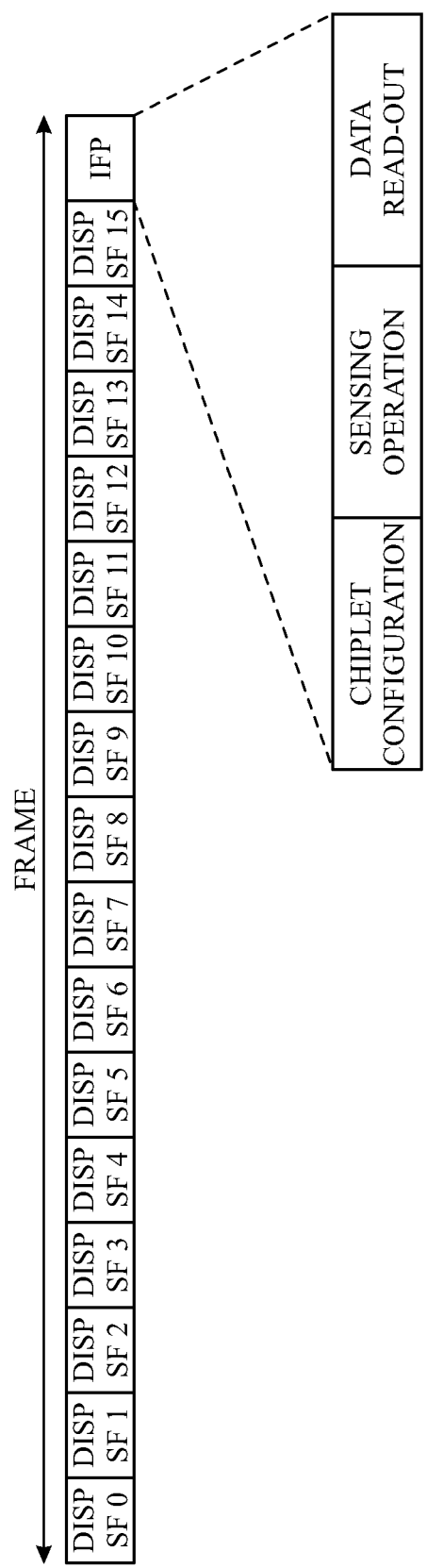
FIGS. 7A-7B illustrate example timing diagrams for sensing and display operations according to examples of the disclosure.
Figure 7B:
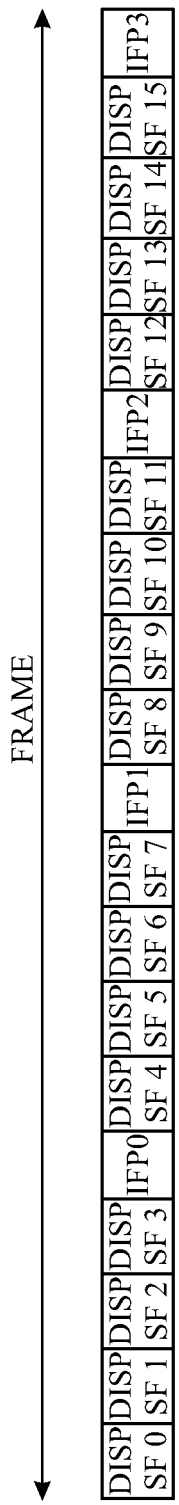

As discussed herein, sharing circuitry (e.g., ITO banks, data lines) between sensing operations (e.g., touch sensing and/or optical sensing) and display functionality can require time-multiplexing sensing and display operations. FIGS. 7A and 7B illustrate example timing diagrams for sensing and display operations according to examples of the disclosure. It should be understood that these timing diagrams are exemplary and different timing can be employed. FIG. 7A illustrates a timing diagram for one operating frame (e.g., a 60 Hz frame). The frame can include 16 display sub-frames (display sub-frames 0-15) during which time the display operations by display circuitry can occur (e.g., display refresh/update of the LEDs by the display circuitry of the chiplets) and one inter-frame pause (IFP) for a sensing sub-frame (e.g., for touch sensing and/or optical sensing). In some examples, during the IFP the chiplet can be configured for sensing operations, the sensing operation(s) can be performed by the chiplet and/or the sensing data can be read out from the chiplet. In some examples, the configuration, performance and/or data readout can occur in a different order.

For sensing operations during a sub-frame, for example, the touch node electrodes can be formed and sensed in a touch operation and/or some or all of the LEDs of the touch nodes can be used to measure ambient light (and/or optical touch) in an optical sensing operation. When both touch and optical sensing operations are performed concurrently in the one designated sub-frame, some touch node electrodes can be used to sense touch with chiplets configured for touch sensing and some touch node electrodes can be used for optical sensing with chiplets configured for optical sensing. In some examples, the touch and optical sensing operations can be performed at different times (e.g., using time multiplexing within the one designated sub-frame (or across multiple sub-frames when more sensing sub-frames are provided). The sensing data (e.g., touch data or ambient light data) can be subsequently read out from the chiplets (e.g., using data buffers 610, 630 of chiplets 600, 620) after the sensing operation(s) and optionally before the end of the frame.

The display operations for the panel can be divided into 16 parts (e.g., updating 1/16 of the display pixels each display sub-frame). For example, during each display sub-frame, one of the pixels in the 8 row and 2 column array of 16 pixels coupled to display circuitry of a chiplet or a display chiplet (e.g., as illustrated in FIGS. 5B, 5C, 5F) can be updated for each chiplet. In some examples, during each display sub-frame 1/16 of the rows of pixels of the touch screen can be updated or 1/16 of the number of pixels of the touch screen in some other configuration can be updated, such that each pixel in the touch screen can be updated in the 16 display sub-frames of the frame. Additionally, in some examples, touch sensing and/or optical sensing by the chiplets can acquire data forming a touch image and/or optical sensing image (e.g., optical touch image or ambient light image) for the touch screen each 60 Hz frame.

Time-multiplexing sensing and display functionality can be beneficial to avoid interference between sensing and display operations. In particular, transients due to micro-driver currents used to drive pixels in close proximity to touch node electrodes and touch sensing circuitry of the chiplets can introduce noise into touch measurements (or optical sensing measurements) that can reduce sensing performance if display and sensing operations occurred concurrently. To further reduce noise, the input-output lines of the integrated touch screen may be further isolated from the system during touch sensing operations. For example, referring back to FIG. 2B, during the touch operations the integrated touch and display module ground can be modulated by a guard signal from the guard IC (e.g., for self-capacitance touch sensing). However, during display operations (and optionally during touch data read-out), the integrated touch and display module ground can be at the chassis ground.

FIG. 7B illustrates a timing diagram for one operating frame (e.g., a 60 Hz frame). The frame can include 16 display sub-frames (display sub-frames 0-15) during which time the display operations by display circuitry can occur (e.g., display refresh/update by the chiplets). However, the display operations can be broken up into groups of four display sub-frames and touch operations or other sensing operations (e.g., optical sensing) can occur during inter-frame or intra-frame pauses (IFPs). During some or all of the IFPs the chiplet can be configured for sensing operations, the sensing operation(s) can be performed by the chiplet and/or the sensing data can be read out from the chiplet. In some examples, the configuration, performance and/or data read-out can occur in a different order. The sensing operations can include a mutual capacitance scan, a self-capacitance scan, a stylus scan, touch spectral analysis scan, a stylus spectral analysis scan, and an optical sensing scan, among other possible sensing operations. In some examples, multiple sensing operations can be performed in parallel. For example, as described herein touch and optical sensing operations can be performed in parallel (e.g., across multiple chiplets). In some examples, spectral analysis for a clean stylus frequency can be performed during a touch sensing operation and/or a spectral analysis for a clean touch frequency can be performed during a stylus sensing operation. In some examples, in IFP0 the sensing operation can be a spectral analysis scan to determine a clean operating frequency to use for a mutual or self-capacitance scan performed during IFP1. In a similar manner, in IFP2 the sensing operation can be a spectral analysis scan to determine a clean operating frequency to use for a mutual or self-capacitance scan performed during IFP3. In some examples, the chiplets can idle during portions of the IFP in which the chiplet is not being configured, performing a sensing operation, or performing a data read out.

The display operations can be performed before or after each IFP. For example, display operations can be performed during display sub-frames 0-3 before the first IFP, during display sub-frames 4-7 after the first IFP and before the second IFP, during display sub-frames 8-11 after the second IFP and before the third IFP and during display sub-frames 12-15 before the fourth IFP. Touch data from the touch operations and optical sensing data from optical sensing operations can be read out during the display operations using separate data lines (e.g., data lines used for touch/optical sensing operations, not display operations). In some examples, shared data lines for touch and display can be used and the touch data and/or optical sensing data read out can occur during an IFP when the display is not updating. The configuration of the chiplets and touch and/or optical sensing operations by the chiplets can occur according to instructions from the touch and display controller 212 (e.g., from a scan plan stored therein). Touch and display controller 212 can also provide the data, control and timing signals for time-multiplexing the sensing and display operations, configuration of the chiplets, and for receiving the touch data and/or optical sensing data from the chiplets.

As discussed herein, chiplets can be configured to sense touch node electrodes according to various touch detection scans. FIGS. 8A-8F illustrate an example sensing channel (sensing circuitry) of a chiplet and various configurations according to examples of the disclosure. Chiplet 800 of FIG. 8A can include analog and/or digital circuitry including an operational amplifier 802 and feedback network, mixer 804, ADC 806, digital filter(s) 808 and data buffer 810 corresponding to operational amplifier 602, mixer 604, ADC 606, digital filter(s) 608, and data buffer 610. Chiplet 800 can optionally include a level shifter 805 to alter the reference point of mixer 804 (e.g., when mixer 604 804 is referenced to ground, which itself is modulated by VSTIM). The operation of these components can be the same as described above for touch sensing with chiplet 600 when in a sense configuration. Although FIGS. 8A-8F use the analog circuitry of chiplet 600, it should be understood that similar configurations are possible using the analog circuitry of chiplet 620. Chiplet 800 can include pins including pin 812 coupled to the touch node electrode (e.g., via sense line 524), pin 814 for a low voltage reference or ground, pin 816 for a stimulation signal and/or demodulation signal, pin 818 for a high voltage reference ($V_{high}$), and pin 820 for outputting data (e.g., touch data or optical sensing data). Additionally, chiplet 800 can include configuration switches 822, 824, 826, 828 to configure chiplet 800 for various touch sensing operations.

Figure 8A:
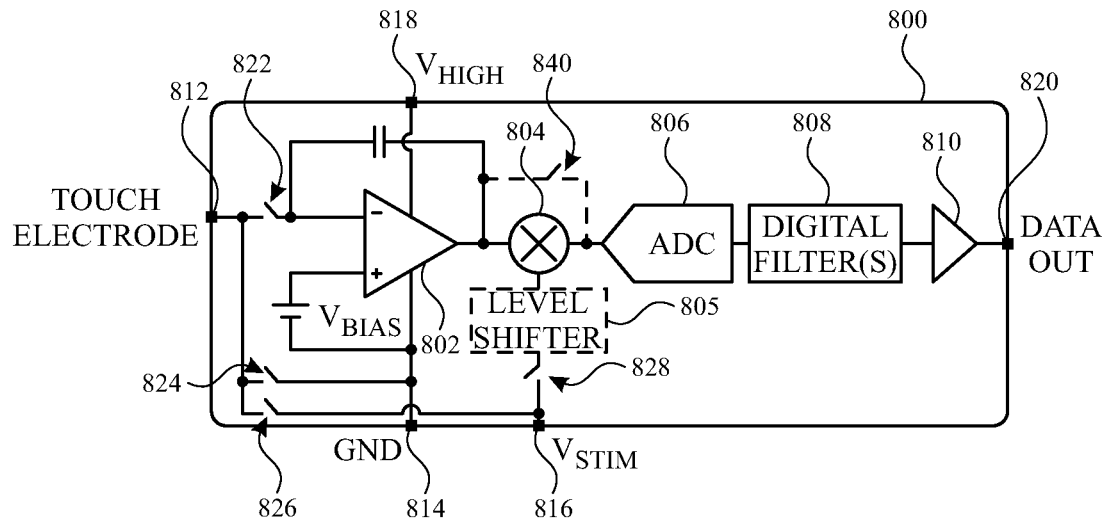
FIGS. 8A-8F illustrate an example sensing channel of a chiplet and various configurations according to examples of the disclosure.
Figure 8B:
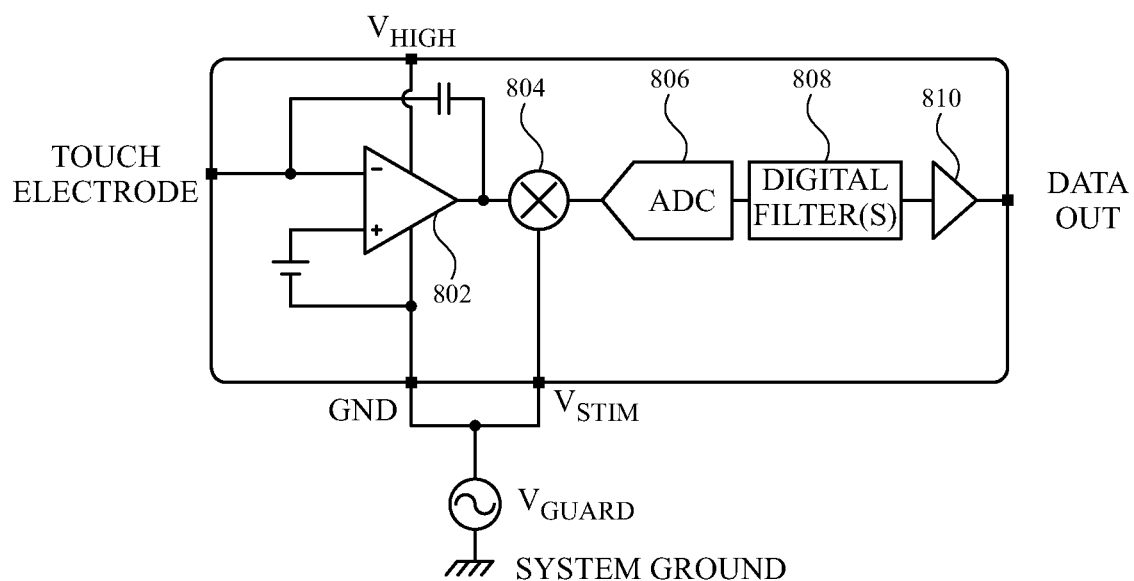

FIG. 8B illustrates a sensing channel of chiplet 800 in a guarded self-capacitance touch sensing configuration. In such a configuration, configuration switches 822 and 828 can be closed and configuration switches 824 and 826 can be opened. As described above (e.g., with respect to FIGS. 2B and 6A), in a guarded self-capacitance touch sensing configuration, chiplet 800 can operate in a guarded domain with ground and $V_{high}$ provided with reference to a guard signal. The AC component of the guard signal coupled to the non-inverting terminal of operational amplifier 802 can be used to stimulate a touch node electrode coupled to chiplet 800, and can be used as the demodulation signal supplied to mixer 804 to demodulate the output of operational amplifier 802 sensing the touch node electrode coupled to the inverting terminal of operational amplifier 802. In some examples, each touch node electrode in an integrated touch screen can be driven and sensed by a corresponding one of the chiplets configured for guarded self-capacitance scans. The integration of chiplets into the touch screen can enable simultaneous stimulation and sensing of each touch node electrode (or groups of touch node electrodes), which can reduce scan time for the touch screen (e.g., because the entire touch screen can be scanned in parallel in one scan period or relatively fewer scan periods, rather than in serial scans of portions of the touch screen in multiple scan periods) and can enable the use of common mode noise cancellation algorithms. Integrating the chiplets into the touch screen can provide for a large number of sense channels, without the hardware penalties of doing so in one or more touch sensing chips not integrated into the touch screen stack-up. In particular, the chiplets can implement the sense channels in empty areas of the touch screen (e.g., area of substrate 310 not occupied by micro-LEDs) or behind the touch screen distributed across the touch screen rather than occupying area in one or more touch sensing chips outside of the touch screen. Additionally, as described herein, the sensitive routing between touch node electrodes and sense channels can be localized (between the touch node electrode and the corresponding chiplet) rather than globally routing the touch node electrodes to one or more touch sensing chips outside of the touch screen stack-up or otherwise more distance from the touch node electrodes.

Mutual capacitance scans can also be performed using groups of touch node electrodes. For example, FIG. 8F illustrates a group of four touch node electrodes 830, 832, 834, 836 coupled to the sensing channel of chiplets configured to drive (D), sense (S) or ground (G) a corresponding touch node electrode. In the configuration of FIG. 8F, a mutual capacitance 838 (or change in mutual capacitance) between touch node electrodes 830 and 832 can be measured. In particular, touch node electrode 830 can be stimulated by a stimulation signal (e.g., an AC voltage signal) supplied by a chiplet in a drive configuration. The stimulation signal can be capacitively coupled to touch node electrode 832 through mutual capacitance 838 between touch node electrode 830 and touch node electrode 832. When a finger or object approaches a touch node created by the proximity of touch node electrodes 830 and 832, mutual capacitance 838 can be altered. This change in mutual capacitance 838 can be detected to indicate a touch or proximity event at the touch node corresponding to the group of touch nodes 830, 832, 834, 836. The change in mutual capacitance can be measured by a chiplet in the sensing configuration coupled to touch node electrode 832. The pattern of D, S and G configurations for four touch node electrodes in FIG. 8F can be applied to groups of four touch nodes across the touch screen.

It should be understood that the pattern of D, S and G configurations presented in FIG. 8F is for illustration purposes only, and that other patterns can be used to measure mutual capacitance between various touch node electrodes in an integrated touch screen.

Figure 8C:
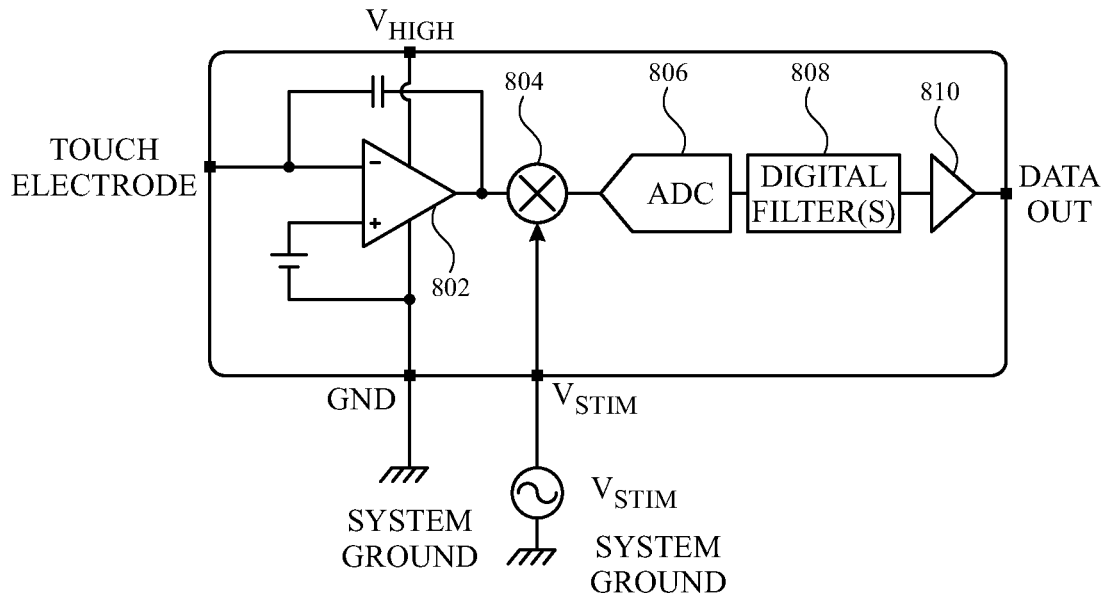

FIG. 8C illustrates a sensing channel of chiplet 800 in a mutual capacitance touch sensing configuration and can correspond to the configuration of the sensing channel of a chiplet coupled to touch node electrode 832 in the sense configuration. In such a configuration, configuration switches 822 and 828 can be closed and configuration switches 824 and 826 can be opened. Unlike in FIG. 8B, in a mutual capacitance touch sensing configuration, chiplet 800 can operate in a chassis ground domain with a chassis ground and $V_{high}$ provided with reference to the chassis ground. A demodulation signal supplied to mixer 804 can be used to demodulate the output of operational amplifier 802 sensing the touch node electrode (e.g., touch node electrode 832) coupled to the inverting terminal of operational amplifier 802. The demodulation signal can be the same signal as used to stimulate a second touch node electrode (e.g., touch node electrode 830).

Figure 8D:
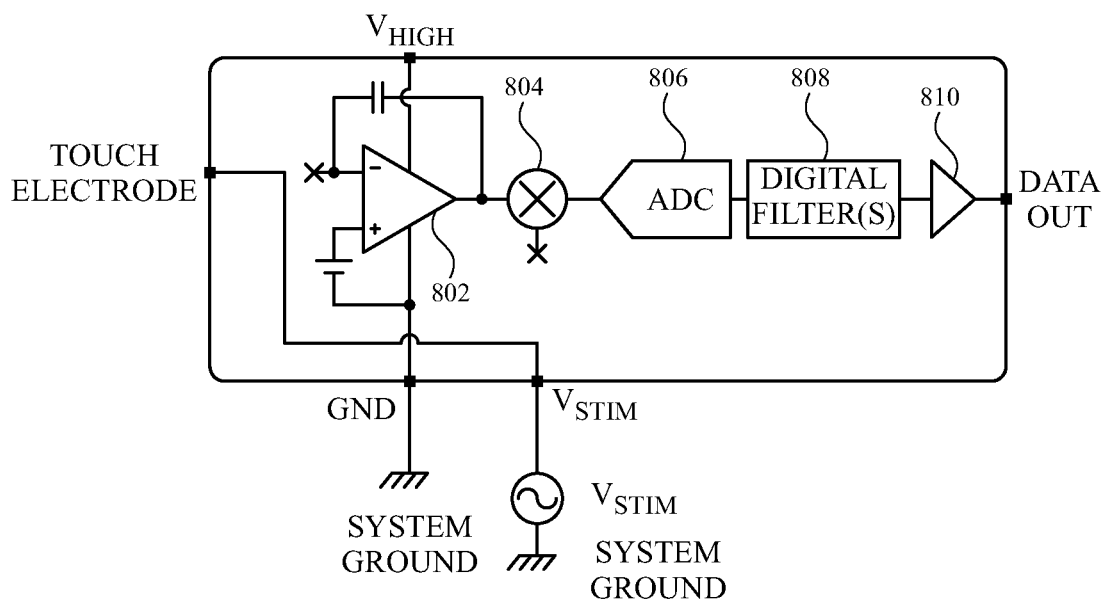

FIG. 8D illustrates a sensing channel of a chiplet 800 in a mutual capacitance drive configuration and can correspond to the configuration of the sensing channel of the chiplet coupled to touch node electrode 830 in the drive configuration. In such a configuration, configuration switches 824 can be closed and configuration switches 822, 826 and 828 can be opened. The stimulation signal can be supplied from the Vstim pin and routed via configuration switch 824 to the driven touch node electrode (e.g., touch node electrode 830). In some examples, some or all of the sense channel (e.g., amplifier 802, mixer, 804, ADC 806, AAF 808 and/or data buffer 810) can be powered down when in the drive configuration.

Figure 8E:
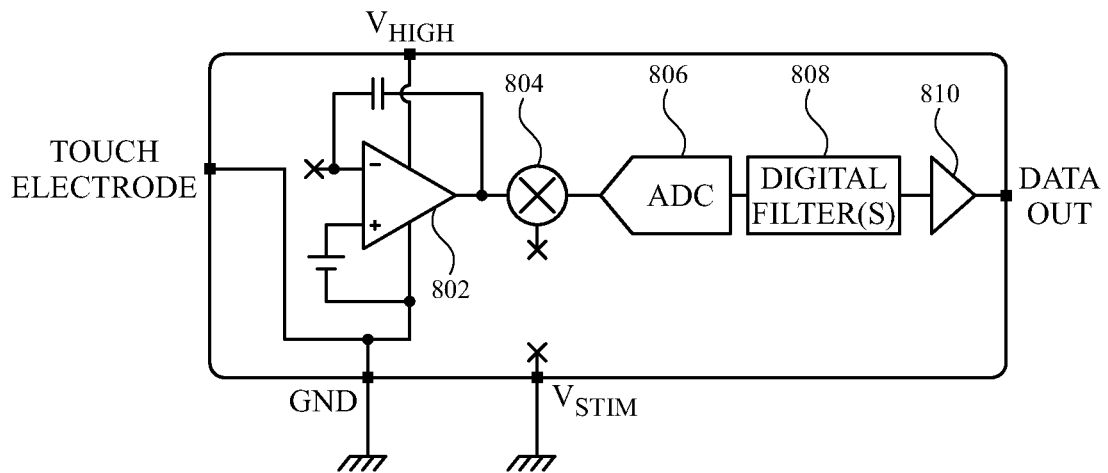
Figure 8F:
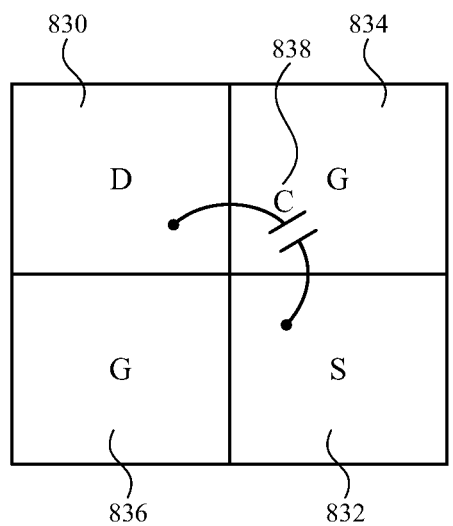

FIG. 8E illustrates a sensing channel of chiplet 800 in a mutual capacitance ground configuration and can correspond to the configuration of the sensing channel of the chiplets coupled to touch node electrodes 834 and 836 in the ground configuration. In such a configuration, configuration switches 826 can be closed and configuration switches 822, 824 and 828 can be opened. The ground signal can be supplied from the ground pin and routed via configuration switch 826 to the touch node electrode to be grounded (e.g., touch node electrodes 834 and 836). In some examples, some or all of the sense channel (e.g., amplifier 802, mixer, 804, ADC 806, AAF 808 and/or data buffer 810) can be powered down when in the ground configuration.

The sensing channel of chiplets can be configured into various sensing modes as described above with respect to FIGS. 8A-8F by programming logic registers within the chiplets (e.g., using interface and register circuitry of FIG. 5F). In some examples, the logic registers can be volatile memory. In some examples, non-volatile memory within the chiplet can be used to store the configuration of the chiplet and the non-volatile memory can be programmed with the proper configuration. The data in the registers or non-volatile memory can be used, for example, to configure the switches 822, 824, 826 and 828 for the corresponding touch sensing operation.

Additionally, registers within the chiplets can be programmed to indicate whether a chiplet is a "main" or "redundant" chiplet. Referring back to FIGS. 5A and 5C, for example, an integrated touch screen can include two touch chiplets for each touch node electrode. One touch chiplet can be configured as a "main" touch chiplet and a second can be configured as a "spare" or "redundant" touch chiplet. The configuration of a touch chiplet as "main" or "redundant" can include determining a functional state of the touch chiplets. In some examples, each touch chiplet of the integrated touch screen can be determined to be a functional chiplet or a non-functional chiplet at an initial calibration stage (e.g., factory testing). One of the functional touch chiplets for a touch node electrode can be identified as the "main" chiplet (main state) and the second touch chiplet (either functional or non-functional) can be identified as the "redundant" chiplet (redundant state). The main or redundant state of each touch chiplet for the integrated touch screen can, in some examples, be stored (e.g., in a memory in a touch and display controller) and a factory programming can be used to program each touch chiplet in the appropriate state as "main" or "redundant." In some examples, the functional state of touch chiplets can be re-determined at a recalibration stage (e.g., at a time of repair). The re-determined identification of functional or non-functional touch chiplets can be updated and stored for programming the touch chiplets as "main" or "redundant." In some examples, the functionality of touch chiplets (e.g., all touch chiplets or only "main" touch chiplets) can be monitored dynamically during operation of a device including the integrated touch screen, and the identification of functional or non-functional touch chiplets can be updated and stored for programming the touch chiplets as "main" or "redundant." In some examples, the main or redundant state can be programmed into a non-volatile memory (EEPRPOM, etc.) in the touch chiplet. In some examples, the main or redundant state can be programmed into a volatile memory (e.g., logic registers) in the touch chiplet.

In some examples, both the main/redundant state and the touch sensing configuration can be stored in logic registers within each touch chiplet. The main/redundant state and the touch sensing configuration information can be programmed into the touch chiplets each time the touch chiplets are powered on, reset and/or programmed. Although the redundancy is described with reference to touch chiplets, it should be understood that a similar concept of main and redundant chiplets can be used for chiplets for both display and/or touch (e.g., two chiplets 555 can be used for a touch node electrode for redundancy).

The configurations of the sense channel of chiplet 800 illustrated in FIGS. 8A-8F are described for guarded self-capacitance touch sensing configuration and mutual capacitance touch sensing. Additionally or alternatively, the sense channel of the chiplets described herein can be used for spectral analysis. For example, a chiplet can be configured to sense capacitive signals without applying stimulation (e.g., using the sense channel of FIGS. 6A-6B without applying stimulation). In some examples, a spectral analysis can be performed by aggregating touch data sensed from a touch sensor panel in a touch controller integrated circuit (e.g., a monolithic touch sensing chip). The aggregated touch data can then be demodulated by digital or analog processing circuitry of the touch controller integrated circuit using multiple demodulation signals including in-phase and quadrature-phase signals having a plurality of different frequencies. For example, analog or digital signals measured from a touch sensor panel by multiple sense channels (e.g., each channel including a sense amplifier) can be aggregated (e.g., by an adder circuit) and/or stored in memory in the touch controller integrated circuit. The aggregated and/or stored signal can be demodulated by one or more demodulators (e.g., mixers) receiving a different demodulation signal. For example, where 30 mixers are available in a touch controller integrated circuit, an in-phase (I) and a quadrature-phase (Q) demodulation signal can be generated for each of 15 demodulation frequencies (e.g., between 50 kHz and 800 kHz, or between 100 kHz and 500 kHz). An aggregated signal from the entire touch sensor panel can then be demodulated using the 30 IQ demodulation signals, and the results of the I and Q demodulation (IQ demodulation) can represent the amount of signal content at each of the demodulation frequencies. A higher magnitude of signal (e.g., calculated from the I and Q components) can mean a higher background noise level at that frequency. Thus, the IQ demodulation can be used to identify one or more relatively clean frequencies (i.e., the one or more frequencies with the least background noise among the candidate demodulation frequencies or the or more frequencies with background noise levels below a threshold level), which can be used as a stimulation frequency for mutual or self-capacitance operations. In some examples, rather than aggregating and then demodulating touch data in a touch controller integrated circuit (e.g., a monolithic touch sensing chip), one or more chiplets can be configured sense and perform demodulation at a respective frequency and phase. For example, a first chiplet can be configured to sense and demodulate a sensed signal at a first frequency with an in-phase demodulation signal and a second chiplet can be configured to sense and demodulate a sensed signal at the first frequency with a quadrature demodulation signals having an identical, or nearly identical carrier frequency component). Additionally or alternatively, one or more additional sets of chiplets can be configured to demodulate IQ signals at different frequencies (e.g., a second frequency, a third frequency, etc.). Thus, the chiplets can be configured to perform distributed IQ demodulation to identify one or more candidate frequencies corresponding to one or more relatively clean frequencies, which can be used as a stimulation frequency for mutual or self-capacitance operations. In some examples, performing the sensing and demodulation in the chiplets can enable the spectral analysis to be performed on a localized basis, rather than for the touch sensor panel as a whole (e.g., because sets of chiplets can measure I and Q components at different frequencies for a region of the touch sensor panel rather than measuring I and Q components at different frequencies for signals first aggregated from across the touch sensor panel.

The configurations of the sense channel of chiplet 800 illustrated in FIGS. 8A-8F are described for guarded self-capacitance touch sensing configuration and mutual capacitance touch sensing. Touch chiplet 800 can also be configured for optical sensing operations as described herein with reference to FIGS. 9A-9E. For example, the sensing configuration of the sense channel can be used to measure ambient light from LEDs coupled to the ITO banks forming a touch node electrode in a photoconduction optical sensing mode or a photovoltaic optical sensing mode. In some examples, the optical sensing operation does not use a stimulation voltage (and therefore no modulation) and the sense channel of chiplet 800 can include a switch 840 (illustrated in FIG. 8A) that can be used to bypass the demodulation performed by mixer 804 in the event that the optical sensing mode does not require modulation (and mixer 804 can optionally be powered down).

In some examples, operational amplifier 802/902 and/or its feedback network can be configured differently according to the sensing configuration. For example, operational amplifier 802/902 can configured with a first gain, a first feedback resistance and/or a first feedback capacitance when operating in a touch sensing mode and can be configured with a second gain different than the first gain, a second feedback resistance different than the first feedback resistance and/or a second feedback capacitance different than the first feedback capacitance when operating in an optical sensing mode (or in a different sensing mode). Adjusting the gain and/or feedback network can improve performance of operational amplifier 802/902 based on the expected measurement being performed (e.g., touch sensing, optical sensing, etc.).

As described herein (e.g., with respect to FIG. 5B, 5F), during display operations, the cathodes of LEDs coupled to ITO banks 506, 546 can be coupled to Vneg (and decoupled from touch chiplet 516/Vsense 524 or from channel circuitry 556/sense_in line 564), and the anodes of LEDs coupled to ITO banks 506, 546 can be coupled to display micro-driver circuitry 526, 566. During touch sensing operations, the cathodes and anodes of LEDs coupled to ITO banks 506, 546 can be coupled together and to touch chiplet 516 (e.g., via ITO switches or multiplexer(s) 528A, 528B and 518) or to sensing channel circuitry 556 (e.g., via cathode switches 568 and anode switches 570). Different configurations can be used for optical sensing operations, as described in further detail herein.

Figure 9A:
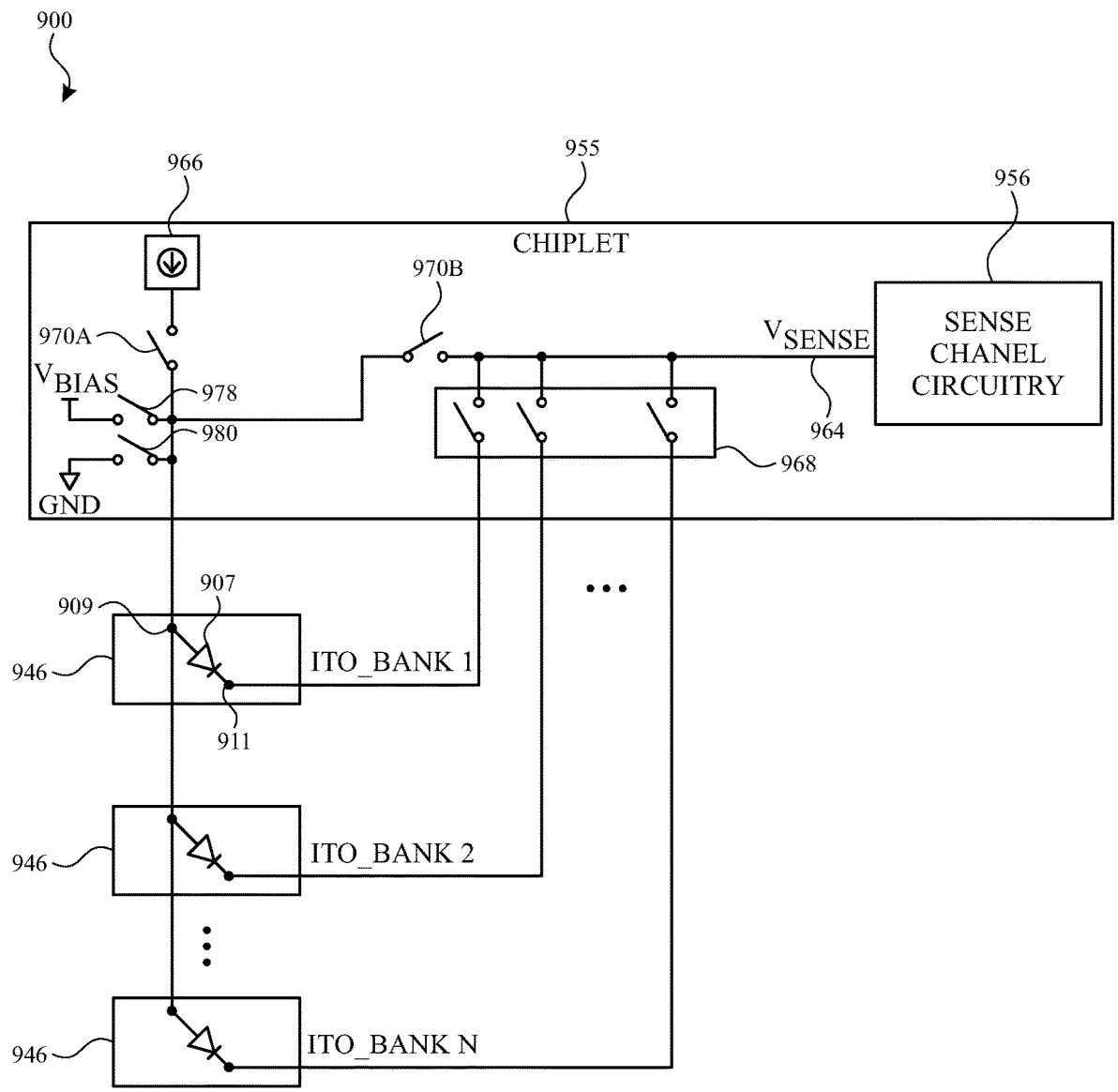
FIG. 9A illustrates an example block diagram representing configurable connections of LEDs for optical sensing according to examples of the disclosure.

FIG. 9A illustrates example block diagram representing configurable connections of LEDs for optical sensing according to examples of the disclosure. Block diagram 900 can represent a simplified view of components of FIGS. 5E-5F. For example, block diagram 900 can include a chiplet 955 including display micro-driver circuitry 966 and sensing channel circuitry 956 (e.g., corresponding to chiplet 555, display micro-drivers 566, and sensing channel circuitry 556), ITO banks 946 (e.g., corresponding to ITO banks 546), and LEDs 907 (e.g., corresponding to micro-LEDs 548, 550, 552). For simplicity of illustration, one LED 907 is shown per ITO bank 946 and one conductive line routing the LEDs 907 to chiplet 955, but it should be understood that these representations can be symbolic of multiple LEDs, routing lines and micro-drivers (e.g., as shown in FIG. 5F).

Figure 9C:
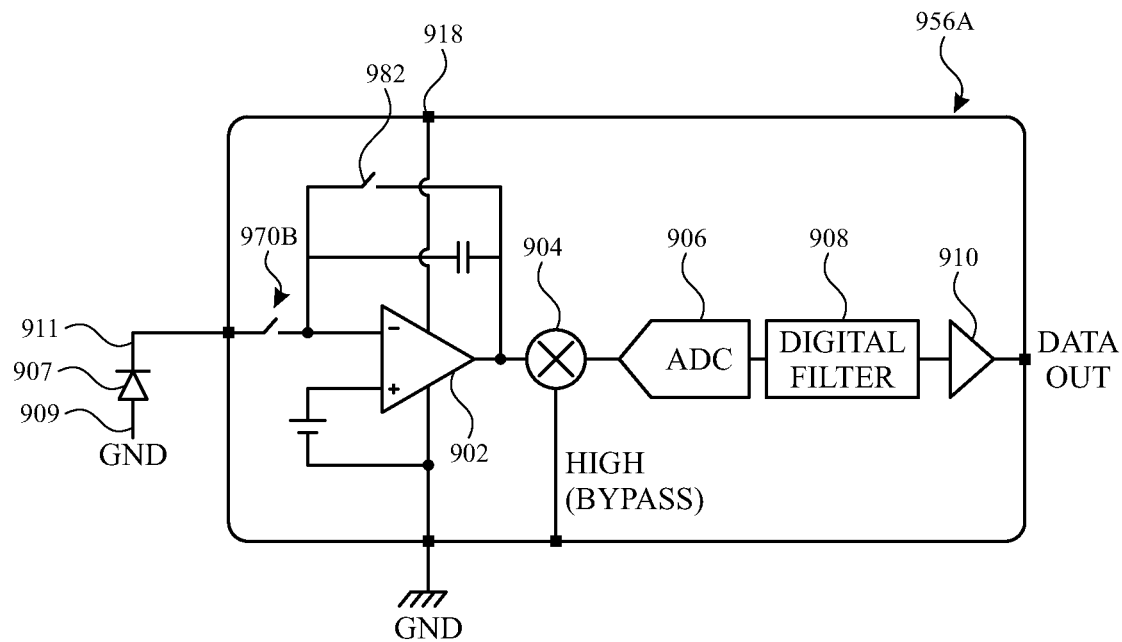
FIGS. 9C-9E illustrate various configurations of sensing channel circuitry for optical sensing according to examples of the disclosure.
Figure 9D:
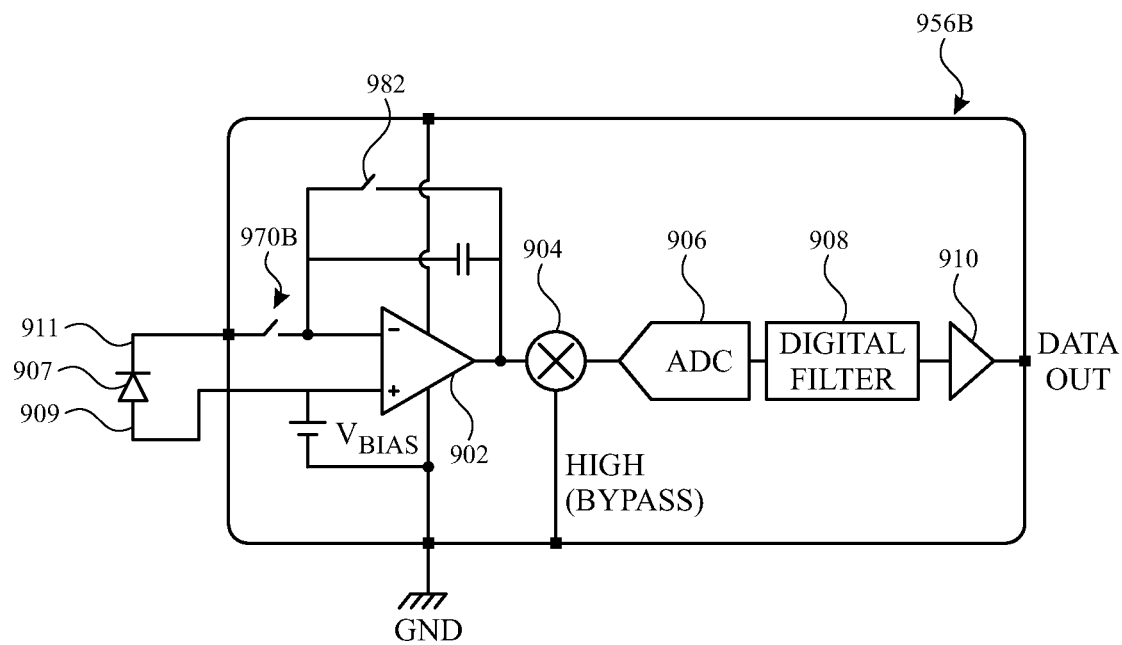
Figure 9E:
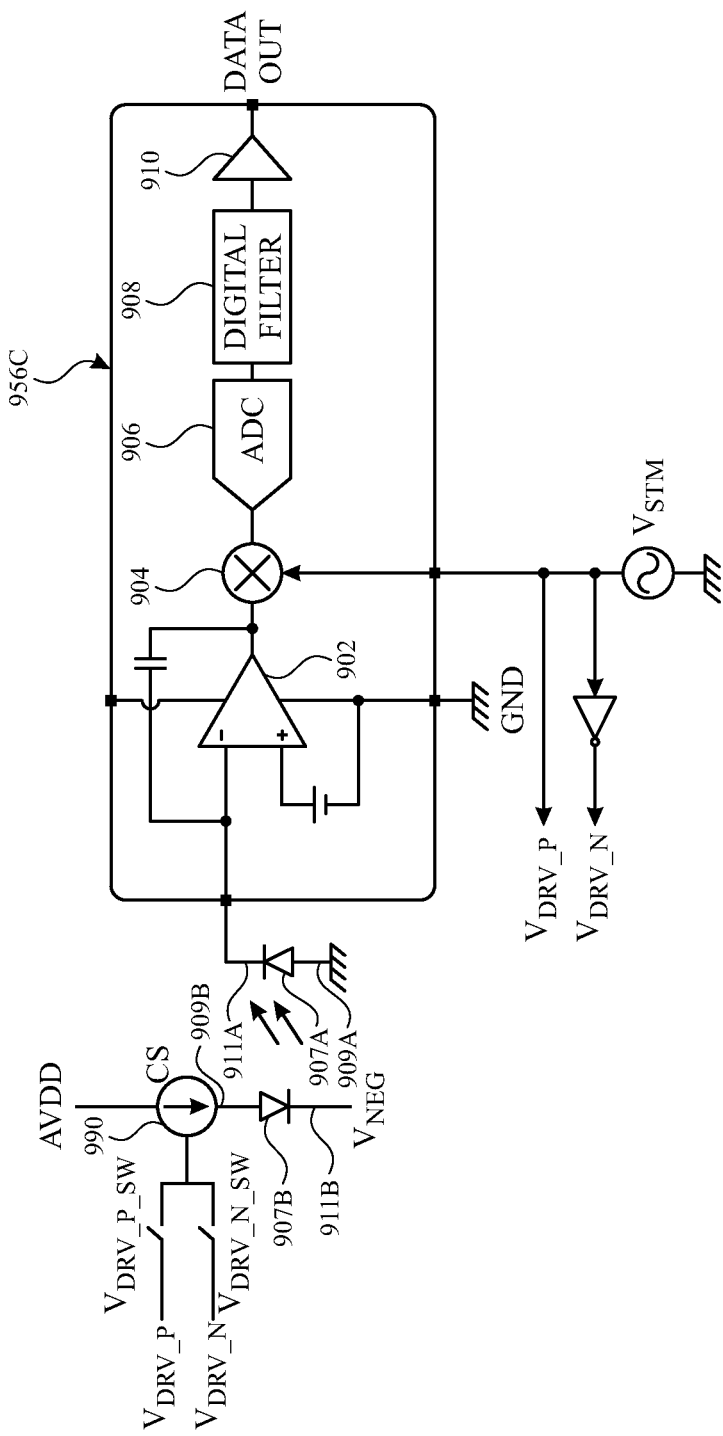

FIG. 9B illustrates a table summarizing configurations for optical sensing according to examples of the disclosure. FIGS. 9C-9E illustrate various configurations of sensing channel circuitry for optical sensing according to examples of the disclosure. For optical sensing operations, some or all of the LEDs 907 with cathodes 911 coupled to ITO banks 946 can be coupled to the analog sensing circuitry of a sensing channel 956 (e.g., sense amplifier/operational amplifier 602/622/802) and sense line 964 (e.g., corresponding to sense_in line 564) using switches 968 (e.g., corresponding to cathode switches 568). For a photovoltaic mode ALS, the anodes 909 of LEDs 907 can be coupled to a bias voltage similar to or the same as the bias voltage of the sensing channel circuitry (VBIAs) using switch 978. For a photoconduction mode ALS (with or without optical sensing), the anodes 909 of LEDs 907 used for sensing can be coupled to ground via switch 980. As shown in the table in FIG. 9B, the photovoltaic mode and the photoconduction mode (not for optical touch sensing) are unmodulated sensing modes. As a result, the demodulation circuitry (e.g., mixer 604/624/804) can be bypassed (e.g., using switch 840). Additionally details regarding optical sensing configurations are provided below.

For example, FIG. 9C illustrates and the table of FIG. 9B summarizes a photoconduction mode of ALS (without optical sensing). Sensing channel circuitry 956A can include analog and/or digital circuitry including an operational amplifier 902 coupled to supply rail 918 and feedback network including feedback switch 982, mixer 904, ADC 906, digital filter(s) 908 and data buffer 910 (e.g., corresponding to operational amplifier 602/802, mixer 604/804, ADC 606/806, digital filter(s) 608/808, and data buffer 610/810). For a photoconduction mode ALS, the anodes 909 of LEDs 907 can be coupled to ground via switch 980. The cathodes 911 of LEDs 907 can be coupled to the sensing channel circuitry 956A via switch 970B. Although one representative LED 907 is shown in FIG. 9C, it is understood that similar connections can be made using the anode and cathode switches of a chiplet (e.g., using cathode switches 568 and anode switches 570).

Photoconduction mode ALS can be an unmodulated sensing mode, and instead correlated double sampling can be used to sense ambient light. As a result, the demodulation circuitry (e.g., mixer 604/624/804/904) can be bypassed (e.g., the unmodulated sensing optionally is performed in response to driving the anodes 909 with a signal such as a direct current signal using one or more direct current sources). In some examples, a bypass switch can be used (e.g., using switch 840) to bypass mixer 904. In some examples, the input to mixer 904 can be a voltage high signal such that the output of operational amplifier 902 can be passed to the ADC without demodulation. For the photoconduction sensing operation, operational amplifier 902 can be reset by closing reset switch 980 while operational amplifier 902 is decoupled from the ITO banks/cathodes of the LEDs (e.g., while switches 970B are open). After resetting the amplifier, a first measurement can be made by opening the reset switch 980 and capturing the ADC output while operational amplifier 902 remains decoupled from the ITO banks/cathodes of the LEDs. After capturing the first measurement, the operational amplifier 902 can again be reset by closing reset switch 980, but operational amplifier 902 can now be coupled to the ITO banks/cathodes of the LEDs (e.g., while switches 970B are closed). After resetting the amplifier, a second measurement can be made by opening the reset switch 980 and capturing the ADC output while operational amplifier 902 is coupled to the ITO banks/cathodes of the LEDs. The sensing result can be computed by subtracting the first measurement from the second measurement.

FIG. 9D illustrates and the table of FIG. 9B summarizes a photovoltaic mode of optical sensing. Sensing channel circuitry 956B can include analog and/or digital circuitry including an operational amplifier 902 coupled to supply rail 918 and feedback network including feedback switch 982, mixer 904, ADC 906, digital filter(s) 908 and data buffer 910 (e.g., corresponding to operational amplifier 602/802, mixer 604/804, ADC 606/806, digital filter(s) 608/808, and data buffer 610/810). For a photovoltaic mode ALS, the anodes 909 of LEDs 907 can be coupled to a bias voltage via switch 980. The cathodes 911 of LEDs 907 can be coupled to the sensing channel circuitry 956A via switch 970B. Although one representative LED 907 is shown in FIG. 9D, it is understood that similar connections can be made using the anode and cathode switches of a chiplet (e.g., using cathode switches 568 and anode switches 570). Photovoltaic mode ALS can also be an unmodulated sensing mode like photoconduction mode, and use correlated double sampling to sense ambient light in a similar manner as described above with respect to 9C and not repeated here for brevity.

FIG. 9E illustrates and the table of FIG. 9B summarizes a photoconduction mode of ALS for optical touch sensing. Sensing channel circuitry 956C can include analog and/or digital circuitry including an operational amplifier 902 and feedback network, mixer 904, ADC 906, digital filter(s) 908 and data buffer 910 (e.g., corresponding to operational amplifier 602/802, mixer 604/804, ADC 606/806, digital filter(s) 608/808, and data buffer 610/810). For a photoconduction mode ALS for optical touch sensing, the anodes 909A of a first set of LEDs 907A in a photo sensing configuration can be coupled to ground via switch 980 (e.g., similar to the photoconduction mode not for touch sensing). The cathodes 911A of LEDs 907A can be coupled to the sensing channel circuitry 956A via switch 970B. Although one representative LED 907A is shown in FIG. 9E, it is understood that similar connections can be made using the anode and cathode switches of a chiplet (e.g., using cathode switches 568 and anode switches 570) for additional LEDs in the photo sensing configuration.

Photoconduction mode ALS for touch sensing can be a modulated sensing mode. The anodes 909B of a second set of LEDs 907B in a photo emission configuration can be coupled to a drive circuit 990. In some examples, the drive circuit 990 can use current sources of display micro-drivers 966 (coupled to the LEDs using anode switches 970A, but configured to generate a current in accordance with a stimulation voltage (e.g., Vstim + or −) used for optical touch sensing). Reusing existing micro-drivers 966 can avoid the need for additional hardware for implementing optical touch sensing using chiplets 955. The cathodes 911B of LEDs 907B can be coupled to a bias voltage via switch 970B, such as Vneg as used for display operation. Although one representative LED 907B is shown in FIG. 9E, it is understood that similar connections can be made using the anode and cathode switches of a chiplet (e.g., using cathode switches 568 and anode switches 570) for additional LEDs in the photo emission configuration. During operation, light emitted by the first set of LEDs in the photo emission configuration can be reflected by a finger and the reflections—such as those from a finger—can be detected by the second set of LEDs in the photo sensing configuration. The light from the reflections can be sensed by amplifier 902 and demodulated using a demodulation signal corresponding to the stimulation used for photo emission. In some examples, the photoconduction mode ALS for optical touch sensing can be performed in addition to or instead of capacitive touch sensing.

As described herein, in some examples, chiplets of an integrated touch screen can be used to perform touch and optical sensing operations concurrently and in a localized manner. Concurrently sensing touch and ambient light can provide improved performance for an electronic device without processing time penalties that would otherwise result from time-multiplexing touch and optical sensing operations or hardware penalties that would otherwise result by using separate circuitry to be able to concurrently perform touch and ambient sensing operations.

For example, an integrated touch screen can include touch node electrodes. Each of the touch node electrodes can define a first area. For example, referring back to FIGS. 5A and 5E, touch node electrode 502/542 can define a first area X2 by Y2. The first area can be, for example, between 1 and 4 square millimeters (e.g., between 1 mm by 1 mm and 2 mm by 2 mm). In some examples, the first area can be 1.25 mm by 1.25 mm. The touch node electrodes can be arranged into groups of touch nodes electrodes. Each group of touch node electrodes can define a second area. For example, referring back to FIGS. 5A and 5E, a group of touch node electrodes can define a second area X1 by Y1. The second area can be, for example, between 16 and 64 square millimeters. In some examples, the second area can be 5 mm by 5 mm. In some examples, the second area can correspond to the size of a fingertip (e.g., a pinky or another finger). In some examples, the second area can correspond to empirical measured minimum size of a small finger in contact with a touch screen. In some examples, concurrently performing touch and optical sensing operations can refer to configuring chiplet(s) for some touch node electrodes of the first area for touch sensing (e.g., representative of touch at the group of touch node electrodes defining the second region) and configuring chiplet(s) for some touch node electrodes of the first area for optical sensing.

Figure 10:
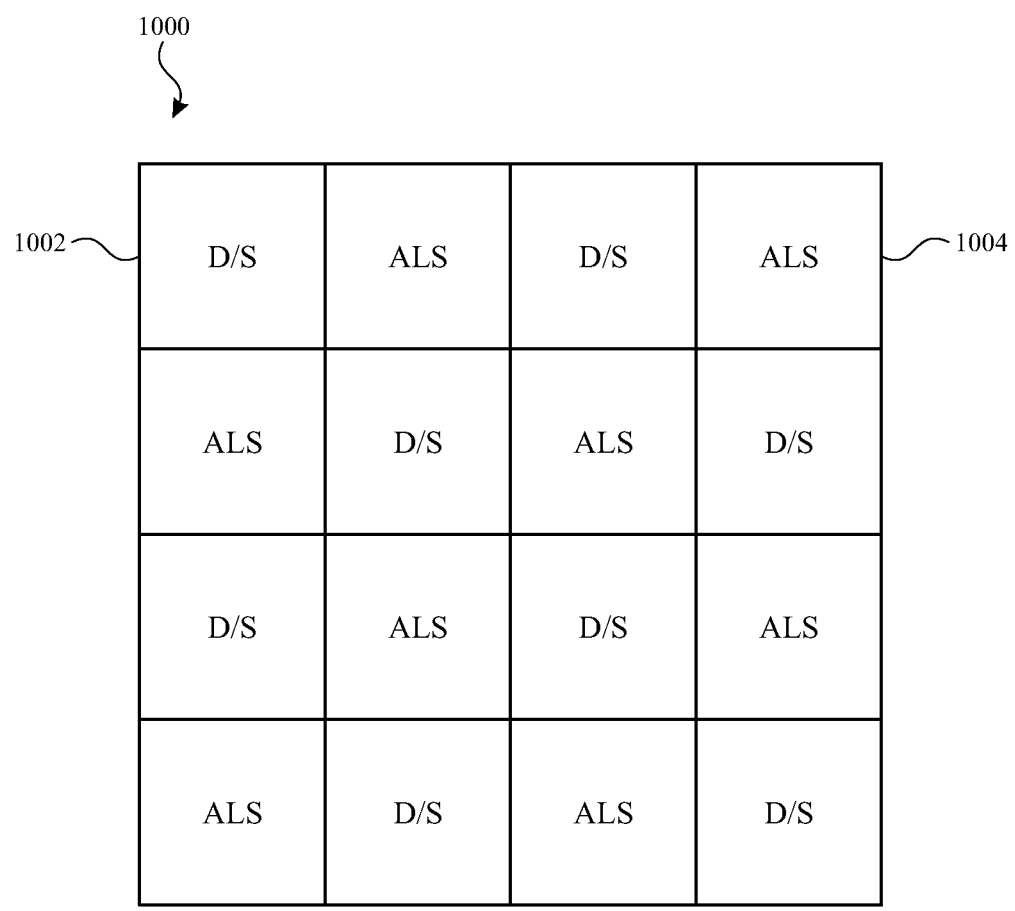
FIG. 10 illustrates an example configuration of chiplets corresponding to multiple touch node electrodes corresponding to a region defining a second area according to examples of the disclosure.

FIG. 10 illustrates an example configuration 1000 of chiplets corresponding to multiple touch node electrodes corresponding to a region defining a second area according to examples of the disclosure. Configuration 1000 can correspond to 16 touch node electrodes, each of the first area, collectively covering the second area. Some of the touch node electrodes can be used for touch sensing, such as touch node electrode 1002 and others labeled "D/S" in FIG. 10. The "D/S" label can indicate the drive/sense configuration of the chiplet according to guarded self-capacitance touch sensing configuration of FIG. 8B. Some of the touch node electrodes can be used for optical sensing, such as touch node electrode 1004 and others labeled "ALS" in FIG. 10. The "ALS" label can indicate an optical sensing configuration according to one of the optical sensing modes summarized in the table of FIG. 9B (e.g., a photovoltaic or photoconductive ALS mode as shown in FIG. 9C or 9D, or a pair of chiplets used for optical touch sensing as described with reference to FIG. 9E).

In some examples, the touch data for the touch node electrodes of the first area (e.g., the touch data for the eight touch node electrodes with chiplets in the D/S configuration) can be captured concurrently and used to represent the touch for the second region. For example, the touch data can be combined (e.g., summed, averaged, etc.) when more than one touch node electrode is used for touch sensing. In some examples, the ambient light data for the regions corresponding to the touch node electrodes of the first area (e.g., the ambient light data or optical touch data for the eight touch node electrodes with chiplets in the optical sensing configuration) can be captured concurrently and used to represent the ambient light for the second region. For example, the ambient light data can be combined (e.g., summed, averaged, etc.) when more than one touch node electrode is used for optical sensing. The use of chiplets for the touch node electrodes of the first area to represent data for the larger group of touch node electrodes of the second area can allow for concurrent operation of both touch and optical sensing operation (e.g., concurrently measuring touch at the eight touch node electrodes and ambient light using eight touch node electrodes shown in FIG. 10).

Although FIG. 10 illustrates half of the 16 touch node electrodes with chiplets in a touch sensing configuration and half of the 16 touch node electrodes with chiplets in an optical sensing configuration, it should be understood that other configurations are possible. For Example, fewer chiplets (e.g., 2, 4, 6, etc.) or more chiplets (e.g., 12, 15, 16, etc.) can be configured for touch sensing operations and fewer chiplets (e.g., 1, 4, etc.) or more chiplets (e.g., 10, 12) can be configured for optical sensing operations. In some examples, the pattern shown in FIG. 10 can be repeated across the touch screen. In some examples, different patterns of configurations of touch and optical sensing configured chiplets can be implemented across the touch screen. For example, touch sensing operations may be performed in a regular pattern across the touch screen (in a manner similar to shown in FIG. 10), but optical sensing operations may be performed for some regions of the touch screen of the second area without performing optical sensing operation for the other regions of the touch screen of the second area (e.g., one optical sensing reading for every other group of 16 touch node electrodes).

It should be understood that although concurrent operation of touch sensing and optical sensing is described with reference to FIG. 10, that these sensing operations can be performed in a time multiplexed manner. For example, some or all of the touch node electrodes can be configured for touch sensing in a first time, and some or all of the touch node electrodes can be configured for optical sensing in a second, different time. In some such examples, the same analog circuitry of a chiplet for one touch node electrode can be used for touch sensing and optical sensing (time-multiplexing the same analog circuitry).

Figure 11A:
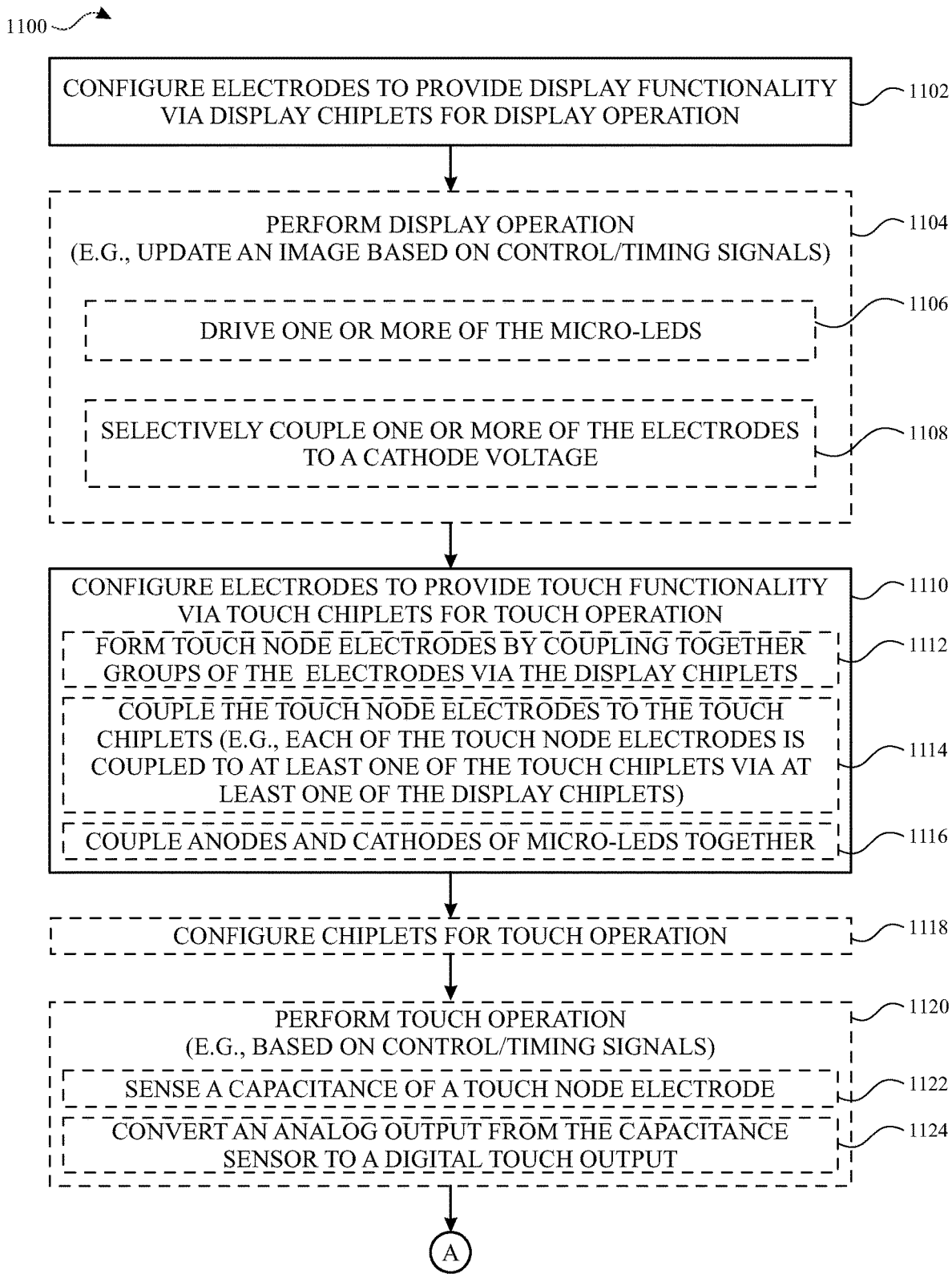
FIGS. 11A-11B illustrates an example process of operating an integrated touch screen according to examples of the disclosure.
Figure 11B:
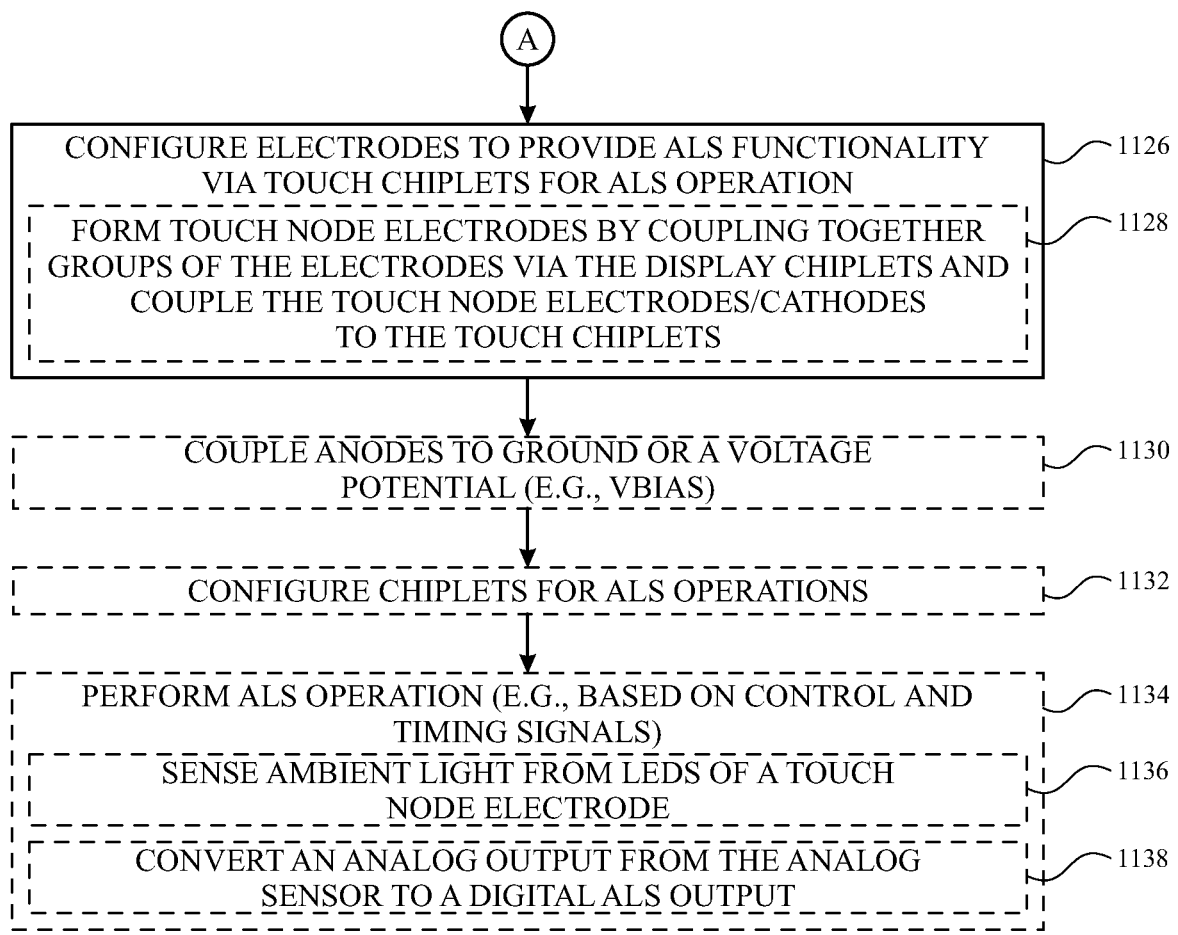

FIGS. 11A-11B illustrates an example process 1100 of operating an integrated touch screen according to examples of the disclosure. As described herein, the integrated touch screen can include display operation, touch operation, and optical sensing operation. The electrodes and/or the LEDs of an integrated touch screen can be configured to provide display functionality during display operation and configured to provide sensing functionality during sensing operations (e.g., touch sensing or optical sensing). For example, at 1102, electrodes can be configured to provide display functionality via chiplets (e.g., via display chiplets or via chiplets for touch and display functionality) for display operation. As described herein, during the display operations, the electrodes can be selectively switched (e.g., by ITO switches 528, 568) to apply a cathode voltage to electrodes operating as cathode terminals for the LEDs. At 1104, the touch screen can perform display operations. For example, a chiplet can be configured to perform display operations for a group of micro-LEDs and corresponding electrodes coupled to the chiplet. The display operation can include updating an image on the display (e.g., display refresh), based on timing and/or control signals (e.g., from the touch and display controller). As described herein, the display operation can include driving one or more of the micro-LEDs (1106) and selectively coupling one or more of the electrodes to a cathode voltage (1108). For example, as described herein (e.g., with reference to FIG. 5B, 5F), selecting one of the ITO banks 506/546 using switches of ITO switches 528/568 and adjusting and providing the operating current of respective current drivers in display micro-drivers coupled to anodes of the micro-LEDs can address the illumination adjustment for each pixel controlled by a chiplet.

Additionally, as described herein, the touch screen can operate in a power domain referenced to chassis ground during display operation. A guard layer can be grounded to chassis ground and the supply voltages (e.g., for chiplets/display chiplets) can be referenced to chassis ground.

At 1110, electrodes can be configured to provide touch functionality for touch operation. As described herein, during the touch operation, touch node electrodes can be formed by coupling together groups of the electrodes. In some examples, the touch node electrodes can be formed by coupling together groups of the electrodes via switching circuitry (e.g., ITO switches 528/568) in a chiplet or in multiple display chiplets (1112). Touch node electrodes can be coupled to sensing channel circuitry of the chiplet or touch chiplet for sensing (1114). Additionally, the anodes of the micro-LEDs and the cathodes of the micro-LEDs coupled to a touch node electrode can be coupled together to avoid leakage current from the LEDs interfering with the touch sensing operation (1116). In some examples, each touch node electrode can be coupled to one corresponding touch chiplet via at least one display chiplet (e.g., as illustrated and described with reference to FIG. 5D). The sensing channel circuitry of the chiplets or touch chiplets can be configured for and perform touch operation at 1118. The sensing channel circuitry can be configured to perform a specific type of touch scan. For example, the sensing channel circuitry can be configured to drive (D), sense (S) and/or ground (G) a touch node electrode and to operate in self-capacitance and/or mutual capacitance configurations (e.g., as described herein with reference to FIGS. 8A-8F). At 1120, the touch screen can perform touch operations (e.g., based on timing and/or control signals from the touch and display controller). For example, the touch operation can include sensing a capacitance of a touch node electrode (1122). In some examples, an analog measurement by the sensing channel circuitry can be converted to a digital value and output by the chiplet or touch chiplet (1124).

Additionally, as described herein (e.g., with reference to FIGS. 2B and 2C), the touch screen can operate in a power domain referenced to a guard voltage during touch operation (e.g., a guarded self-capacitance touch scan). A guard voltage can be generated (e.g., by a guard integrated circuit). A guard layer can be driven by the guard voltage and the supply voltages (e.g., for chiplets or touch chiplets) can be referenced to the guard voltage.

At 1126, electrodes can be configured to provide optical sensing functionality via display and/or touch chiplets for optical sensing operation. During the optical sensing operation, touch node electrodes can be formed by coupling together groups of the electrodes in a similar manner as described for touch operation, and the touch node electrodes can be coupled to the sensing channel circuitry of chiplets (or touch chiplets) for optical sensing (1128). The cathodes of the micro-LEDs are thereby also coupled to the sensing circuitry by virtue of the coupling between the cathodes of the micro-LEDs and the electrodes of a touch node electrode coupled to the sensing channel circuitry. The anodes of the micro-LEDs can be coupled either ground or a bias voltage depending on an optical sensing mode (1130). For example, as described herein, the anodes of the micro-LEDs can be coupled to a bias voltage (e.g., a potential similar to VBIAS of the sensing channel circuitry) in a photovoltaic mode (e.g., via switch 978). In a photoconduction mode, the anodes of the micro-LEDs can be coupled to ground (e.g., via switch 980). Additionally, for optical touch sensing, some micro-LEDs can be stimulated by coupled the anodes to micro-driver circuitry and the cathodes to Vneg (or ground) for a touch node electrode and chiplet in a photo emission configuration.

The sensing channel circuitry can be configured for optical sensing operation at 1132. The sensing channel circuitry can be configured to perform a specific type of optical sensing operation. For example, the touch chiplets can be configured to bypass demodulation circuitry (e.g., mixer 604/624/204) for optical sensing operations that are unmodulated, and to not bypass the demodulation circuitry for modulated optical sensing operations (e.g., photoconduction mode for optical touch sensing). In some examples, configuring the sensing channel circuitry can include adjusting the sense amplifier parameters such as the gain, feedback resistance and/or feedback capacitance for the optical sensing operation to be different from the parameters used for touch sensing operations. At 1134, the touch screen can perform optical sensing operations (e.g., based on timing and/or control signals from the touch and display controller). For example, the optical sensing operation can include sensing ambient light incident on the micro-LEDs coupled to a touch node electrode (e.g., sensing a photocurrent) (1136). In some examples, an analog measurement by the touch chiplet can be converted to a digital value and output by the touch chiplet (1138). In some examples, the optical sensing operation can include emitting light from a first subset of LEDs and sensing light from a second subset of LEDs to detect reflections and optically detect touch.

Although the optical sensing described herein is primarily described with respect to ambient light sensing and/or optical touch sensing, in some examples, the optical sensing using chiplets can also include fingerprint sensing. For example, the operational amplifier 902 in a chiplet can be used optically sense a plurality of LEDs within a touch node. To achieve a resolution of features for fingerprint sensing without increasing the number of sensing channels in a chiplet, each LED or groups of LEDs in a region corresponding to a chiplet can be sensed in sequence by the operational amplifier 902 of the chiplet. In contrast, the resolution required for ambient light sensing or optical touch detection can be lower such that the LEDs or a subset of the LEDs in a region corresponding to a chiplet can be sensed together in one sensing operation. It should be understood, however, resolution for ambient light sensing and/or optical touch detection can be improved using similar techniques described herein for optical fingerprint sensing.

In some examples, each (or a subset) of the LEDs in a region corresponding to a chiplet can be sensed. For example, as described herein, a cathode of a respective LED (e.g., an ITO bank) can be connected to analog front-end circuitry and an anode of the respective LED can be connected to ground (e.g., in a photoconduction mode) to perform optical sensing on a unit-by-unit basis. In such an optical sensing operation, the sensing period can be divided into sub-periods in which each (or a subset) of the LEDs can be sensed. In some examples, groups of LEDs in a region corresponding to a chiplet can be sensed. For example, a cathode terminal of a respective group of LEDs (e.g., an ITO bank) can be connected to analog front-end circuitry and an anode terminal of the respective group of LED can be connected to ground (e.g., in a photoconduction mode) to perform optical sensing on a group basis. For example, a group of LEDs corresponding a display pixel (e.g., RBG or pentile) or a group of LEDs corresponding to a group of display pixels (e.g., 2, 4, etc.) can be sensed together to perform optical sensing. In such an optical sensing operation, the sensing period can be divided into sub-periods in which each (or a subset) of the groups of LEDs can be sensed. In some examples, rather than using the LEDs of the display described herein, dedicated optical components (e.g., LEDs turned for near-infrared or other non-visible wavelength) can be used for fingerprint imaging. In some examples, the dedicated optical components can augment or replace one of the LEDs for some or all of the display pixel (e.g., using one of the redundant LEDs). In some examples, control circuitry (e.g., in the chiplet and/or touch and display IC 212) can configure one or more components of a chiplet (e.g., switches and amplifiers) to sense optical sensing signals. In some examples, the chiplets can include one or more voltage level-shifters so that a first voltage level (e.g., logic voltage level) can be used for switch control, but the switches can have a second voltage level (e.g., a higher voltage level) to allow the switched to accommodate higher signal voltages. For example, the logic voltage level can be 1.2V, 1.5V, 1.8V, etc. and the switch can be configured to handle higher voltage (e.g., 5-8V). In some examples, the optical sensing for fingerprint can occur during one or more display sub-frames and/or during one or more one inter-frame pauses or intra-frame pauses between display frames or display sub-frames.

Figure 12:
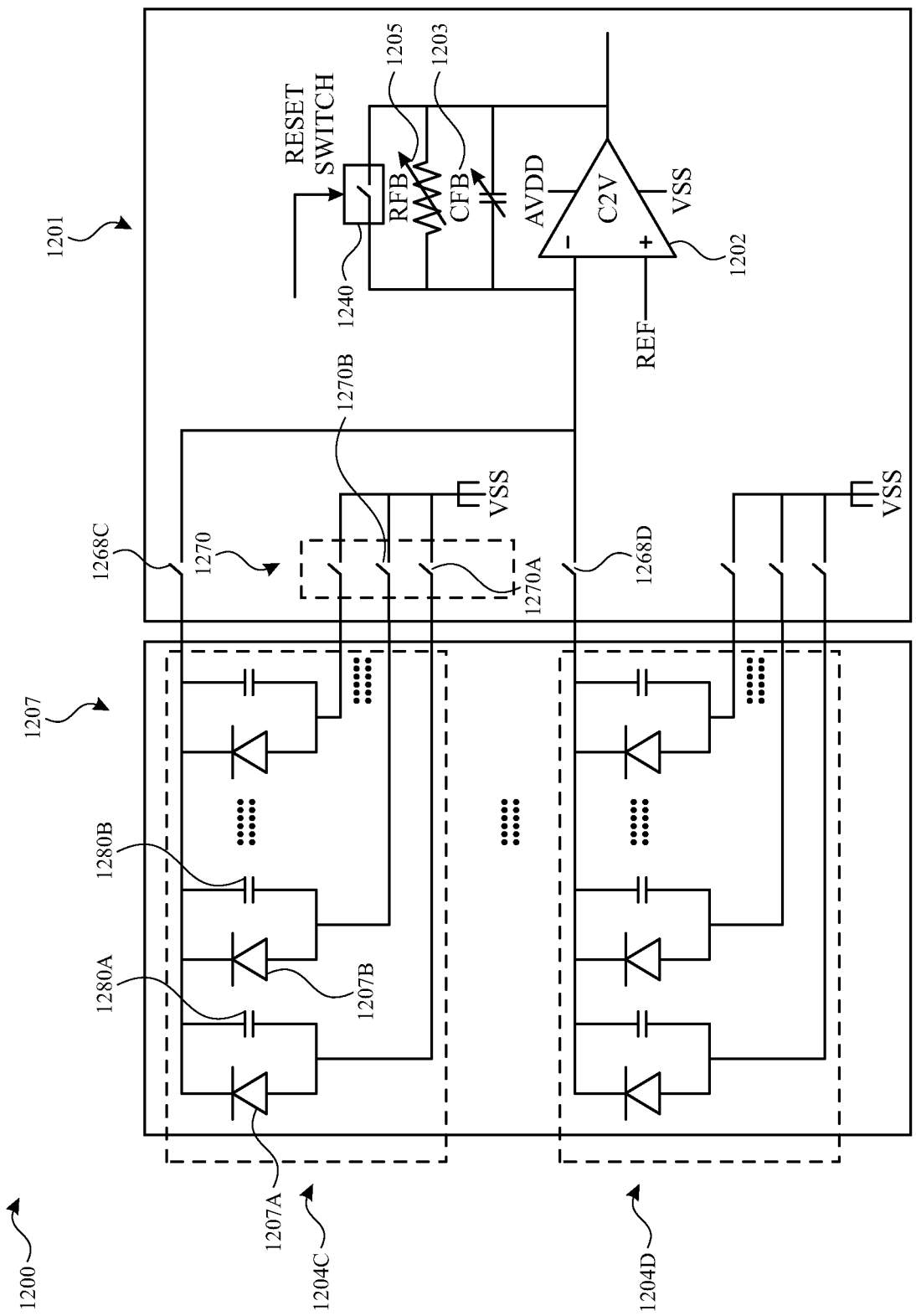
FIG. 12 illustrates an example configuration for optical fingerprint sensing according to examples of the disclosure.

FIG. 12 illustrates an example configuration 1200 for optical fingerprint sensing (or other optical sensing operations generally) according to examples of the disclosure. Configuration 1200 includes a partial representation of a chiplet 1201 (e.g., corresponding to chiplet 955) and LEDs 1207 (e.g., corresponding to LEDs 907). Chiplet 1201 can include an analog front end including an amplifier 1202 include a feedback resistor RFB 1205 and/or feedback capacitor CFB 1203. Additionally or alternatively, amplifier 1202 can include a reset switch 1240. In some examples, chiplet 1201 and amplifier 1202 can be configured prior to sensing a respective LED (or group of LEDs). For example, to detect current from a respective LED (or group of LEDs) with a cathode corresponding to ITO group 1204C, a cathode switch 1268C can be used to couple the cathode to an input of amplifier 1202 (e.g., inverting input). Additionally, an anode of a respective LED (or group of LEDs) can be coupled using one of (or a group of) anode switches 1270. Additionally or alternatively, the configuration of the amplifier 1202 can include setting a feedback impedances by adjusting variable feedback resistor RFB 1205 and/or variable feedback capacitor CFB 1203. The impedance feedback network can vary in number of components and configuration as necessary, but is represented by a single tunable resistor and capacitor for simplicity of illustration. The feedback network can also comprise a reset switch 1240, which can be used to clear charge from a prior measurement using the amplifier 1202.

For example, measurement of a respective LED (or group of LEDs) can include configuring amplifier 1202 to convert the charge accumulated within a respective LED (e.g., LED 1207A) represented by a shunt capacitor (e.g., shunt capacitor 1280A shown in parallel to LED 1207A). It should be understood that the shunt capacitor is representative of the physics of the LED and does not represent a discrete component added to the LED. This measurement can include closing a respective anode switch, thus shorting an anode of the respective LED (e.g., via anode switch 1270A) to a voltage (e.g., ground). The configuration can also include closing a cathode switch (e.g., 1268C) shared between the LEDs of a particular ITO group (e.g., 1204C). The respective LED discharges its accumulated charge by providing a signal to an input of amplifier 1202, creating a voltage at the amplifier output that is indicative of light that is detected by the respective LED.

In some examples, while a particular ITO group is coupled to amplifier 1202 via cathode switch 1268C, the amplifier 1202 can be used to measure light from each LED independently. For example, anode switches 1270 can be used to couple one LED at a time to the amplifier to sense the optical signal. For example, during a first sub-measurement, switch 1270A can be closed (while the remainder of the anode switches 1270 are open) to measure LED 1207A, during a second sub-measurement, switch 1270B can be closed (while the remainder of the anode switches 1270 are open) to measure LED 1207B, and so on for each LED within the ITO group 1204C. In a similar manner, cathode switches (e.g., with cathode switches 1268C and 1268D illustrated) can be operated to enable measurement of the LEDs of a different ITO group. For example, cathode switch 1268C can be closed (while the remaining cathode switches are open) to measure one or more LEDs with a cathode corresponding to ITO group 1204C, cathode switch 1268D can be closed (while the remaining cathode switches are open) to measure one or more LEDs with a cathode corresponding to ITO group 1204D, and so on for each ITO group.

In some examples, the optical fingerprint sensing described herein can be performed for the LEDs in each region corresponding to a respective chiplet (e.g., enabling fingerprint sensing for the entire touch sensor panel area). In some examples, the optical fingerprint sensing described herein can be performed for the LEDs in a subset of regions corresponding to a respective chiplet (e.g., enabling fingerprint sensing for some regions of the touch sensor panel area, but not the entire touch sensor panel area)

In some examples, the optical fingerprint sensing can be performed during one or more display sub-frames and touch sensing or other optical sensing (e.g., ALS or optical touch sensing) can be performed during interframe pauses. For example, referring back to FIGS. 7A-7B, the optical fingerprint sensing can be performed during display sub-frames 0-15. For an N×M array of LEDs or dedicated photosensors corresponding to a chiplet, the time for sensing each of the LEDs (or photosensors) using the chiplet can be represented using the following expression:

$$T_{sense} = \frac{T_{frame} - T_{IFP}}{(N \times M)}$$

where $T_{sense}$ represents the time for sensing a respective LED, $T_{frame}$ represents the frame duration for display operation, $T_{IFP}$ represents the time for an inter-frame pause, one or more intraframe pauses, or other times at which optical sensing is not performed (e.g., idle time, etc.). In some examples, the time for sensing a respective LED can be between 1-50 microseconds. In some examples, the time for sensing a respective LED can be between 10-25 microseconds. The time for sensing a respective LED can include time to reset the amplifier 1202 and/or adjust the anode and cathode switches between sensing different LEDs (or photo sensors).

Although FIG. 12 illustrates a feedback resistance RFB, it is understood that in some examples, a feedback capacitance CFB 1203 may be used without using RFB 1205 (omitting RFB 1205). In some examples, each measurement during $T_{sense}$ can be include two operations. In a first operation, the charge from the µLED can be transferred from the µLED's integration capacitance (e.g., 1280A for µLED 1207A) by connecting the anode switch (e.g., anode switch 1270A) to GND and connecting the cathode switch (e.g., cathode switch 1268C) to the input of the sense amplifier with the reset switch 1240 open. In this first operation, charge (e.g., $Q_{photo}=C_{int}\times(V_{photo}-REF)$) from the integration capacitance can be transferred to amplifier 1202, causing the output of amplifier 1202 to change (e.g., from REF to REF–$Q_{photo}$/$C_{fb}$). In some examples, $V_{photo}$ can represent the voltage across capacitor 1280A induced by a photo current incident upon a respective LED. The output of amplifier 1202 can be sampled by an ADC (not shown in FIG. 12). After sampling the output, in a second operation, reset switch 1240 can be asserted (closed) to discharge the feedback capacitance CFB 1203, and ensure that µLED 1207A and capacitor 1280A are similarly discharged. After the reset switch is asserted, the μLED(s) can be disconnected from amplifier 1202 and the reset switch can be de-asserted (opened).

These operations (e.g., measurement operation and reset operation) can be repeated for each measured μLED. In some examples, each of the μLED in LEDs 1207 can be measured in a pattern. For example, each of the μLED in a respective group with a shared cathode can be measured before proceeding to a subsequent group. For example, respective μLEDs of ITO group 1204C can first be measured and reset in successive moments in time (e.g., in series), and during a later time period, the respective μLEDs of ITO group 1204D can also be measured and reset in successive moments in time (e.g., in series). Measurements of μLEDs for an ITO group can reduce the amount of switching because the cathode switch is only switched once for all the μLEDs in the group. In such as example, an integration time of each μLED can be represented by $T_{frame}$ in the expression above.

In some examples, a correlated double sampling can be performed during $T_{sense}$. For example, the reset switch of amplifier 1202 can be asserted (while the input of amplifier 1202 can be disconnected from the μLED array) and the output voltage of amplifier 1202 can be sampled by the ADC and to generate a first sample of the correlated double sampling. After obtaining the first sample, the reset switch can be opened. The charge from the μLED can be transferred from the μLED's integration capacitance (e.g. 1280A for μLED 1207A) by connecting the anode switch (e.g., anode switch 1270A) to GND and connecting the cathode switch (e.g., cathode switch 1268C) to the input of the sense amplifier 1202 while reset switch 1240 can be open. As a result a charge (e.g., $Q_{photo}$) can transfer to amplifier 1202, causing the output of amplifier 1202 to change (e.g., from REF to REF−Qphoto/Cfb). As described above, $V_{photo}$ can represent the voltage across capacitor 1280A induced due to photo current. after the output of amplifier 1202 can be sampled by the ADC to obtain a second sample of the correlated double sampling. As described above, the circuitry can be reset (e.g., discharging μLED 1207A, capacitor 1280A and/or amplifier 1202). Additionally, the μLEDs can be disconnected from amplifier 1202 and the reset switch can be de-asserted. The second sample of the correlated double sampling can include signal from measuring the μLED and noise analog front-end circuitry, whereas the first sample of the correlated double sampling can include noise from the analog front-end circuitry. As a result, a difference between the second sample and the first sample can be reported as an optical reading (e.g., a photo reading without common mode noise).

Although the μLEDs are often described herein as being disposed on a substrate 310 (e.g., emitting light normal to the touch screen surface), it should be understood that optical sensing described herein is not so limited. In some examples, an illumination source for optical sensing can be disposed on a side of a cover substrate (e.g., cover glass or crystal or plastic) and can be configured to inject light into the side of the cover substrate at a critical angle. The illumination source can operate in a Frustrated Total Internal Reflection (FTIR) mode to illuminate a finger touching the cover substrate (e.g., when a critical angle is defeated). Additionally or alternatively, in some examples, dedicated photoemitters in the μLED layer can be used to illuminate the finger and/or dedicated photodetectors (e.g., photodiodes) in the μLED layer can be used to detect the finger. In some examples, μLEDs, photodiodes and/or photo emitters can be collimated.

In some examples, to enable optical fingerprint sensing during the one or more display sub-frames when using the same LEDs for both display and optical sensing operations, the optical fingerprint sensing and display update can be synchronized such that LEDs in a region of the display are not being updated while the LEDs are being sensed. Instead, while the LEDs are being used for optical fingerprint sensing, the display can maintain its image (no image update) or update a static image (e.g., from an SRAM) without updated display data provided via a display data line. For example, during a first time period (e.g., a first display sub-frame), the one or more LEDs corresponding to a chiplet can be configured to update a displayed image. During a second time period (e.g., a second display sub-frame), the one or more LEDs corresponding to the chiplet can be configured for optical sensing. In some examples, some LEDs in a region corresponding to a chiplet can be used to update the display while other LEDs in the region corresponding to the chiplet can be used for optical sensing. For example, some ITO groups coupled to LEDs can be used to update a display image while other ITO groups coupled to other LEDs can be configured for optical sensing. For example, ITO group 1204C and its corresponding LEDs can be configured to perform optical sensing while ITO group 1204D and its corresponding LEDs can update the displayed image.

Additionally or alternatively, an ITO group can include one or more dedicated optical sensing components (e.g., a photosensor) optimized for specific wavelengths (e.g., near infrared) of light. In some examples, when a dedicated optical sensor is used, the optical fingerprint sensing can be performed in parallel with the display update (e.g., within the same region of the touch sensor panel, but using different optical frequencies so the two operations do not interfere. It can also be advantageous to include a light sensing element operating at frequencies optimized for optical sensing applications. For example, sensing at near infrared can improve the efficiency of light (e.g., photons) that can be encoded via discharged current (e.g., electrons). For example, a pixel of touch and display circuitry can comprise a plurality of visible light LEDs (e.g., red, green, and blue) and a dedicated light sensing element (e.g., a photodiode).

In some examples, the sensed optical signals from the LEDs during the optical fingerprint sensing can be provided to the touch and display IC 212 and/or host processor 220 to create an image of the fingerprint and/or to take action based on the fingerprint (e.g., authenticate a user, unlock a device, trigger behavior corresponding to the fingerprint). In some examples, the optical data can be output on the display data lines. For example, a communication bus carries data signals from the touch and display IC 212 to the chiplets for a display update can instead be configured as readout sensing lines for optical sensing during a sub-frame in which the display is not being updated. For example, the output of data buffer 910 can be coupled to the display data line for a read out operation. In some examples, dedicated optical data lines can be provided to route the optical data to the touch and display IC and/or host processor while display data lines are used for display update.

Although optical fingerprint sensing is described during display sub-frames, it is understood that optical fingerprint sensing can be performed during other periods. In some examples, optical sensing can be performed during intraframe or interframe pauses. For example, optical fingerprint sensing can be time multiplexed with other touch and/or optical sensing operations described herein during the IFPs. In some examples, some chiplets can be configured for touch sensing and other chiplets can be configured for optical fingerprint sensing. For example, configuration 1000 of FIG. 10 can be updated to perform optical fingerprint sensing for one or more regions using chiplets (e.g., labeled ALS).

In some examples, optical sensing circuitry can be configured to sense additional physiological features of a user when authorized by a user. For example, one or more LEDs can include indium gallium arsenide. The one or more LEDs can be configured to detect light within the visible spectrum and/or within the near and medium infrared ranges. As a result, the optical sensing circuitry can be configured to detect a variety of related physiological features in addition to the features described herein, including heart rate, blood oxygen levels, hydration levels, blood alcohol levels, and thermal information of the user.

Figure 13:
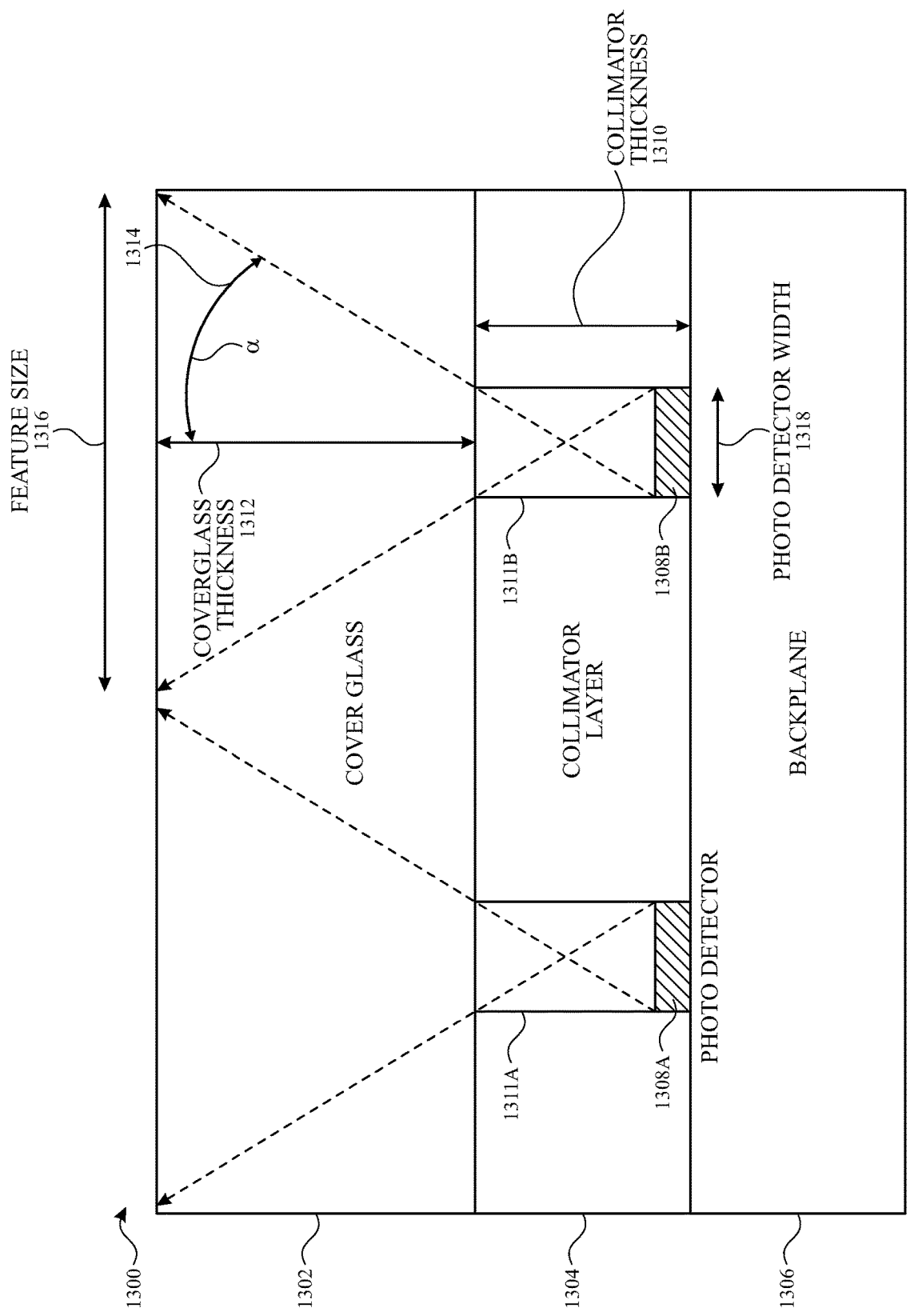
FIG. 13 illustrates an example configuration for optical sensing according to examples of the disclosure.

FIG. 13 illustrates an example configuration for optical sensing according to examples of the disclosure. In some examples, one or more photodetectors can be configured to perform optical fingerprint sensing according to examples of the disclosure (e.g., as described with reference to FIG. 12). In some examples, optical fingerprint sensing can be improved by coupling a layer of materials to restrict a field of view of a photodetector (e.g., a photodiode and/or a micro-LED) to resolve features of a respective portion of a user (e.g., ridges and valleys of skin of a finger). For example, configuration 1300 represents portions of a touch screen including a cover glass 1302 disposed over a collimator layer 1304, and a backplane 1306 disposed underneath collimator layer 1304. Configuration 1300 includes two collimators 1311A-1311B, referred to herein as a "micro-apertures," each which optionally is configured to control the amount and angle of light incident upon a photodetector 1308A and a photodetector 1308B, respectively. For example, collimator 1311A in collimator layer 1304 is coupled to photodetector 1308A, and collimator 1311B in collimator layer 1304 is coupled to photodetector 1308B. In some examples, the dimensions of the collimator are configured based on respective characteristics of the cover glass (e.g., cover glass 1302), characteristics of a corresponding photodetector (e.g., photodetectors 1308A-1308B), and/or the features of interest for imaging (e.g., a width 1316 of a ridges and valleys of a fingerprint). For example, the collimator thickness 1310 is optionally based on feature size 1316 to be imaged and/or photodetector width 1318. For example, the collimator thickness 1310 (e.g., $Z_C$ in the below expression) can be calculated based on a width of the photodetector 1318 ($W_{Photodetector}$), the width of the feature of interest 1316 (W Feature), and the thickness of the cover glass 1312 ($Z_{coverglass}$). For example, the collimator thickness 1310 can be calculated using the following expression:

$$Z_C = \frac{2 \times W_{Photodetector} \times Z_{coverglass}}{W_{Feature} - W_{Photodetector}}$$

In some examples, the field of view achieved using the collimator can be represented with the following expression:

$$\alpha = \arctan(W_{Coverglass} \div Z_{Coverglass})$$

In some examples, the field of view can be restricted to ±1 degree. In some examples, the collimator thickness can be between 200-500 micron. In some examples, the collimator thickness can be between 250-300 micron. In some examples, to resolve ridges and valleys of a finger print, the feature size can be 50 micron (or less)±5 micron. In some examples, the thickness of the cover glass can be between 1-1.5 mm and the width of the photo detectors can be between 3-6 micron.

In some examples, to perform optical fingerprint sensing, the respective photodetectors are individually coupled to sensing circuitry to detect the amount of light incident upon a respective photodetector coupled to a collimator. In some examples, correlated double sampling as described with reference to FIG. 9C and FIG. 12 is performed on sensed samples of the output of such photodetectors. In some examples, the sequence of successive samples of respective photodetectors varies in a manner to detect various features of a respective portion of the user (e.g., in a zig-zag pattern across a two-dimensional array of photodetectors). In some examples, the respective collimators are implemented differently than using a micro-aperture illustrated in configuration 1300. For example, as the collimator can be implemented using a plano convex lens having a flat portion coupled to the photodetector. In such a configuration, the use of a plano convex lens optionally reduces the effective thickness of configuration 1300 compared with the use of a micro-aperture without a lens.

Therefore, according to the above, some examples of the disclosure are directed to a chiplet for an integrated touch screen. The integrated touch screen can comprise a plurality of micro light emitting diodes (micro-LEDs) and a plurality of electrodes coupled to cathode terminals of the plurality of micro-LEDs. The chiplet can comprise switching circuitry configured to be coupled to the plurality of micro-LEDs and the plurality of electrodes. The switching circuitry can be configured to, in a first mode of operation, couple the cathode terminals of the plurality of micro-LEDs, the plurality of electrodes, and anode terminals of the plurality of micro-LEDs to an input of a sense amplifier. The switching circuitry can be configured to, in a second mode of operation, different from the first mode of operation, couple the cathode terminals of the plurality of micro-LEDs and the plurality of electrodes to the input of the sense amplifier and couple the anode terminals of the plurality of micro-LEDs to a ground or voltage potential corresponding to a bias voltage of the sense amplifier. Additionally or alternatively to one or more of the examples disclosed above, in some examples, the chiplet can further comprise the sense amplifier. The sense amplifier can be configured with a feedback path between an inverting input of the sense amplifier and an output of the sense amplifier. Additionally or alternatively to one or more of the examples disclosed above, in some examples, the chiplet can further comprise a mixer coupled to the output of the sense amplifier. In the first mode of operation, the sense amplifier can be configured to measure a capacitance of the plurality of electrodes coupled to the sense amplifier and the mixer can be configured to demodulate the output of the sense amplifier with a demodulation signal. In the second mode of operation, the sense amplifier can be configured to measure ambient light at the plurality of micro-LEDs coupled to the sense amplifier. Additionally or alternatively to one or more of the examples disclosed above, in some examples, in the first mode of operation, the sense amplifier can be configured with a first gain, a first feedback resistance or a first feedback capacitance; and in the second mode of operation, the sense amplifier can be configured with a second gain different than the first gain, a second feedback resistance different than the first feedback resistance or a second feedback capacitance different than the first feedback capacitance. Additionally or alternatively to one or more of the examples disclosed above, in some examples, the sense amplifier can be a single-ended currentto-voltage conversion amplifier and the mixer can be a differential mixer. The chiplet further can comprise a single-ended-to-differential conversion circuit. The output of the sense amplifier can be coupled to the input of the single-ended-to-differential conversion circuit, and differential outputs of the single-ended-to-differential conversion circuit can be coupled to differential inputs of the differential mixer. Additionally or alternatively to one or more of the examples disclosed above, in some examples, the chiplet can comprise an analog-to-digital converter (ADC) configured to convert analog output from the sense amplifier to a digital output. Additionally or alternatively to one or more of the examples disclosed above, in some examples, the chiplet can comprise a digital output buffer configured to output the digital output to a data line coupled to the chiplet. Additionally or alternatively to one or more of the examples disclosed above, in some examples, the chiplet can comprise an analog or digital filter. Additionally or alternatively to one or more of the examples disclosed above, in some examples, the chiplet further can comprise: display driver circuitry coupled to the plurality of micro-LEDs. The switching circuitry can be further configured to: in a third mode of operation, different from the first mode of operation and the second mode of operation, couple the anode terminals of the plurality of micro-LEDs to the display driver circuitry and couple the cathode terminals of the plurality of micro-LEDs and the plurality of electrodes to a reference voltage.

Some examples of the disclosure are directed to an electronic device. The electronic device can comprise an energy storage device (e.g., a battery), communication circuitry (e.g., wired or wireless communication circuitry), and an integrated touch screen. The integrated touch screen can comprise a plurality of micro light emitting diodes (micro-LEDs), a plurality of electrodes coupled to cathode terminals of the plurality of micro-LEDs, and a chiplet (or a plurality of chiplets) as described herein.

Some examples of the disclosure are directed to an integrated touch screen. The integrated touch screen can comprise a plurality of micro light emitting diodes (micro-LEDs) can include a first plurality of micro-LEDs and a second plurality of micro-LEDs; a plurality of electrodes configurable to provide display functionality, touch sensing functionality and ambient light sensing functionality, the plurality of electrodes can include a first plurality of electrodes coupled to cathodes of the first plurality of micro-LEDs and a second plurality of electrodes coupled to cathodes of the second plurality of micro-LEDs; and a plurality of chiplets configurable for display operation, touch sensing operation and ambient light sensing operation, the plurality of chiplets can include one or more first chiplets coupled to the first plurality of micro-LEDs and the first plurality of electrodes and one or more second chiplets coupled to the second plurality of micro-LEDs and the second plurality of electrodes. In a first operating configuration, the one or more first chiplets can be configured to: couple together the first plurality of electrodes to form a first touch node electrode; and sense a capacitance of the first touch node electrode. In a second operating configuration, the one or more second chiplets can be configured to: couple together the second plurality of electrodes to form a second touch node electrode; and sense ambient light from the second plurality of micro-LEDs coupled to the second touch node electrode. The one or more first chiplets and the one or more second chiplets can be configured to concurrently sense the capacitance of the first touch node electrode and sense the ambient light from the second plurality of micro-LEDs coupled to the second touch node electrode. Additionally or alternatively to one or more of the examples disclosed above, in some examples, in the first operating configuration, the one or more first chiplets can be further configured to: couple anodes of the first plurality of micro-LEDs to the first touch node electrode; and couple the first touch node electrode to a sense amplifier of the one or more first chiplets. Additionally or alternatively to one or more of the examples disclosed above, in some examples, the one or more first chiplets can be further configured to, in the second operating configuration: couple anodes of the second plurality of micro-LEDs to a ground or a bias potential; and couple the second touch node electrode to a sense amplifier of the one or more second chiplets. Additionally or alternatively to one or more of the examples disclosed above, in some examples, the plurality of micro-LEDs can include a third plurality of micro-LEDs; the plurality of electrodes can include a third plurality of electrodes coupled to cathodes of the third plurality of micro-LEDs; and the plurality of chiplets can include one or more third chiplets coupled to the third plurality of micro-LEDs and the third plurality of electrodes. In the first operating configuration, the one or more third chiplets can be configured to: couple together the third plurality of electrodes to form a third touch node electrode; couple anodes of the third plurality of micro-LEDs to the third touch node electrode; couple the third touch node electrode to a sense amplifier of the one or more third chiplets; and sense a capacitance of the third touch node electrode. The one or more first chiplets and the one or more third chiplets can be configured to concurrently sense the capacitance of the first touch node electrode and the capacitance of the third touch node electrode. The integrated touch screen can represent a capacitance for a region of the touch screen with an area can include the first touch node electrode, the second touch node electrode and the third touch node electrode based on a combination of the capacitance of the first touch node electrode and the capacitance of the third touch node electrode. Additionally or alternatively to one or more of the examples disclosed above, in some examples, in the second operating configuration, the one or more first chiplets can be configured to: couple together the first plurality of electrodes to form the first touch node electrode; couple the anodes of the first plurality of micro-LEDs to a ground or bias potential couple the first touch node electrode to the sense amplifier of the one or more first chiplets; and sense an ambient light from the first plurality of micro-LEDs coupled to the first touch node electrode. In the first operating configuration, the one or more second chiplets can be configured to couple together the second plurality of electrodes to form the second touch node electrode; couple the anodes of the second plurality of micro-LEDs to the first touch node electrode; couple the second touch node electrode to the sense amplifier of the one or more second chiplets; and sense a capacitance of the second touch node electrode. The one or more first chiplets and the one or more second chiplets can be configured to concurrently sense the capacitance of the second touch node electrode and sense the ambient light from the first plurality of micro-LEDs coupled to the first touch node electrode. Additionally or alternatively to one or more of the examples disclosed above, in some examples, the one or more first chiplets can include a plurality of first display chiplets and a first touch chiplet, the plurality of first display chiplets can include first switching circuitry configured to couple together the first plurality of electrodes to form the first touch node electrode; and the one or more second chiplets can include a plurality of second display chiplets and a second touch chiplet, the plurality of second display chiplets can include second switching circuitry configured to couple together the second plurality of electrodes to form the second touch node electrode.

Some examples of the disclosure are directed to an electronic device. The electronic device can comprise an energy storage device (e.g., a battery), communication circuitry (e.g., wired or wireless communication circuitry), and an integrated touch screen as described herein.

Some examples of the disclosure are directed to a method of operating a chiplet for an integrated touch screen. The integrated touch screen can comprise a plurality of micro light emitting diodes (micro-LEDs) and a plurality of electrodes coupled to cathode terminals of the plurality of micro-LEDs. The chiplet can comprise switching circuitry configured to be coupled to the plurality of micro-LEDs and the plurality of electrodes. The method can comprise: in a first mode of operation, coupling the cathode terminals of the plurality of micro-LEDs, the plurality of electrodes and anode terminals of the plurality of micro-LEDs to an input of a sense amplifier; and in a second mode of operation, different from the first mode of operation, coupling the cathode terminals of the plurality of micro-LEDs and the plurality of electrodes to the input of the sense amplifier and coupling the anode terminals of the plurality of micro-LEDs to a ground or voltage potential corresponding to a bias voltage of the sense amplifier. Additionally or alternatively to one or more of the examples disclosed above, in some examples, the method can further comprise: in the first mode of operation: measuring, using a sense amplifier, a capacitance of the plurality of electrodes coupled to the sense amplifier; and demodulating, using a mixer, an output of the sense amplifier with a demodulation signal. Additionally or alternatively to one or more of the examples disclosed above, in some examples, the method can further comprise: in the second mode of operation, measuring, using the sense amplifier, ambient light at the plurality of micro-LEDs coupled to the sense amplifier (e.g., without demodulation). Additionally or alternatively to one or more of the examples disclosed above, in some examples, in the first mode of operation, the sense amplifier is configured with a first gain, a first feedback resistance or a first feedback capacitance; and in the second mode of operation, the sense amplifier is configured with a second gain different than the first gain, a second feedback resistance different than the first feedback resistance or a second feedback capacitance different than the first feedback capacitance. Some examples of the disclosure are directed to a non-transitory computer readable storage medium. The non-transitory computer readable storage medium can store instructions, which when executed by a device including a chiplet for an integrated touch screen and processing circuitry, can cause the device to perform any of the above methods.

Some examples of the disclosure are directed to a method of operating an integrated touch screen. The integrated touch screen can comprise: a plurality of micro light emitting diodes (micro-LEDs) including a first plurality of micro-LEDs and a second plurality of micro-LEDs; a plurality of electrodes configurable to provide display functionality, touch sensing functionality and ambient light sensing functionality, the plurality of electrodes including a first plurality of electrodes coupled to cathodes of the first plurality of micro-LEDs and a second plurality of electrodes coupled to cathodes of the second plurality of micro-LEDs; and a plurality of chiplets configurable for display operation, touch sensing operation and ambient light sensing operation, the plurality of chiplets including one or more first chiplets coupled to the first plurality of micro-LEDs and the first plurality of electrodes and one or more second chiplets coupled to the second plurality of micro-LEDs and the second plurality of electrodes. The method can comprise: in a first operating configuration: coupling together the first plurality of electrodes to form a first touch node electrode; and sensing a capacitance of the first touch node electrode. The method can comprise: in a second operating configuration: coupling together the second plurality of electrodes to form a second touch node electrode; and sensing ambient light from the second plurality of micro-LEDs coupled to the second touch node electrode. The one or more first chiplets and the one or more second chiplets can be configured to concurrently sense the capacitance of the first touch node electrode and sense the ambient light from the second plurality of micro-LEDs coupled to the second touch node electrode. Some examples of the disclosure are directed to a non-transitory computer readable storage medium. The non-transitory computer readable storage medium can store instructions, which when executed by a device including an integrated touch screen and processing circuitry, can cause the device to perform any of the above methods.

Some examples of the disclosure are directed to a method of operating an integrated touch screen. The integrated touch screen can comprise a plurality of micro light emitting diodes (micro-LEDs), and can include a first plurality of micro-LEDs and a second plurality of micro-LEDs; a plurality of electrodes configurable to provide display functionality, touch sensing functionality and ambient light sensing functionality, the plurality of electrodes can include a first plurality of electrodes coupled to cathodes of the first plurality of micro-LEDs and a second plurality of electrodes coupled to cathodes of the second plurality of micro-LEDs; and a plurality of chiplets configurable for display operation, touch sensing operation and ambient light sensing operation, the plurality of chiplets can include one or more first chiplets coupled to the first plurality of micro-LEDs and the first plurality of electrodes and one or more second chiplets coupled to the second plurality of micro-LEDs and the second plurality of electrodes, the method can comprise in a first operating configuration coupling together the first plurality of electrodes to form a first touch node electrode; and sensing a capacitance of the first touch node electrode; and in a second operating configuration coupling together the second plurality of electrodes to form a second touch node electrode; and sensing ambient light from the second plurality of micro-LEDs coupled to the second touch node electrode. The one or more first chiplets and the one or more second chiplets are configured to concurrently sense the capacitance of the first touch node electrode and sense the ambient light from the second plurality of micro-LEDs coupled to the second touch node electrode.

Some examples of the disclosure are directed to a chiplet for an integrated touch screen can comprise a plurality of micro light emitting diodes (micro-LEDs) and a plurality of electrodes coupled to cathode terminals of the plurality of micro-LEDs, the chiplet can comprise switching circuitry configured to be coupled to the plurality of micro-LEDs and the plurality of electrodes and configured to in a first mode of operation, couple the cathode terminals of the plurality of micro-LEDs, the plurality of electrodes and anode terminals of the plurality of micro-LEDs to an input of a sense amplifier to perform touch sensing; in a second mode of operation, different from the first mode of operation, couple the cathode terminals of the plurality of micro-LEDs and the plurality of electrodes to the input of the sense amplifier and couple the anode terminals of the plurality of micro-LEDs to a voltage potential corresponding to a bias voltage of the sense amplifier to perform photovoltaic optical sensing; and in a third mode of operation, different from the first and second modes of operation, couple the cathode terminals of the plurality of micro-LEDs and the plurality of electrodes to the input of the sense amplifier and couple the anode terminals of the plurality of micro-LEDS to a ground to perform a photoconduction optical sensing. Additionally or alternatively to one or more of the examples disclosed above, in some examples, the chiplet can comprise a demodulator, the method further can comprise in the first mode of operation, demodulating an output of the sense amplifier; and in the second mode of operation or the third mode of operation, bypass the demodulator. Additionally or alternatively to one or more of the examples disclosed above, in some examples, the switching circuitry can be further configured to in a fourth mode of operation, different from the first, second, and third modes of operation, couple the cathode terminals of a first group of the plurality of micro-LEDs and the plurality of electrodes to the input of the sense amplifier, couple the anode terminals of the first group of the plurality of micro-LEDS, couple the cathode terminals of a second group of the plurality of micro-LEDs to a modulated stimulation source, and couple the anode terminals of the second group of the plurality of micro-LEDs to a second voltage potential, to perform a modulated photoconduction optical sensing. Additionally or alternatively to one or more of the examples disclosed above, in some examples, the chiplet can comprise a demodulator, which in the first mode of operation or the fourth mode of operation can comprise, demodulating an output of the sense amplifier; and in the second mode of operation or the third mode of operation, bypass the demodulator.

Some examples of the disclosure are directed to an integrated touch screen. The integrated touch screen can comprise a plurality of micro light emitting diodes (micro-LEDs) and a plurality of chiplets. In a first operating configuration, the plurality of chiplets can be configured to perform optical sensing at a first resolution; and in a second operating configuration, different from the first operating configuration, the plurality of chiplets can be configured to perform optical sensing at a second resolution, the second resolution different from the first. Additionally or alternatively to one or more of the examples disclosed above, in some examples, in the first operating configuration, a respective chiplet of the plurality of chiplets can be configured to sense a first number of the plurality of micro-LEDs; and in the second operating configuration, the respective chiplet of the one or more chiplets can be configured to sense a second number of the plurality of micro-LEDs, the second number greater than the first number. Additionally or alternatively to one or more of the examples disclosed above, in some examples, in the first operating configuration, each of the plurality of chiplets can be configured to sense an optical signal from the plurality of micro-LEDs corresponding to a respective chiplet; and in the second operating configuration, each of the one or more chiplets can be configured to sense a plurality of optical signals can include a respective optical signal from each of the plurality of micro-LEDs corresponding to a respective chiplet. Additionally or alternatively to one or more of the examples disclosed above, in some examples, the integrated touch screen further can comprise a plurality of light emitters and/or a plurality of light detectors distinct from the plurality of micro-LEDs. The plurality of micro-LEDs can be configured to display images and the plurality of light emitters and/or the plurality of light detectors used for optical sensing. Additionally or alternatively to one or more of the examples disclosed above, in some examples, the plurality of light emitters can comprise micro-LEDs configured to emit ultraviolet, infrared, or near-infrared light. Additionally or alternatively to one or more of the examples disclosed above, in some examples, the plurality of light detectors can comprise photo-sensors configured to detect ultraviolet, infrared, or near-infrared light. Additionally or alternatively to one or more of the examples disclosed above, in some examples, the integrated touch screen further can comprise a plurality of collimation lenses configured to collimate light towards a surface of the integrated touch screen. Additionally or alternatively to one or more of the examples disclosed above, in some examples, the plurality of light emitters and/or the plurality of light detectors can comprise light emitters disposed on a side of a cover substrate of the integrated touch screen. The integrated touch screen can be configured to perform optical sensing in a Frustrated Total Internal Reflection (FTIR) mode using light emitted from the plurality of light emitters into the cover substrate at a critical angle.

Some examples of the disclosure are directed to a chiplet for an integrated touch screen. The integrated touch screen can comprise a plurality of micro light emitting diodes (micro-LEDs) and a plurality of electrodes coupled to cathode terminals of the plurality of micro-LEDs. The chiplet can comprise switching circuitry configured to be coupled to the plurality of micro-LEDs and the plurality of electrodes. The switching circuitry can be configured to, in a first mode of operation, couple the cathode terminals of the plurality of micro-LEDs, the plurality of electrodes, and anode terminals of the plurality of micro-LEDs to an input of a sense amplifier. The switching circuitry can be configured to, in a second mode of operation, different from the first mode of operation, couple the cathode terminals of the plurality of micro-LEDs and the plurality of electrodes to the input of the sense amplifier and couple the anode terminals of the plurality of micro-LEDs to a ground or voltage potential corresponding to a bias voltage of the sense amplifier. In some examples, the above anode and cathode connections of the plurality of micro-LEDs can be reversed. For example, in the second mode of operation, the anode terminals can be coupled to the plurality of micro-LEDs and the input of the sense amplifier, and the cathode terminals can be coupled to the ground or the voltage potential corresponding to the bias voltage of the sense amplifier. Additionally or alternatively, in some examples, the plurality of micro-LEDs can be reverse biased or biased at 0 volts. Additionally or alternatively to one or more of the examples disclosed above, in some examples, the chiplet can further comprise the sense amplifier. The sense amplifier can be configured with a feedback path between an inverting input of the sense amplifier and an output of the sense amplifier. Additionally or alternatively to one or more of the examples disclosed above, in some examples, the chiplet can further comprise a mixer coupled to the output of the sense amplifier. In the first mode of operation, the sense amplifier can be configured to measure a capacitance of the plurality of electrodes coupled to the sense amplifier and the mixer can be configured to demodulate the output of the sense amplifier with a demodulation signal. In the second mode of operation, the sense amplifier can be configured to measure ambient light at the plurality of micro-LEDs coupled to the sense amplifier. Additionally or alternatively to one or more of the examples disclosed above, in some examples, in the first mode of operation, the sense amplifier can be configured with a first gain, a first feedback resistance or a first feedback capacitance; and in the second mode of operation, the sense amplifier can be configured with a second gain different than the first gain, a second feedback resistance different than the first feedback resistance or a second feedback capacitance different than the first feedback capacitance. Additionally or alternatively to one or more of the examples disclosed above, in some examples, the sense amplifier can be a single-ended current-to-voltage conversion amplifier and the mixer can be a differential mixer. The chiplet further can comprise a single-ended-to-differential conversion circuit. The output of the sense amplifier can be coupled to the input of the single-ended-to-differential conversion circuit, and differential outputs of the single-ended-to-differential conversion circuit can be coupled to differential inputs of the differential mixer. Additionally or alternatively to one or more of the examples disclosed above, in some examples, the chiplet can comprise an analog-to-digital converter (ADC) configured to convert analog output from the sense amplifier to a digital output. Additionally or alternatively to one or more of the examples disclosed above, in some examples, the chiplet can comprise a digital output buffer configured to output the digital output to a data line coupled to the chiplet. Additionally or alternatively to one or more of the examples disclosed above, in some examples, the chiplet can comprise an analog or digital filter. Additionally or alternatively to one or more of the examples disclosed above, in some examples, the chiplet further can comprise: display driver circuitry coupled to the plurality of micro-LEDs. The switching circuitry can be further configured to: in a third mode of operation, different from the first mode of operation and the second mode of operation, couple the anode terminals of the plurality of micro-LEDs to the display driver circuitry and couple the cathode terminals of the plurality of micro-LEDs and the plurality of electrodes to a reference voltage.

Some examples of the disclosure are directed to an electronic device. The electronic device can comprise an energy storage device (e.g., a battery), communication circuitry (e.g., wired or wireless communication circuitry), and an integrated touch screen. The integrated touch screen can comprise a plurality of micro light emitting diodes (micro-LEDs), a plurality of electrodes coupled to cathode terminals of the plurality of micro-LEDs, and a chiplet (or a plurality of chiplets) as described herein.

Some examples of the disclosure are directed to an integrated touch screen. The integrated touch screen can comprise a plurality of micro light emitting diodes (micro-LEDs) can include a first plurality of micro-LEDs and a second plurality of micro-LEDs; a plurality of electrodes configurable to provide display functionality, touch sensing functionality and optical sensing functionality, the plurality of electrodes can include a first plurality of electrodes coupled to cathodes of the first plurality of micro-LEDs and a second plurality of electrodes coupled to cathodes of the second plurality of micro-LEDs; and a plurality of chiplets configurable for display operation, touch sensing operation and optical sensing operation, the plurality of chiplets can include one or more first chiplets coupled to the first plurality of micro-LEDs and the first plurality of electrodes and one or more second chiplets coupled to the second plurality of micro-LEDs and the second plurality of electrodes. In a first operating configuration, the one or more first chiplets can be configured to: couple together the first plurality of electrodes to form a first touch node electrode; and sense a capacitance of the first touch node electrode. In a second operating configuration, the one or more second chiplets can be configured to: couple together the second plurality of electrodes to form a second touch node electrode; and sense optical signals from the second plurality of micro-LEDs coupled to the second touch node electrode. The one or more first chiplets and the one or more second chiplets can be configured to concurrently sense the capacitance of the first touch node electrode and sense the optical signals from the second plurality of micro-LEDs coupled to the second touch node electrode. Additionally or alternatively to one or more of the examples disclosed above, in some examples, in the first operating configuration, the one or more first chiplets can be further configured to: couple anodes of the first plurality of micro-LEDs to the first touch node electrode; and couple the first touch node electrode to a sense amplifier of the one or more first chiplets. Additionally or alternatively to one or more of the examples disclosed above, in some examples, the one or more first chiplets can be further configured to, in the second operating configuration: couple anodes of the second plurality of micro-LEDs to a ground or a bias potential; and couple the second touch node electrode to a sense amplifier of the one or more second chiplets. Additionally or alternatively to one or more of the examples disclosed above, in some examples, the plurality of micro-LEDs can include a third plurality of micro-LEDs; the plurality of electrodes can include a third plurality of electrodes coupled to cathodes of the third plurality of micro-LEDs; and the plurality of chiplets can include one or more third chiplets coupled to the third plurality of micro-LEDs and the third plurality of electrodes. In the first operating configuration, the one or more third chiplets can be configured to: couple together the third plurality of electrodes to form a third touch node electrode; couple anodes of the third plurality of micro-LEDs to the third touch node electrode; couple the third touch node electrode to a sense amplifier of the one or more third chiplets; and sense a capacitance of the third touch node electrode. The one or more first chiplets and the one or more third chiplets can be configured to concurrently sense the capacitance of the first touch node electrode and the capacitance of the third touch node electrode. The integrated touch screen can represent a capacitance for a region of the touch screen with an area can include the first touch node electrode, the second touch node electrode and the third touch node electrode based on a combination of the capacitance of the first touch node electrode and the capacitance of the third touch node electrode. Additionally or alternatively to one or more of the examples disclosed above, in some examples, in the second operating configuration, the one or more first chiplets can be configured to: couple together the first plurality of electrodes to form the first touch node electrode; couple the anodes of the first plurality of micro-LEDs to a ground or bias potential couple the first touch node electrode to the sense amplifier of the one or more first chiplets; and sense optical signals from the first plurality of micro-LEDs coupled to the first touch node electrode. In the first operating configuration, the one or more second chiplets can be configured to couple together the second plurality of electrodes to form the second touch node electrode; couple the anodes of the second plurality of micro-LEDs to the first touch node electrode; couple the second touch node electrode to the sense amplifier of the one or more second chiplets; and sense a capacitance of the second touch node electrode. The one or more first chiplets and the one or more second chiplets can be configured to concurrently sense the capacitance of the second touch node electrode and sense the optical signals from the first plurality of micro-LEDs coupled to the first touch node electrode. Additionally or alternatively to one or more of the examples disclosed above, in some examples, the one or more first chiplets can include a plurality of first display chiplets and a first touch chiplet, the plurality of first display chiplets can include first switching circuitry configured to couple together the first plurality of electrodes to form the first touch node electrode; and the one or more second chiplets can include a plurality of second display chiplets and a second touch chiplet, the plurality of second display chiplets can include second switching circuitry configured to couple together the second plurality of electrodes to form the second touch node electrode.

Additionally or alternatively to one or more of the examples disclosed above, in some examples, an integrated touch screen comprises one or more modulated current sources. The plurality of micro-LEDs can include a third plurality of micro-LEDs configured to emit light. The anodes of the third plurality of micro-LEDs can be coupled to the one or more modulated current sources. The cathodes of the third plurality of micro-LEDs can be coupled to a bias potential. Additionally or alternatively to one or more of the examples disclosed above, in some examples, in a second operating configuration, the one or more second chiplets can be configured to sense the optical signals from the second plurality of micro-LEDs due to reflections of the light emitted by the third plurality of micro-LEDs from an object in contact with or within a threshold distance from a surface of the integrated touch screen. Additionally or alternatively to one or more of the examples disclosed above, in some examples, the one or more modulated current sources can be modulated by one or more stimulation voltages at a first stimulation frequency. In the second operating configuration, the one or more second chiplets can be configured to demodulate the optical signals from the second plurality of micro-LEDs using the one or more stimulation voltages at the first stimulation frequency.

Additionally or alternatively to one or more of the examples disclosed above, in some examples, an integrated touch screen comprises one or more direct current sources. The plurality of micro-LEDs can include a third plurality of micro-LEDs configured to emit light. The anodes of the third plurality of micro-LEDs can be coupled to the one or more direct current sources. The cathodes of the third plurality of micro-LEDs can be coupled to a bias potential. In the second operating configuration, the one or more second chiplets can be configured to sense the optical signals from the second plurality of micro-LEDs due to reflections of the light emitted by the third plurality of micro-LEDs from an object in contact with or within a threshold distance from a surface of the integrated touch screen.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A chiplet for an integrated touch screen comprising a plurality of micro light emitting diodes (micro-LEDs) and a plurality of electrodes coupled to cathode terminals of the plurality of micro-LEDs, the chiplet comprising:
    switching circuitry configured to be coupled to the plurality of micro-LEDs and the plurality of electrodes and configured to:
        in a first mode of operation, couple the cathode terminals of the plurality of micro-LEDs, the plurality of electrodes and anode terminals of the plurality of micro-LEDs to an input of a sense amplifier; and
        in a second mode of operation, different from the first mode of operation, couple the cathode terminals of the plurality of micro-LEDs and the plurality of electrodes to the input of the sense amplifier and couple the anode terminals of the plurality of micro-LEDs to a ground or voltage potential corresponding to a bias voltage of the sense amplifier.

2. The chiplet of claim 1, further comprising:
    the sense amplifier, wherein the sense amplifier is configured with a feedback path between an inverting input of the sense amplifier and an output of the sense amplifier; and
    a mixer coupled to the output of the sense amplifier;
    wherein:
        in the first mode of operation, the sense amplifier is configured to measure a capacitance of the plurality of electrodes coupled to the sense amplifier and mixer is configured to demodulate the output of the sense amplifier with a demodulation signal; and
        in the second mode of operation, the sense amplifier is configured to measure optical signals at the plurality of micro-LEDs coupled to the sense amplifier.

3. The chiplet of claim 1, wherein:
    in the first mode of operation, the sense amplifier is configured with a first gain, a first feedback resistance or a first feedback capacitance; and
    in the second mode of operation, the sense amplifier is configured with a second gain different than the first gain, a second feedback resistance different than the first feedback resistance or a second feedback capacitance different than the first feedback capacitance.

4. The chiplet of claim 2, wherein the sense amplifier is a single-ended current-to-voltage conversion amplifier and the mixer is a differential mixer, the chiplet further comprising:
    a single-ended-to-differential conversion circuit, wherein the output of the sense amplifier is coupled to the input of the single-ended-to-differential conversion circuit, differential outputs of the single-ended-to-differential conversion circuit are coupled to differential inputs of the differential mixer.

5. The chiplet of claim 1, further comprising:
    an analog-to-digital converter (ADC) configured to convert analog output from the sense amplifier to a digital output;
    a digital output buffer configured to output the digital output to a data line coupled to the chiplet; and
    an analog or digital filter.

6. The chiplet of claim 1, further comprising:
    display driver circuitry coupled to the plurality of micro-LEDs;
    wherein the switching circuitry is further configured to:
        in a third mode of operation, different from the first mode of operation and the second mode of operation, couple the anode terminals of the plurality of micro-LEDs to the display driver circuitry and couple the cathode terminals of the plurality of micro-LEDs and the plurality of electrodes to a reference voltage.

7. A method of operating a chiplet for an integrated touch screen comprising a plurality of micro light emitting diodes (micro-LEDs) and a plurality of electrodes coupled to cathode terminals of the plurality of micro-LEDs, the chiplet comprising switching circuitry configured to be coupled to the plurality of micro-LEDs and the plurality of electrodes, comprising:
    in a first mode of operation, coupling the cathode terminals of the plurality of micro-LEDs, the plurality of electrodes and anode terminals of the plurality of micro-LEDs to an input of a sense amplifier; and in a second mode of operation, different from the first mode of operation, coupling the cathode terminals of the plurality of micro-LEDs and the plurality of electrodes to the input of the sense amplifier and coupling the anode terminals of the plurality of micro-LEDs to a ground or voltage potential corresponding to a bias voltage of the sense amplifier.

8. The method of claim 7, further comprising:
in the first mode of operation:
measuring, using the sense amplifier, a capacitance of the plurality of electrodes coupled to the sense amplifier; and
demodulating, using a mixer, an output of the sense amplifier with a demodulation signal; and
in the second mode of operation,
measuring, using the sense amplifier, optical signals at the plurality of micro-LEDs coupled to the sense amplifier.

9. The method of claim 8, wherein:
in the first mode of operation, the sense amplifier is configured with a first gain, a first feedback resistance or a first feedback capacitance; and
in the second mode of operation, the sense amplifier is configured with a second gain different than the first gain, a second feedback resistance different than the first feedback resistance or a second feedback capacitance different than the first feedback capacitance.

10. The method of claim 7, further comprising:
in a third mode of operation, different from the first mode of operation and the second mode of operation, coupling the anode terminals of the plurality of micro-LEDs to display driver circuitry and coupling the cathode terminals of the plurality of micro-LEDs and the plurality of electrodes to a reference voltage.

11. A non-transitory computer-readable storage medium included in an integrated touch screen that includes a chiplet comprising a plurality of micro light emitting diodes (micro-LEDs) and a plurality of electrodes coupled to cathode terminals of the plurality of micro-LEDs, the chiplet comprising switching circuitry configured to be coupled to the plurality of micro-LEDs and the plurality of electrodes, which when executed cause the chiplet to:
in a first mode of operation, couple the cathode terminals of the plurality of micro-LEDs, the plurality of electrodes and anode terminals of the plurality of micro-LEDs to an input of a sense amplifier; and
in a second mode of operation, different from the first mode of operation, couple the cathode terminals of the plurality of micro-LEDs and the plurality of electrodes to the input of the sense amplifier and coupling the anode terminals of the plurality of micro-LEDs to a ground or voltage potential corresponding to a bias voltage of the sense amplifier.

12. The non-transitory computer-readable storage medium of claim 11, wherein the instructions further cause the chiplet to:
in the first mode of operation:
measure, using the sense amplifier, a capacitance of the plurality of electrodes coupled to the sense amplifier; and
demodulate, using a mixer, an output of the sense amplifier with a demodulation signal; and
in the second mode of operation,
measure, using the sense amplifier, optical signals at the plurality of micro-LEDs coupled to the sense amplifier.

13. The non-transitory computer-readable storage medium of claim 12, wherein:
in the first mode of operation, the sense amplifier is configured with a first gain, a first feedback resistance or a first feedback capacitance; and
in the second mode of operation, the sense amplifier is configured with a second gain different than the first gain, a second feedback resistance different than the first feedback resistance or a second feedback capacitance different than the first feedback capacitance.

14. The non-transitory computer-readable storage medium of claim 11, wherein the instructions further cause the chiplet to:
in a third mode of operation, different from the first mode of operation and the second mode of operation, couple the anode terminals of the plurality of micro-LEDs to display driver circuitry and couple the cathode terminals of the plurality of micro-LEDs and the plurality of electrodes to a reference voltage.

* * * * *